(12) United States Patent
Kubota et al.

(10) Patent No.: US 10,114,263 B2
(45) Date of Patent: Oct. 30, 2018

(54) DISPLAY DEVICE

(71) Applicant: Semiconductor Energy Laboratory Co., Ltd., Atsugi-shi, Kanagawa-ken (JP)

(72) Inventors: Daisuke Kubota, Kanagawa (JP); Koji Kusunoki, Kanagawa (JP); Kensuke Yoshizumi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/375,518

(22) Filed: Dec. 12, 2016

(65) Prior Publication Data

US 2017/0176791 A1 Jun. 22, 2017

(30) Foreign Application Priority Data

Dec. 18, 2015 (JP) ................................. 2015-247448

(51) Int. Cl.
*G02F 1/1368* (2006.01)
*G02F 1/1333* (2006.01)
*G02F 1/1335* (2006.01)
*G02F 1/1343* (2006.01)
(Continued)

(52) U.S. Cl.
CPC ........ *G02F 1/1368* (2013.01); *G02F 1/13439* (2013.01); *G02F 1/133345* (2013.01); *G02F 1/133512* (2013.01); *G02F 1/133553* (2013.01); *G02F 1/136286* (2013.01); *H01L 27/1225* (2013.01); *G02F 2201/121* (2013.01); *G02F 2201/123* (2013.01)

(58) Field of Classification Search
None
See application file for complete search history.

(56) References Cited

U.S. PATENT DOCUMENTS 6,127,199 A 10/2000 Inoue et al.
7,674,650 B2 * 3/2010 Akimoto ............ H01L 27/1225
257/E21.347
9,207,504 B2 12/2015 Kimura
(Continued)

FOREIGN PATENT DOCUMENTS

JP 2006-072373 A 3/2006
JP 2007-096055 A 4/2007
JP 2007-123861 A 5/2007

*Primary Examiner* — Ryan Crockett
(74) *Attorney, Agent, or Firm* — Fish & Richardson P.C.

(57) ABSTRACT

A liquid crystal display device includes a transmissive region and a reflective region. The liquid crystal display device includes a liquid crystal element, a transistor, a scan line, a signal line, and an insulating layer. A semiconductor layer of the transistor includes a channel region and a low-resistance region. A channel region overlaps with a gate with a gate insulating layer provided therebetween. The low-resistance region includes a first portion in contact with a pixel electrode of the liquid crystal element and a second portion in contact with a side surface of an opening portion in the insulating layer. The first portion of the low-resistance region is positioned in the transmissive region or the reflective region. The reflective region includes a layer that reflects visible light. The layer that reflects visible light includes a portion positioned between the scan line or the signal line and a liquid crystal layer.

36 Claims, 46 Drawing Sheets

(51) Int. Cl.
*G02F 1/1362* (2006.01)
*H01L 27/12* (2006.01)

(56) References Cited

U.S. PATENT DOCUMENTS

| | | |
|---|---|---|
| 9,213,206 B2 | 12/2015 | Kimura |
| 2002/0030767 A1* | 3/2002 | Zavracky ............ G02B 27/0093 349/42 |
| 2009/0101895 A1* | 4/2009 | Kawamura ......... H01L 27/1225 257/43 |
| 2009/0225267 A1 | 9/2009 | Atarashiya et al. |
| 2010/0002021 A1 | 1/2010 | Hashimoto et al. |
| 2011/0006302 A1 | 1/2011 | Yamazaki et al. |
| 2012/0062814 A1* | 3/2012 | Yamazaki ............ G02F 1/1333 349/43 |
| 2012/0108018 A1* | 5/2012 | Okabe ................. H01L 27/1225 438/158 |
| 2012/0161125 A1 | 6/2012 | Yamazaki |
| 2012/0231241 A1 | 9/2012 | Fujita |
| 2013/0082272 A1* | 4/2013 | Nakanishi ......... G02F 1/136204 257/72 |
| 2013/0214272 A1* | 8/2013 | Nakatani ............ H01L 27/1225 257/43 |
| 2013/0299830 A1* | 11/2013 | Ishigaki ................. H01L 33/08 257/59 |
| 2014/0209895 A1* | 7/2014 | Wang .................. H01L 27/1225 257/43 |
| 2014/0231803 A1 | 8/2014 | Yamazaki |
| 2014/0340608 A1 | 11/2014 | Yamazaki et al. |
| 2016/0154283 A1* | 6/2016 | Kimura ............ G02F 1/134363 349/46 |
| 2016/0313604 A1* | 10/2016 | Yin ................... G02F 1/133555 |
| 2017/0168333 A1* | 6/2017 | Kubota .................. G06F 3/044 |

* cited by examiner

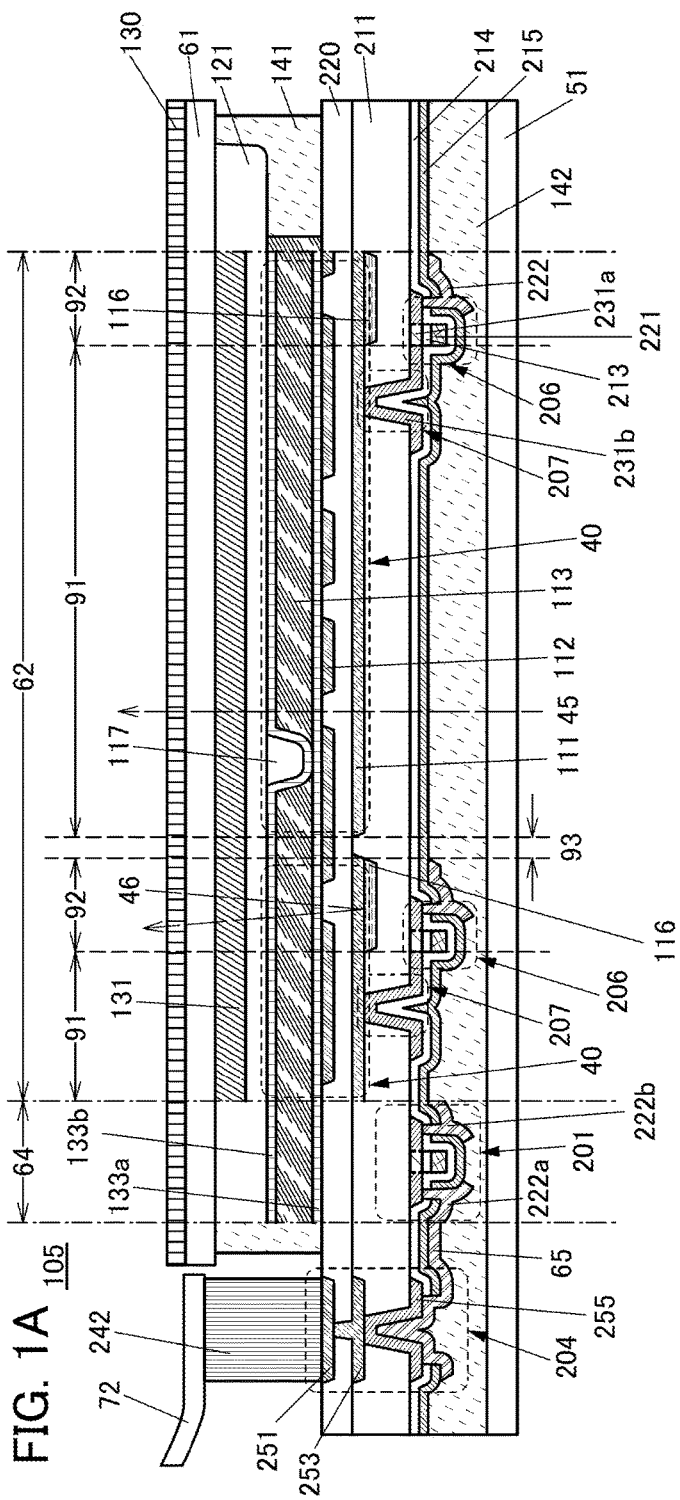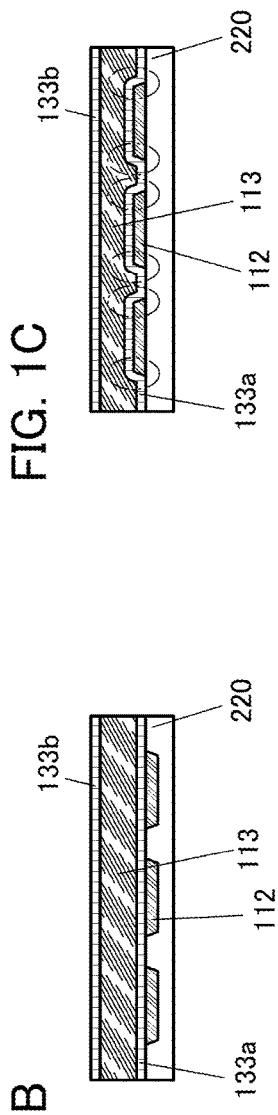

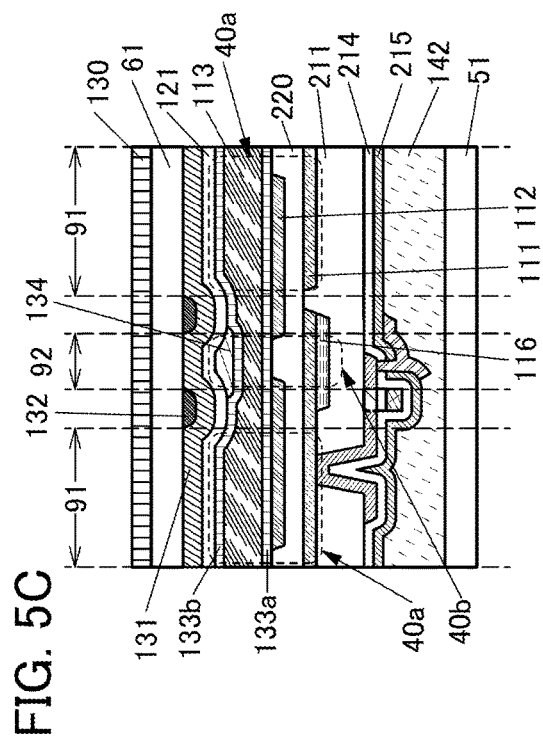
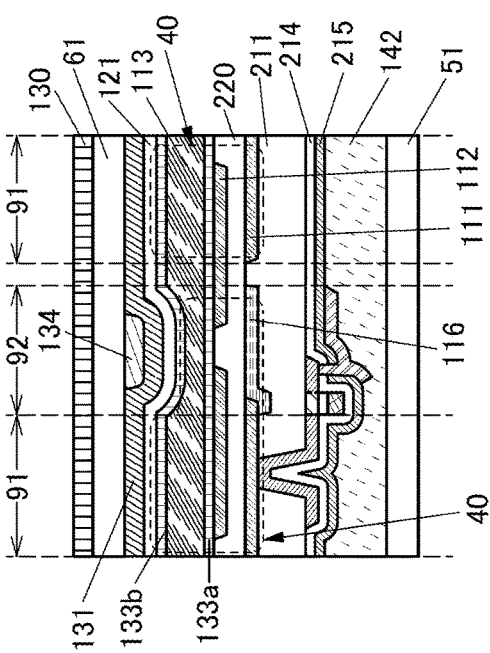
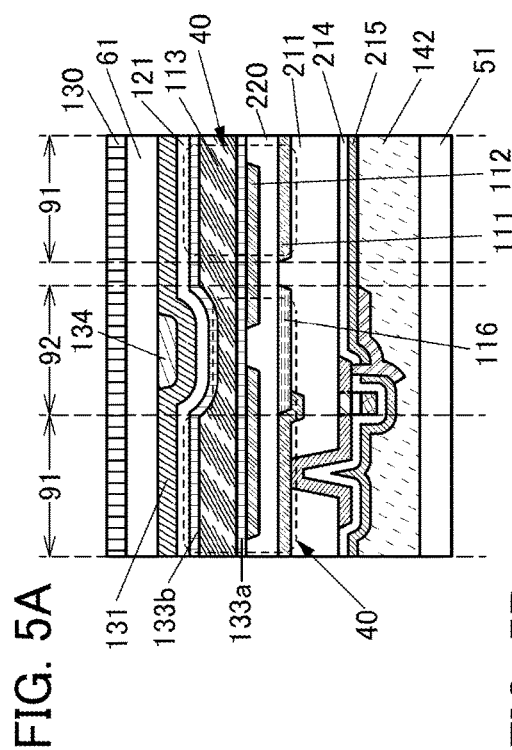
FIG. 5A
FIG. 5B
FIG. 5C

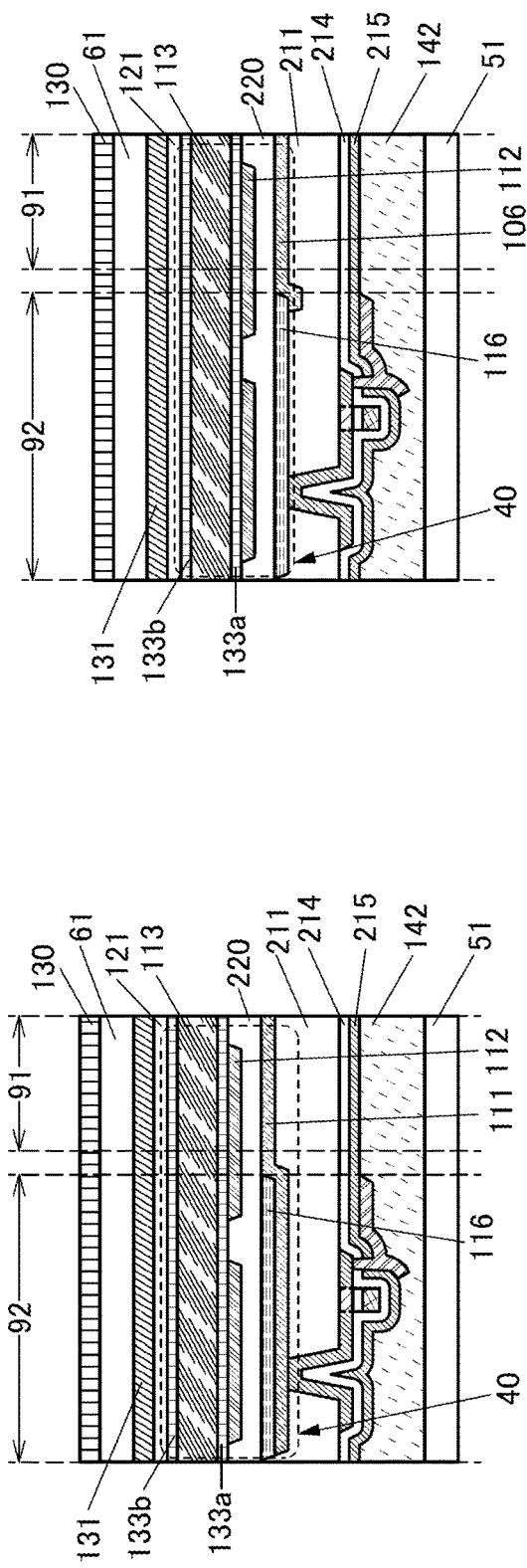

105A

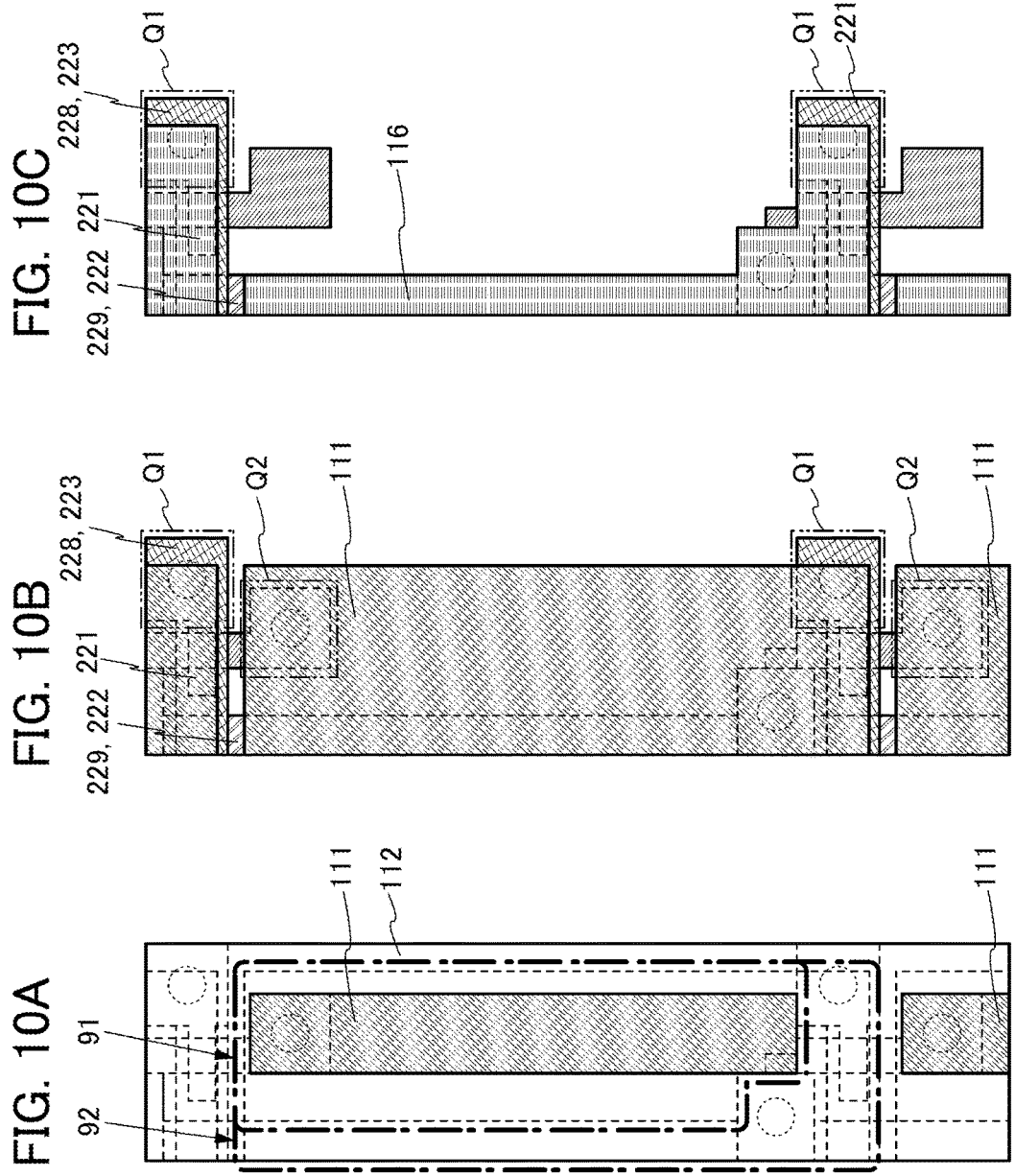

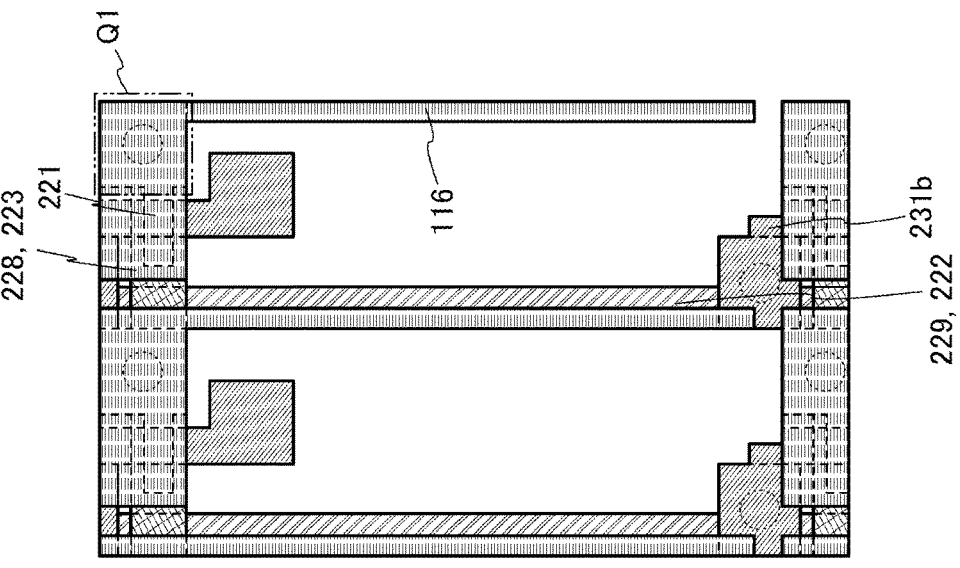
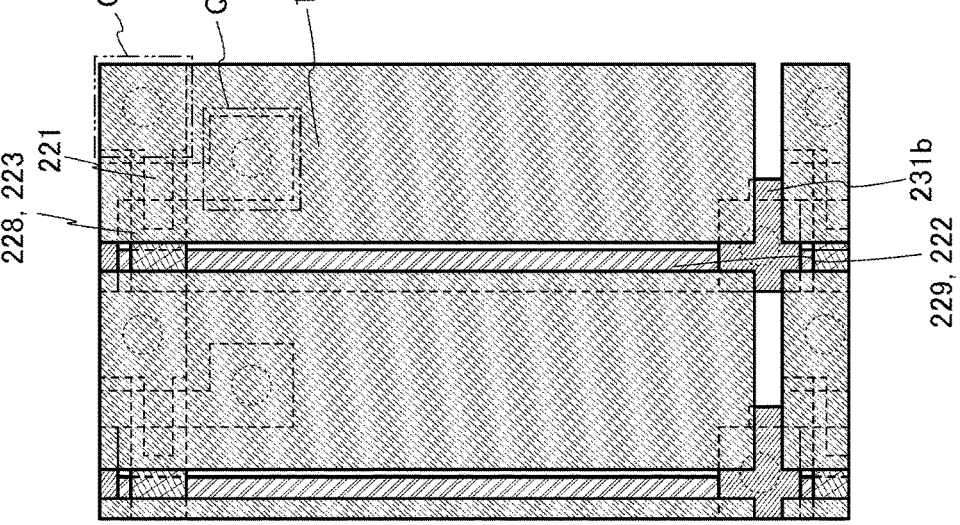
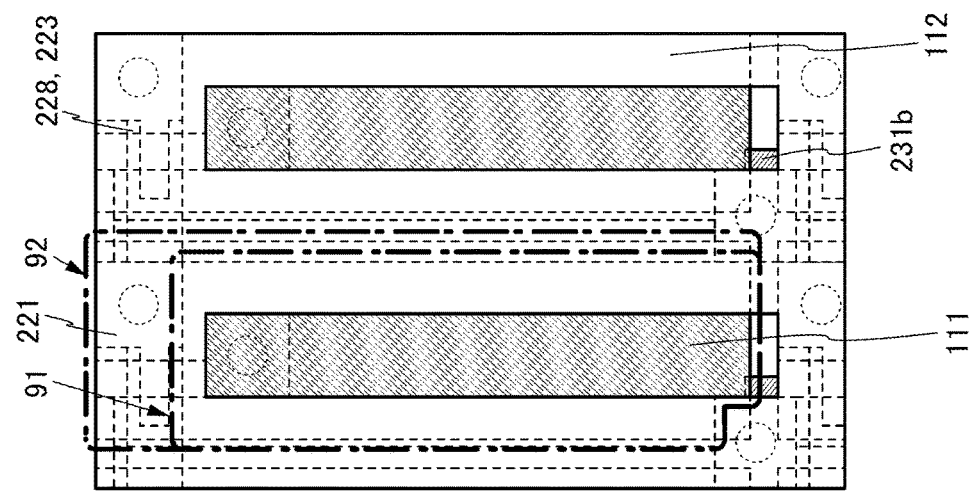

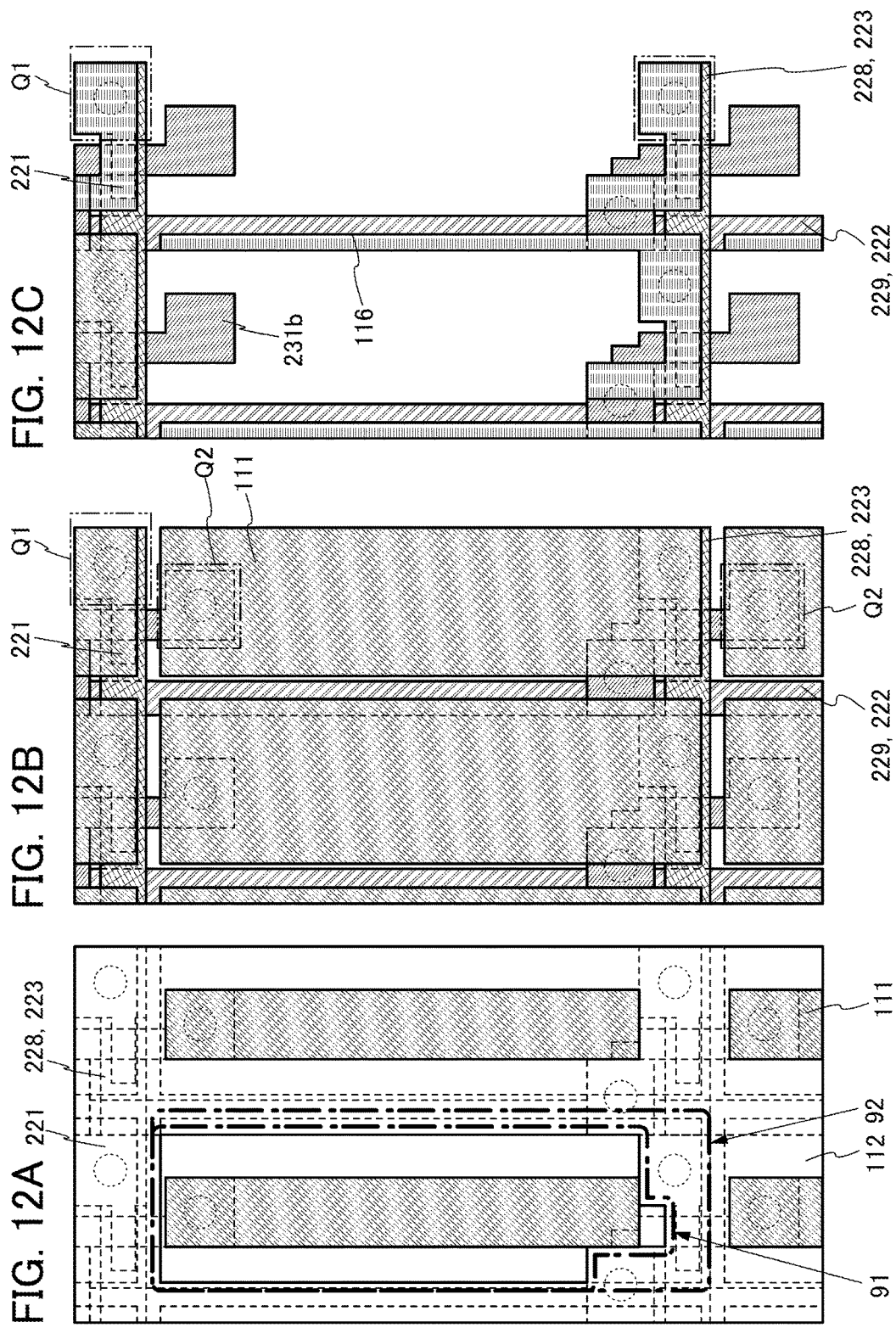

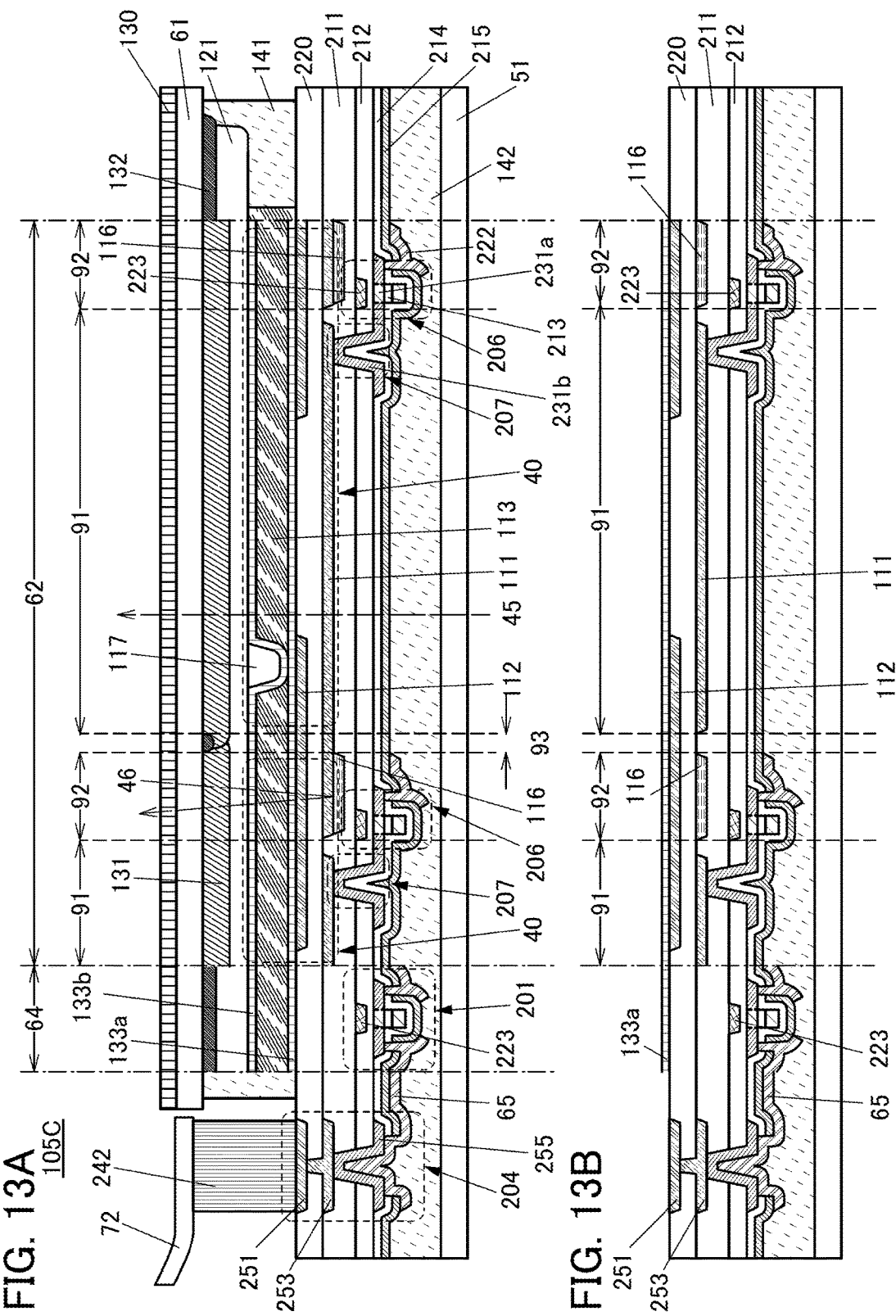

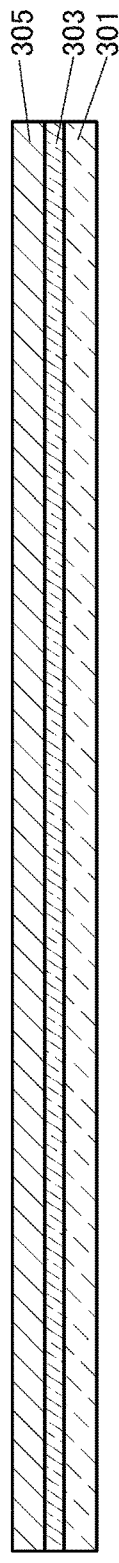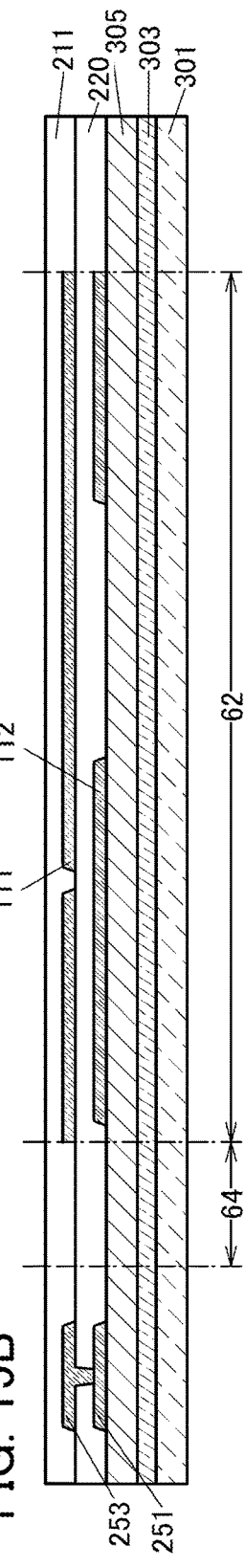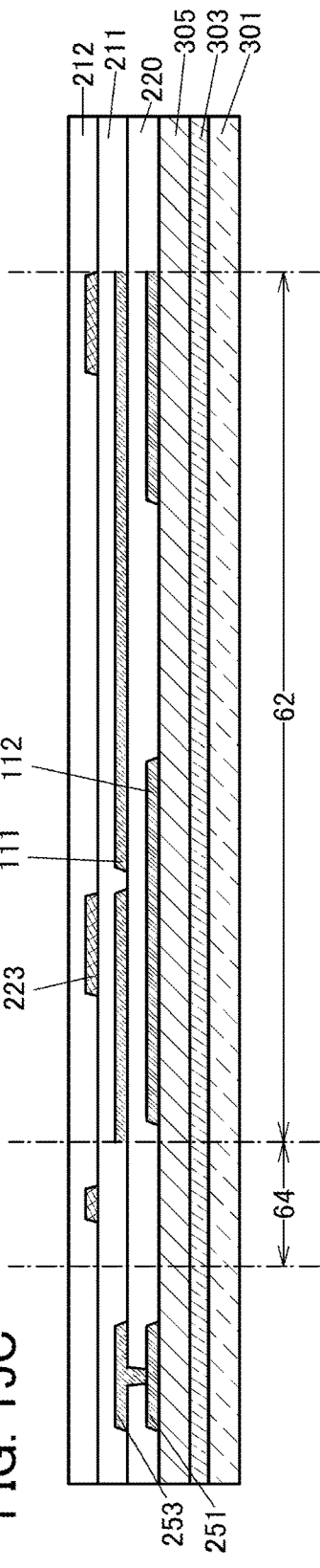

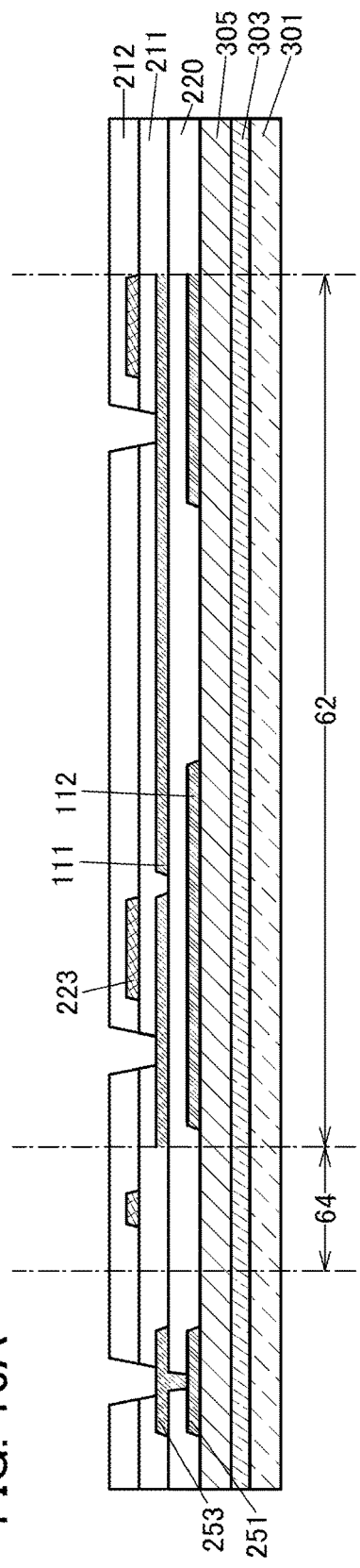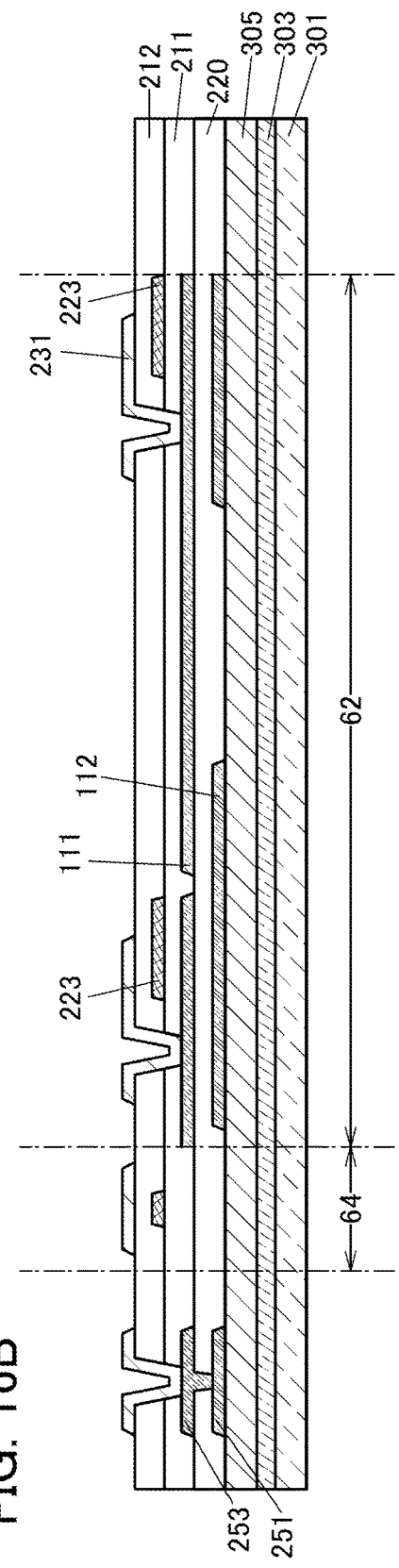
FIG. 16A
FIG. 16B

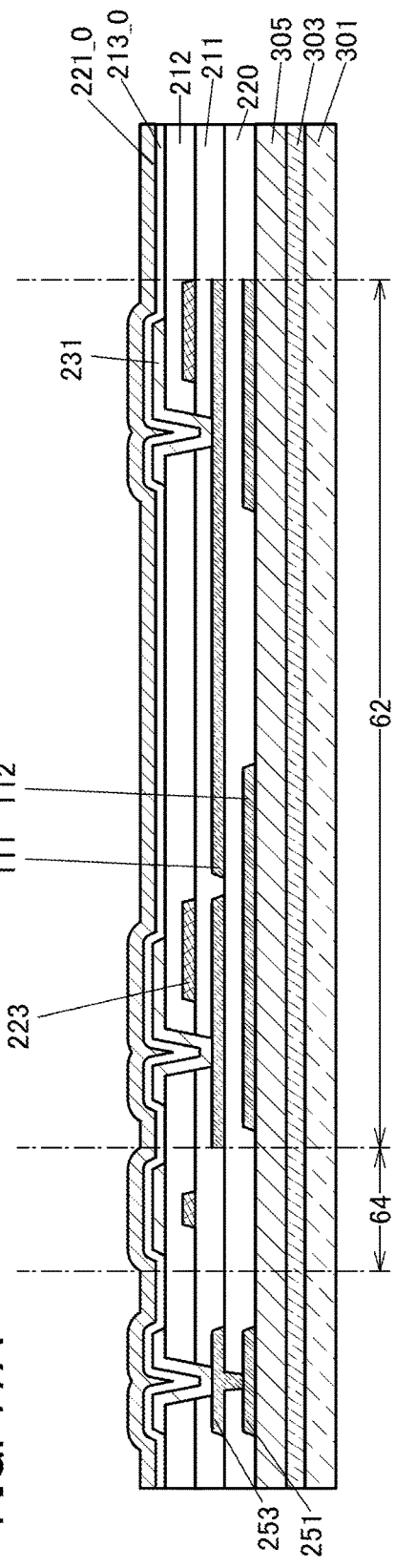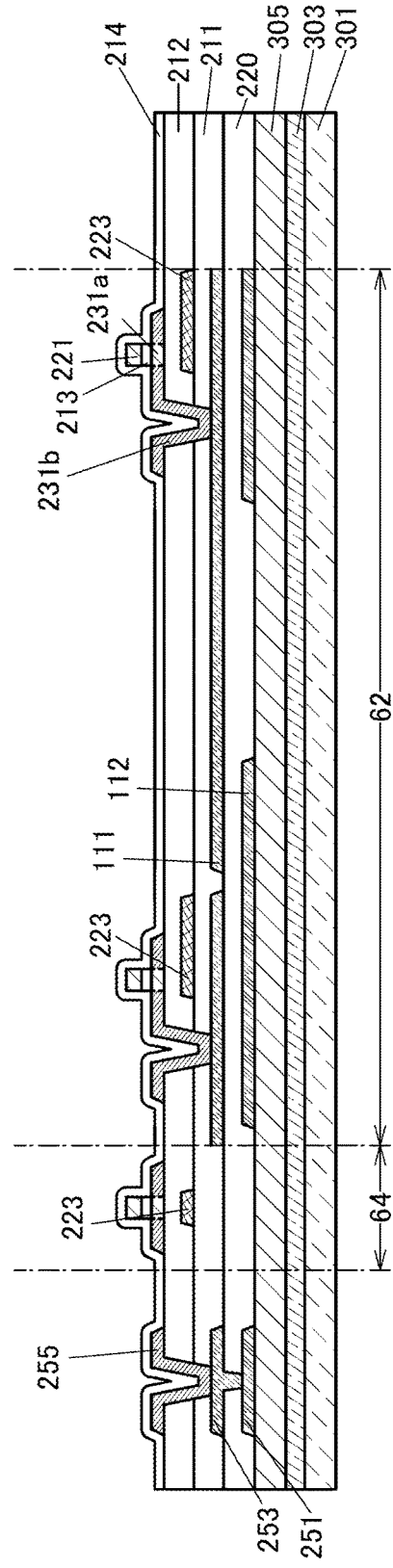

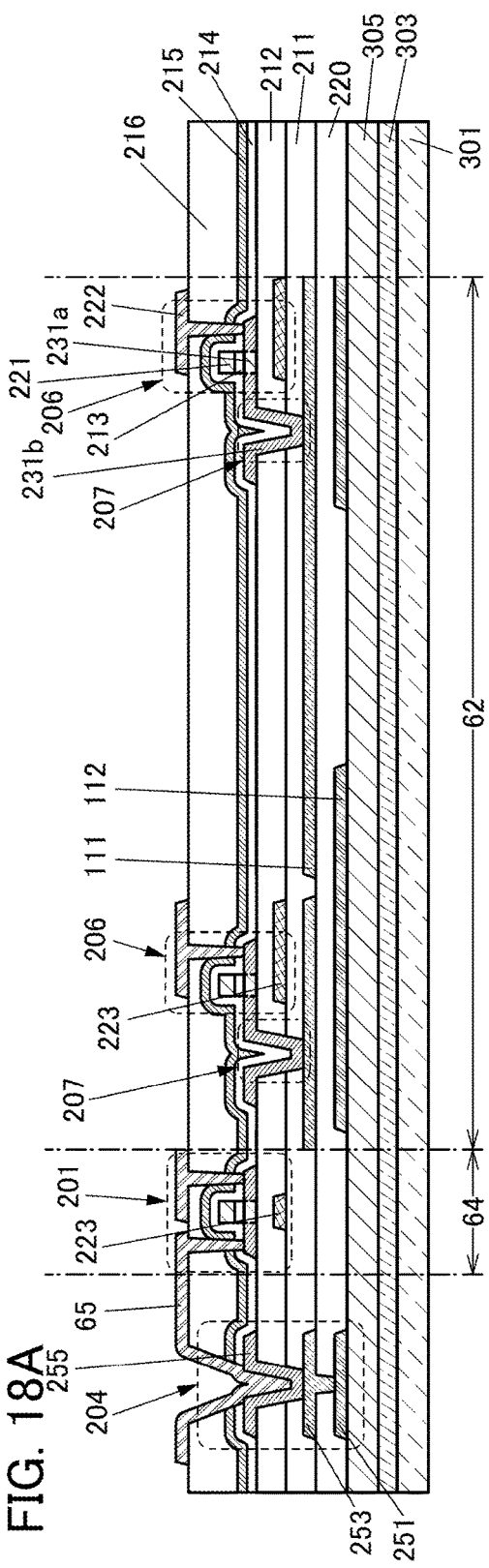
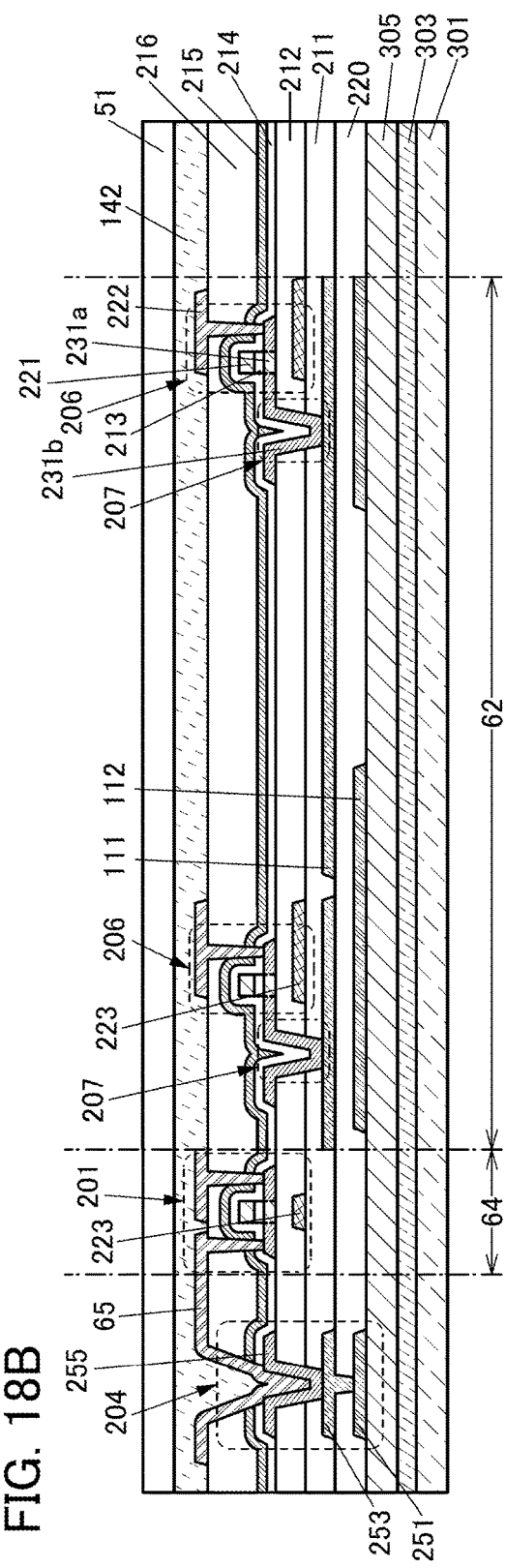
FIG. 18A
FIG. 18B

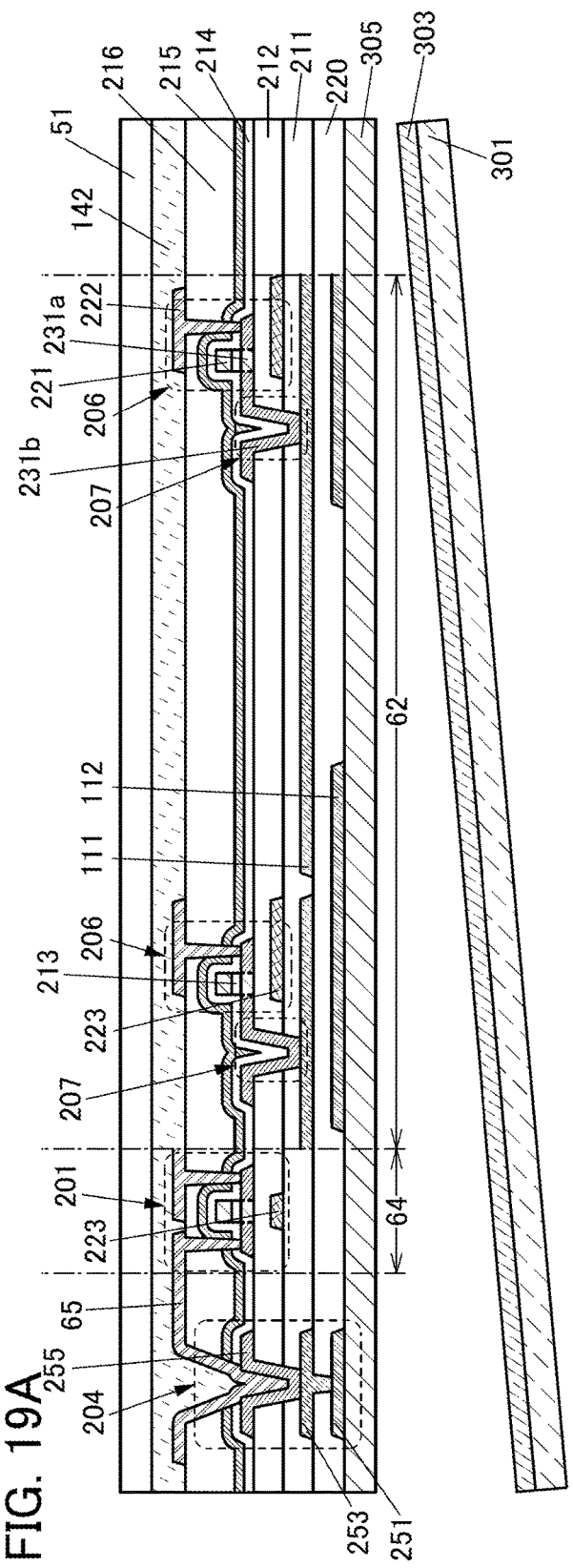
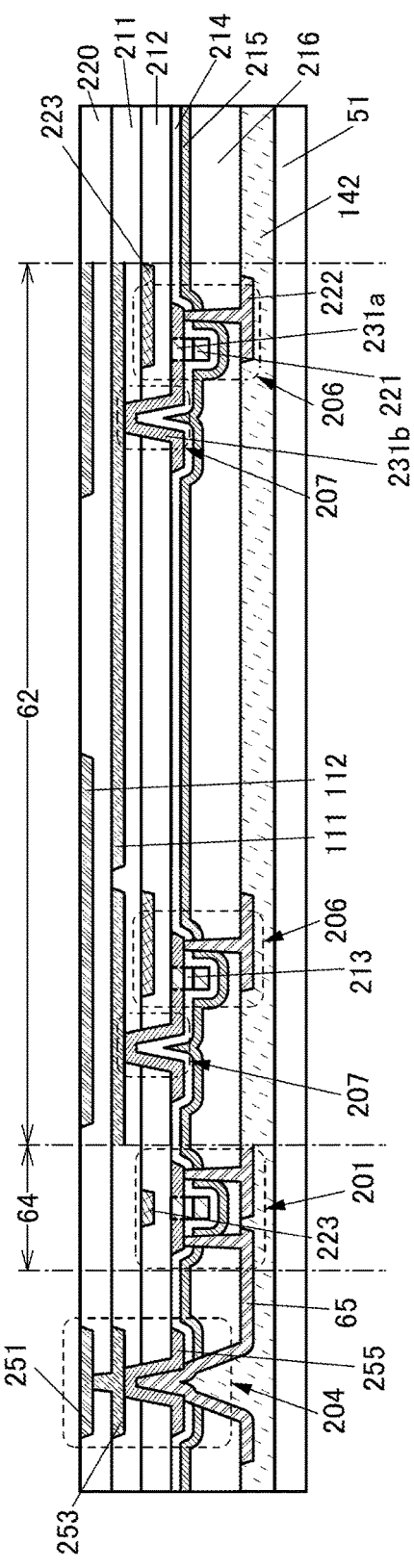

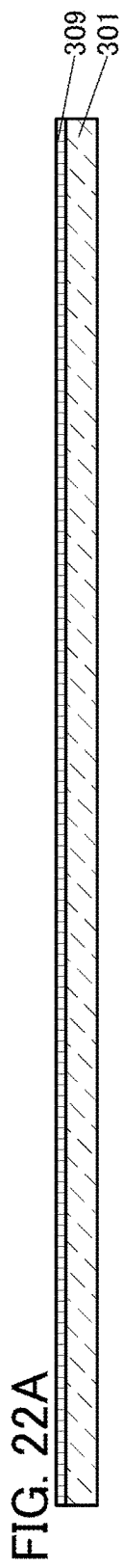
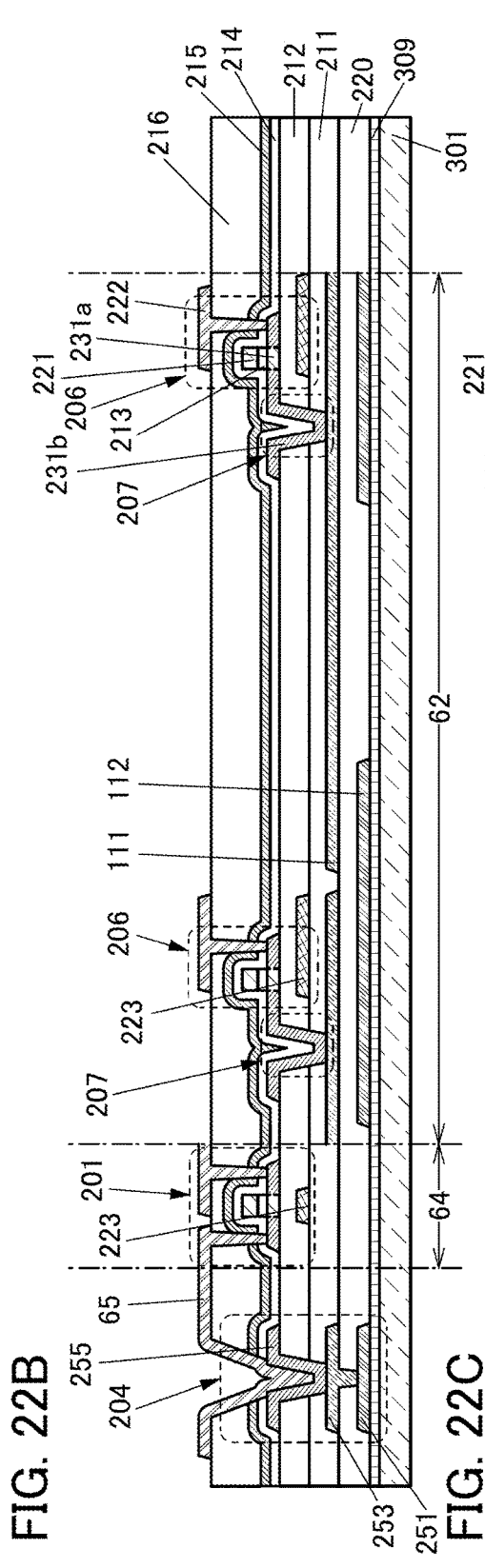
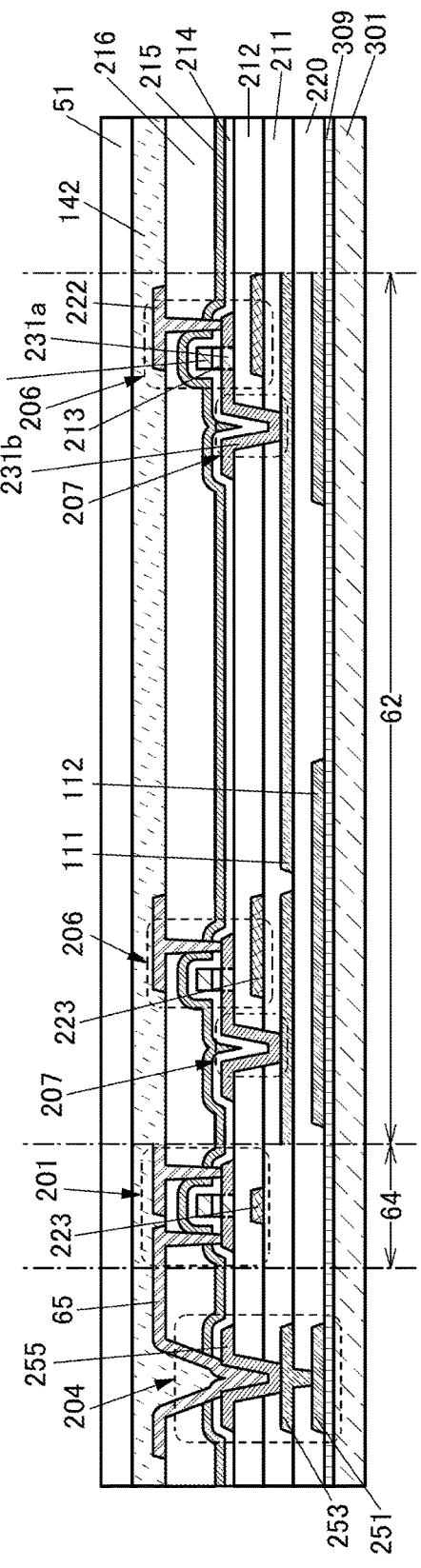

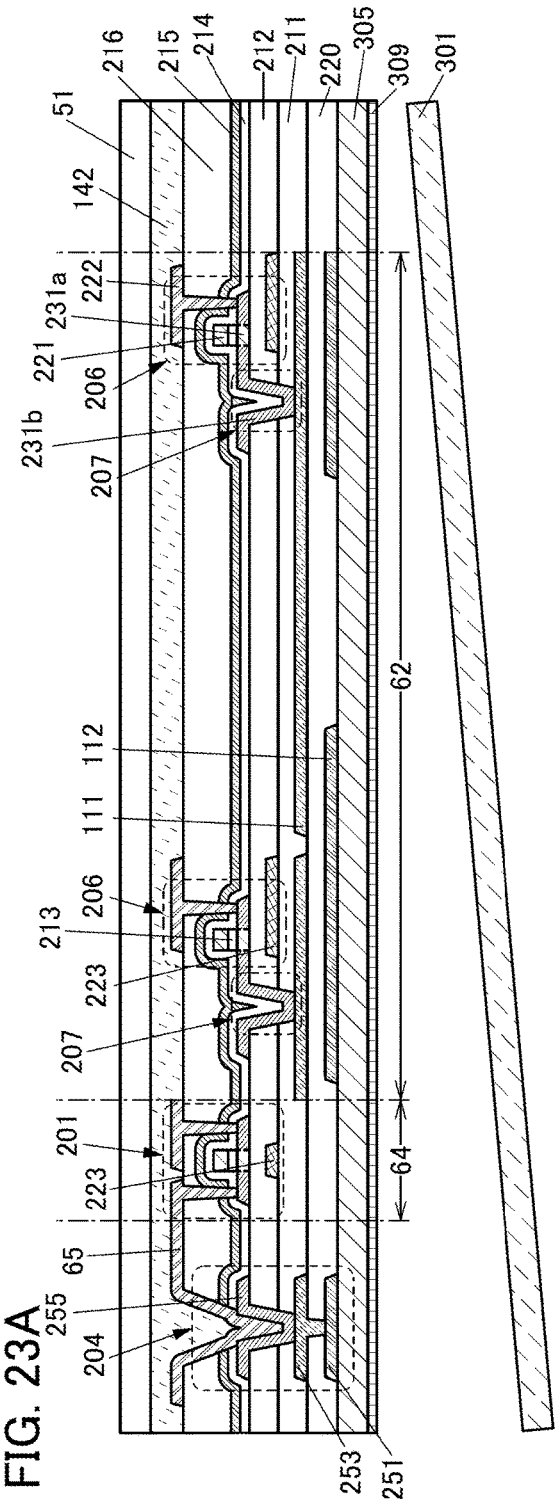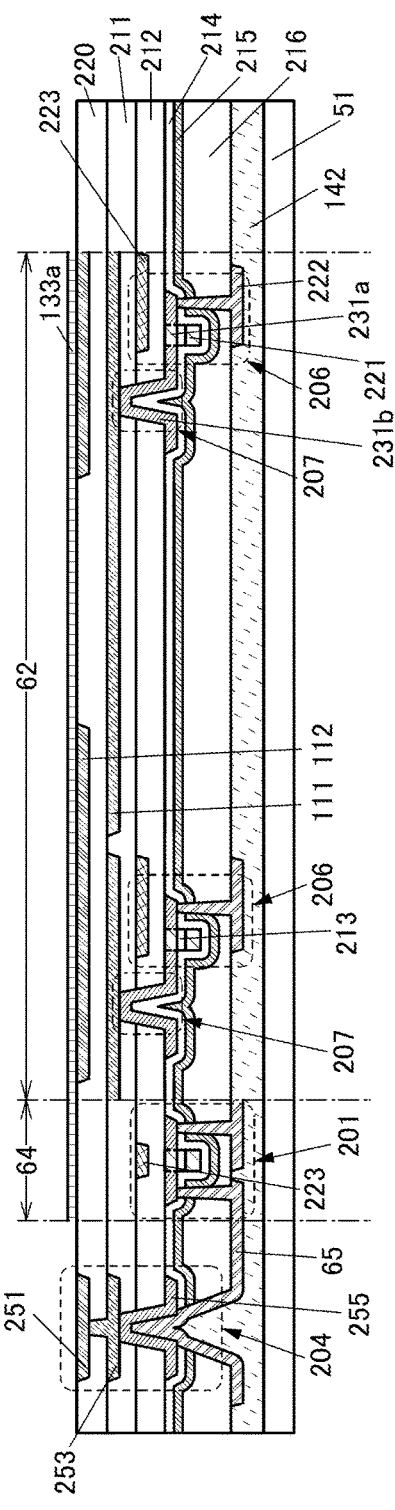
FIG. 23A
FIG. 23B

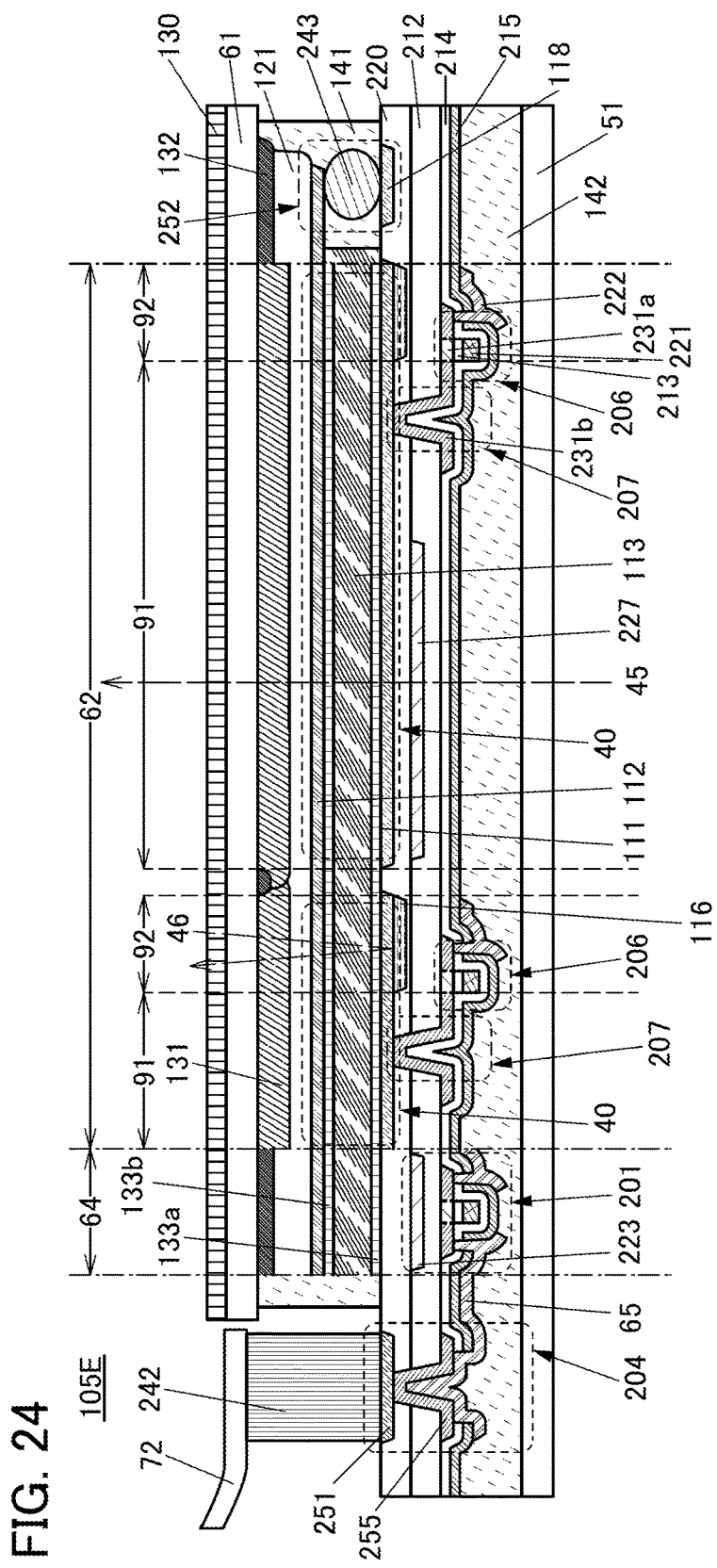

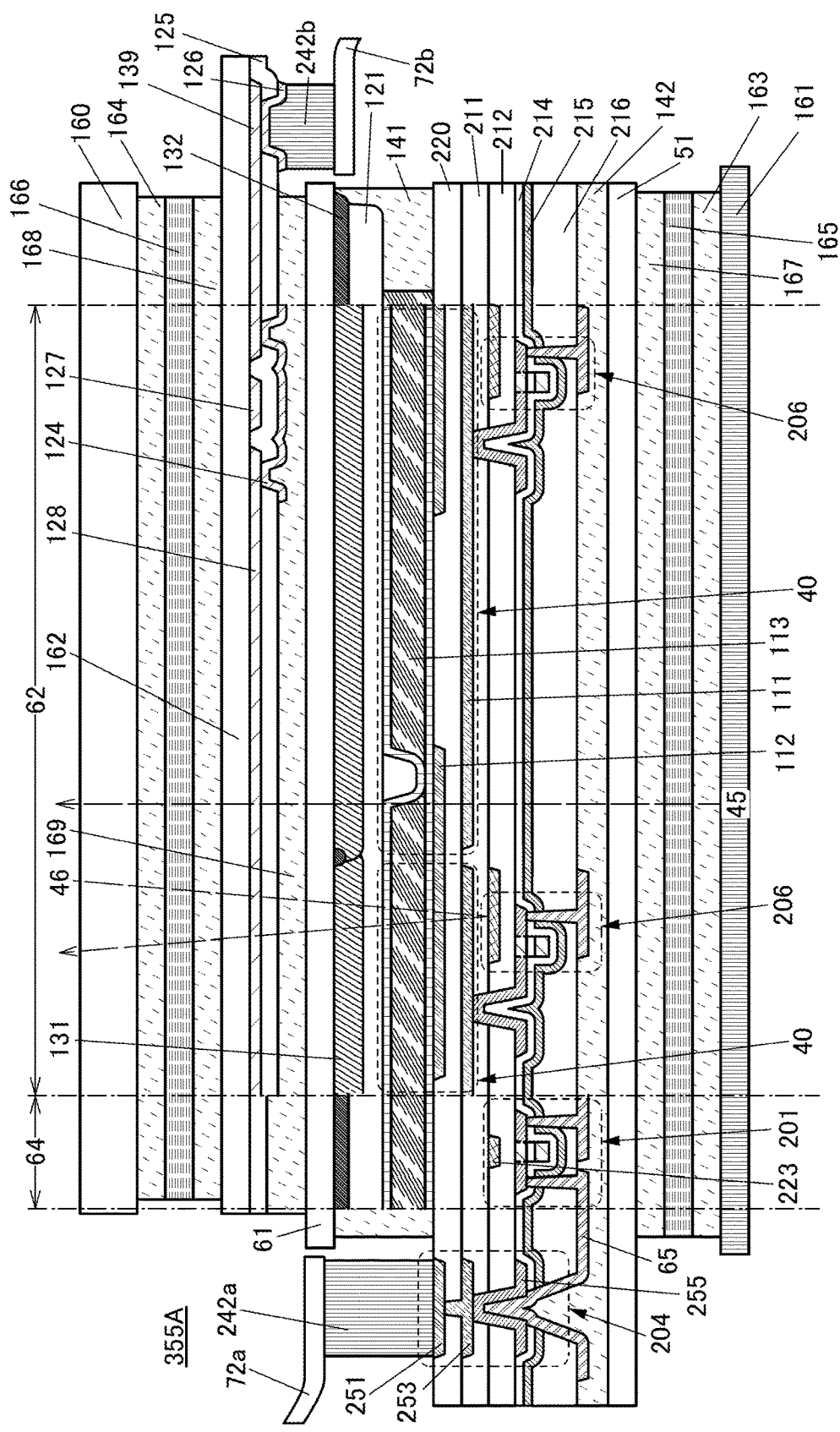

DISPLAY DEVICE

BACKGROUND OF THE INVENTION

1. Field of the Invention

An embodiment of the present invention relates to a liquid crystal display device. In addition, an embodiment of the present invention relates to a separation method.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (e.g., a touch sensor), an input-output device (e.g., a touch panel), a driving method thereof, and a manufacturing method thereof.

2. Description of the Related Art

Transistors used for most flat panel displays typified by a liquid crystal display device and a light-emitting display device are formed using silicon semiconductors such as amorphous silicon, single crystal silicon, and polycrystalline silicon provided over glass substrates. Further, a transistor employing such a silicon semiconductor is used in integrated circuits (ICs) and the like.

In recent years, attention has been drawn to a technique in which, instead of a silicon semiconductor, a metal oxide exhibiting semiconductor characteristics is used in transistors. Note that in this specification, a metal oxide exhibiting semiconductor characteristics is referred to as an oxide semiconductor. For example, in Patent Documents 1 and 2, a technique is disclosed in which a transistor is manufactured using zinc oxide or an In—Ga—Zn-based oxide as an oxide semiconductor and the transistor is used as a switching element or the like of a pixel of a display device.

REFERENCE

Patent Document

[Patent Document 1] Japanese Published Patent Application No. 2007-123861
[Patent Document 2] Japanese Published Patent Application No. 2007-96055

SUMMARY OF THE INVENTION

An object of one embodiment of the present invention is to provide a liquid crystal display device with a high resolution. Another object of one embodiment of the present invention is to provide a liquid crystal display device with a high aperture ratio. Another object of one embodiment of the present invention is to provide a liquid crystal display device with low power consumption. Another object of one embodiment of the present invention is to provide a highly reliable liquid crystal display device. Another object of one embodiment of the present invention is to provide a novel liquid crystal display device.

Note that the descriptions of these objects do not disturb the existence of other objects. Note that one embodiment of the present invention does not necessarily achieve all the objects. Other objects can be derived from the description of the specification, the drawings, and the claims.

A display device of one embodiment of the present invention includes a transmissive region and a reflective region. The display device includes a liquid crystal element, a transistor, a scan line, a signal line, a layer that reflects visible light, and a first insulating layer. The liquid crystal element includes a pixel electrode, a common electrode, and a liquid crystal layer. The transistor includes a semiconductor layer, a gate, and a gate insulating layer. The first insulating layer is positioned between the pixel electrode and the transistor. The first insulating layer includes an opening portion. The pixel electrode is positioned between the liquid crystal layer and the first insulating layer. The common electrode has a function of transmitting visible light. The semiconductor layer includes a first region and a second region. The first region overlaps with the gate with the gate insulating layer positioned therebetween. The second region includes a first portion in contact with the pixel electrode and a second portion in contact with a side surface of the opening portion in the first insulating layer. The second region has resistivity lower than resistivity of the first region. The first portion is positioned in the transmissive region or the reflective region. The reflective region includes the layer that reflects visible light. The layer that reflects visible light includes a portion positioned between the scan line or the signal line and the liquid crystal layer.

For the semiconductor layer, a material that transmits visible light or a material that blocks visible light can be used.

In the case of using a material that blocks visible light for the semiconductor layer, the second region of the semiconductor layer is preferably positioned in the reflective region. The layer that reflects visible light may overlap with one or both of the pixel electrode and the common electrode. The layer that reflects visible light may also serve as a pixel electrode or a common electrode. As the semiconductor layer, a silicon semiconductor layer can be suitably used, for example.

In the case of using a material that transmits visible light for the semiconductor layer, the second region of the semiconductor layer is preferably positioned in the transmissive region. At this time, the pixel electrode transmits visible light. The pixel electrode may be electrically connected to the layer that reflects visible light. The layer that reflects visible light may overlap with one or both of the pixel electrode and the common electrode.

A display device of one embodiment of the present invention includes a transmissive region and a reflective region. The display device includes a liquid crystal element, a transistor, a scan line, a signal line, a layer that reflects visible light, and a first insulating layer. The liquid crystal element includes a pixel electrode, a common electrode, and a liquid crystal layer. The transistor includes an oxide semiconductor layer, a gate, and a gate insulating layer. The first insulating layer is positioned between the pixel electrode and the transistor. The first insulating layer includes an opening portion. The pixel electrode is positioned between the liquid crystal layer and the first insulating layer. The pixel electrode and the common electrode each have a function of transmitting visible light. The oxide semiconductor layer includes a first region and a second region. The first region overlaps with the gate with the gate insulating layer positioned therebetween. The second region includes a first portion in contact with the pixel electrode and a second portion in contact with a side surface of the opening portion in the first insulating layer, and is positioned in the transmissive region. The second region has resistivity lower than resistivity of the first region. The reflective region includes the layer that reflects visible light. The layer that reflects visible light includes a third portion positioned between the scan line or the signal line and the liquid crystal layer. The pixel electrode may be electrically connected to the layer that reflects visible light. The layer that reflects visible light may overlap with one or both of the pixel electrode and the common electrode. The layer that reflects visible light preferably includes a fourth portion overlapping with the first region.

In the display device having the above-described structure, it is preferable that the pixel electrode, the common electrode, and the oxide semiconductor layer each include indium, zinc, and at least one of aluminum, gallium, yttrium, and tin. It is preferable that the pixel electrode, the common electrode, and the oxide semiconductor layer each include a crystal part. It is preferable that the crystal part have c-axis alignment. It is preferable that the transistor include a back gate. The back gate includes a portion overlapping with the gate with the oxide semiconductor layer positioned therebetween. The gate and the back gate are electrically connected to each other. The gate includes indium, zinc, and at least one of aluminum, gallium, yttrium, and tin.

It is preferable that a coloring layer be further included in the display device having any of the above-described structures. The coloring layer overlaps with the pixel electrode with the liquid crystal layer positioned therebetween. A thickness of the coloring layer in the reflective region is greater than or equal to 40% and less than or equal to 60% of a thickness of the coloring layer in the transmissive region.

In the display device having any of the above-described structures, it is preferable that a thickness of the liquid crystal layer in the reflective region be greater than or equal to 40% and less than or equal to 60% of a thickness of the liquid crystal layer in the transmissive region.

It is preferable that a light-blocking layer be further included in the display device having any of the above-described structures. It is preferable that the light-blocking layer be positioned at a boundary between the transmissive region and the reflective region.

In the display device having any of the above-described structures, it is preferable that a surface of the pixel electrode on the liquid crystal layer side and a surface of the first insulating layer on the liquid crystal layer side form the same surface.

In the display device having any of the above-described structures, it is preferable that the common electrode be positioned between the transistor and the liquid crystal layer.

It is preferable that the display device having any of the above-described structures further include a second insulating layer positioned between the pixel electrode and the common electrode. It is preferable that a surface of the common electrode on the liquid crystal layer side and a surface of the second insulating layer on the liquid crystal layer side form the same surface.

In the display device having any of the above-described structures, it is preferable that a direction in which the scan line extends intersect with a direction in which the signal line extends and that a direction in which a plurality of pixels (subpixels) exhibiting the same color are arranged intersect with a direction in which the signal line extends.

One embodiment of the present invention is a module that includes a display device with one of the configurations described above. The module has a connector such as flexible printed circuit (FPC) board or a tape carrier package (TCP) connected thereto, or an IC is implemented on the module with a method such as a chip on glass (COG) method or a chip on film (COF) method.

In one embodiment of the present invention, the configurations described above may be applied to an input/output device such as a touch panel, instead of a display device.

One embodiment of the present invention is an electronic device including one of the modules described above, and at least one of an antenna, a battery, a housing, a camera, a speaker, a microphone, and a control button.

One embodiment of the present invention can provide a liquid crystal display device with high resolution. Another embodiment of the present invention can provide a liquid crystal display device with high aperture ratio. Another embodiment of the present invention can provide a liquid crystal display device with low power consumption. Another embodiment of the present invention can provide a highly reliable liquid crystal display device. Another object of one embodiment of the present invention can provide a novel liquid crystal display device.

The descriptions of these effects do not disturb the existence of other effects, and one embodiment of the present invention does not necessarily achieve all the effects. Other effects can be derived from the description of the specification, the drawings, and the claims.

BRIEF DESCRIPTION OF THE DRAWINGS

FIGS. 1A to 1C are cross-sectional views showing examples of a display device.

FIGS. 5A to 5C are cross-sectional views showing examples of a display device.

FIGS. 6A and 6B are cross-sectional views showing examples of a display device.

FIGS. 10A to 10C are top views showing an example of a subpixel.

FIGS. 11A to 11C are top views showing an example of a subpixel.

FIGS. 12A to 12C are top views showing an example of a subpixel.

FIGS. 13A and 13B are cross-sectional views showing an example of a display device.

FIGS. 15A to 15C are cross-sectional views illustrating an example of a fabrication method of a display device.

FIGS. 16A and 16B are cross-sectional views illustrating an example of a fabrication method of a display device.

FIGS. 17A and 17B are cross-sectional views illustrating an example of a fabrication method of a display device.

FIGS. 18A and 18B are cross-sectional views illustrating an example of a fabrication method of a display device.

FIGS. 19A and 19B are cross-sectional views illustrating an example of a fabrication method of a display device.

FIGS. 22A to 22C are cross-sectional views illustrating an example of a fabrication method of a display device.

FIGS. 23A and 23B are cross-sectional views illustrating an example of a fabrication method of a display device.

FIG. 24 is a cross-sectional view illustrating an example of a display device.

FIG. 26 is a cross-sectional view illustrating an example of a touch panel.

DETAILED DESCRIPTION OF THE INVENTION

Figure 2A:
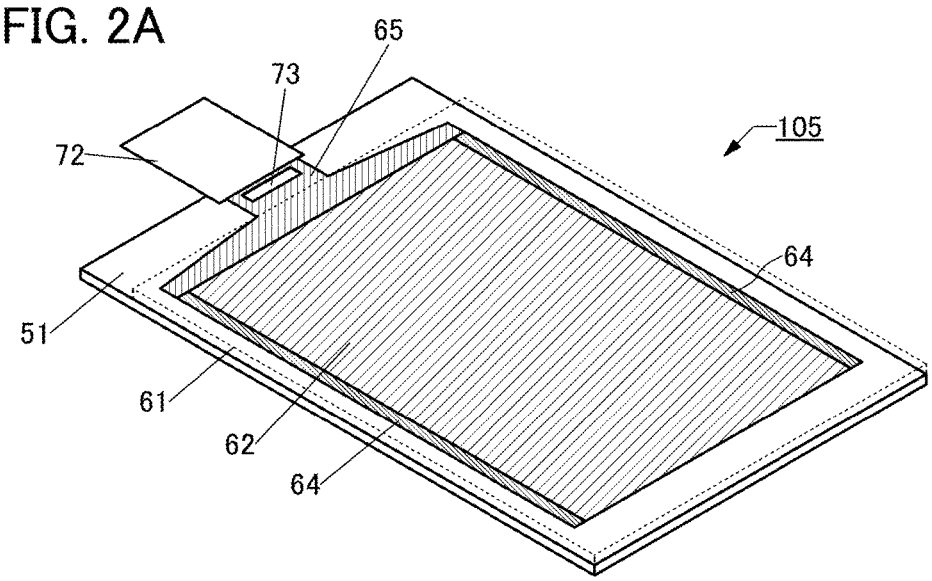
FIG. 2A is a perspective view showing an example of a display device.

Embodiments are described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments and example.

Note that in the configuration of the invention described below, the same portions or portions having similar functions are denoted by the same reference numerals across different drawings and repetitive description thereof is omitted. Further, the same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, size, range, or the like disclosed in the drawings.

Note that the terms "film" and "layer" can be used interchangeably depending on the case or circumstances. For example, the term "conductive layer" can be changed into the term "conductive film". Also, the term "insulating film" can be changed into the term "insulating layer".

Embodiment 1

In this embodiment, a display device of one embodiment of the present invention and the fabrication method thereof is described with reference to FIG. 1A to FIG. 33C.

One embodiment of the present invention is a liquid crystal display device including a transmissive region and a reflective region. In the transmissive region, display can be performed using a backlight or the like as a light source. In the reflective region, display can be performed using external light as a light source.

A display device of one embodiment of the present invention includes a liquid crystal element, a transistor, a scan line, a signal line, and an insulating layer. The liquid crystal element includes a pixel electrode, a common electrode, and a liquid crystal layer. The transistor includes a semiconductor layer, a gate, and a gate insulating layer. The insulating layer is positioned between the pixel electrode and the transistor. The insulating layer includes an opening portion. The pixel electrode is positioned between the liquid crystal layer and the insulating layer. The common electrode has a function of transmitting visible light.

The semiconductor layer includes a channel region and a low-resistance region. The channel region overlaps with the gate with the gate insulating layer positioned therebetween. The low-resistance region includes a first portion in contact with the pixel electrode of the liquid crystal element and a second portion in contact with a side surface of the opening portion in the insulating layer. The first portion is positioned in the transmissive region or the reflective region.

The reflective region includes a layer that reflects visible light. The layer that reflects visible light includes a portion positioned between the scan line or the signal line and the liquid crystal layer.

In the display device of one embodiment of the present invention, a contact area where the pixel electrode of the liquid crystal element and the transistor are in contact with each other is positioned in the transmissive region or the reflective region. In the display device of one embodiment of the present invention, at least one of the scan line and the signal line is positioned in the reflective region.

That is, in one embodiment of the present invention, the contact area and at least one of the scan line and the signal line can be provided in a portion of the display device that contributes to display (the portion is also referred to as an opening portion of a pixel). Thus, the aperture ratio of the display device (also referred to as an aperture ratio of a pixel) can be increased. Furthermore, the display device can have high resolution. This can increase the aperture ratio of a transmissive liquid crystal display device; this aperture ratio can also be referred to as the aperture ratio of the pixel. Furthermore, this can enable a display device with high resolution. In addition, the increase in aperture ratio can enable an increase in the light extraction efficiency. This can decrease the power consumption of the display device.

In the case where a material that blocks visible light is used for the semiconductor layer, the contact area where the pixel electrode and the transistor are in contact with each other is included in the reflective region. In the case where a material that transmits visible light is used for the semiconductor layer, the contact area where the pixel electrode and the transistor are in contact with each other is preferably included in the transmissive region.

The display device of one embodiment of the present invention can be referred to as a semi-transmissive liquid crystal device. For example, the display device of one embodiment of the present invention can perform display using only external light (also referred to as display using only the reflective region, or a reflective mode), display using only a backlight (also referred to as display using only the transmissive region, or a transmissive mode), and display using both external light and a backlight (also referred to as display using both the reflective region and the transmissive region, or a semi-transmissive mode).

In the case where external light enters the liquid crystal element, display can be performed in the reflective region. At this time, the backlight can be in an off state. In the case where the area around the display device is sufficiently bright or external light enters the display device sufficiently, for example, it is preferable to perform display using only external light (display using only the reflective region). Because it is not necessary to use the backlight, display with high visibility can be performed with low power consumption.

In the case where light enters the liquid crystal element from the backlight, display can be performed in the transmissive region. In the case where the area around the display device is dark or external light hardly enters the display device, for example, it is preferable to perform display using the backlight (display using the transmissive region).

In the case where light emitted from the backlight and external light both enter the liquid crystal element, display can be performed using both the transmissive region and the reflective region. In this case, the aperture ratio can be increased as compared with the case where display is performed using only the transmissive region, so that a bright image can be displayed. Furthermore, because reflected light is used, visibility in a bright place is significantly improved as compared with the case of using only transmitted light. Moreover, the intensity of light from the backlight can be lowered as compared with the case where display is performed using only the transmissive region, so that display with high visibility can be performed with low power consumption.

Examples of the backlight include a direct-below backlight and an edge-light backlight. The use of the direct-below backlight with light-emitting diodes (LEDs) is preferable as it enables complex local dimming and increase in contrast. The edge-light type backlight is preferably used because the thickness of a module including the backlight can be reduced.

As the light source, a cold cathode fluorescent lamp or a light-emitting element such as an organic light-emitting diode (OLED) or a quantum-dot light-emitting diode (QLED) may be used as well as an LED.

The display device of one embodiment of the present invention can perform display with high visibility irrespective of the surrounding brightness or the amount of external light entering the display device.

The brightness of the backlight can be adjusted automatically and/or manually. In the case where a device including the display device includes an illuminance sensor, the brightness of the backlight can be changed in accordance with the illuminance obtained by the illuminance sensor. The brightness of the backlight may be adjusted as appropriate by a user of the device.

In one embodiment of the present invention, one pixel electrode is provided in the reflective region and the transmissive region. Thus, the gradation of transmitted light and reflected light can be controlled by one pixel circuit. Therefore, the number of signal lines and scan lines is not increased and the pixel circuit does not have a complex structure unlike the case of using a method of separately controlling transmitted light and reflected light, so that a circuit configuration similar to that of a transmissive display device or a reflective display device can be used. Consequently, a display device with extremely high resolution can be obtained. Furthermore, a transmissive mode, a reflective mode, and a semi-transmissive mode can each be driven without changing a driving method of the pixel circuit.

In the fabrication method of the display device in one embodiment of the present invention, the transistor is formed after an electrode of the liquid crystal element is formed over a first substrate. Next, the first substrate and a second substrate are bonded to each other. Then, the electrode of the liquid crystal element and the transistor are transferred from the first substrate to the second substrate by separating the first substrate and the second substrate. By forming the electrode of the liquid crystal element before the transistor, the electrode of the liquid crystal element can be formed flatly without being affected by the uneven surface caused by the transistor or the contact area of the pixel electrode and the transistor. Forming the electrode of the liquid crystal element flatly can reduce the variation of cell gaps in the liquid crystal element. In addition, variation of the initial alignment of the liquid crystal can be reduced, thereby reducing the display defects in the display device. Furthermore, reduction of the aperture ratio due to the alignment defect of the liquid crystal can be reduced.

In the fabrication method of the display device in one embodiment of the present invention, the first substrate used in forming the transistor is separated during the fabrication process. That is, the fabrication conditions of the transistor are not limited by the material of the substrate that is included in the component of the display device. For example, by fabricating the transistor over the first substrate using a high temperature, the transistor can be made more reliable. By using a substrate that is thinner and more lightweight and flexible than the first substrate as each of the second substrate to which the transistor and the like are transferred, and the counter substrate that encapsulates the liquid crystal layer together with the second substrate, the display device can be made lightweight, thin, and flexible.

1-1. Structure Example 1 of Display Device

FIG. 1A and FIG. 2A illustrate an example of the display device. FIG. 1A is a cross-sectional view of a display device 105, and FIG. 2A is a perspective view of the display device 105. For clarity, components such as a polarizer 130 are not drawn in FIG. 2A. FIG. 2A illustrates the substrate 61 with the dotted line.

The display device 105 includes a display portion 62 and a driver circuit portion 64. An FPC 72 and an IC 73 are implemented on the display device 105.

The display portion 62 includes a plurality of pixels and has a function of displaying images.

A pixel includes a plurality of sub-pixels. For example, the display portion 62 can display a full-color image by having one pixel be composed of three subpixels: a subpixel exhibiting a red color, a subpixel exhibiting a green color, and a subpixel exhibiting a blue color. Note that the color exhibited by the subpixel is not limited to red, green, or blue. A pixel may be composed of subpixels that exhibit colors of white, yellow, magenta, or cyan, for example. In this specification and the like, a subpixel may be simply described as a pixel.

The display device 105 may have one or both of the scan line driver circuit and the signal line driver circuit. The display device 105 may include none of the scan line driver circuit and the signal line driver circuit. When the display device 105 includes a sensor such as a touch sensor, the display device may include a sensor driver circuit. In this embodiment, the driver circuit portion 64 is exemplified as including the scan line driver circuit. The scan line driver circuit has a function of outputting scan signals to the scan lines included in the display portion 62.

In the display device 105, the IC 73 is mounted on a substrate 51 by a COG method or the like. The IC 73 includes, for example, any one or more of a signal line driver circuit, a scan line driver circuit, and a sensor driver circuit.

The FPC 72 is electrically connected to the display device 105. The IC 73 and the driver circuit portion 64 are supplied with signals or power from the outside through the FPC 72. Furthermore, signals can be output to the outside from the IC 73 through the FPC 72.

An IC may be mounted on the FPC 72. For example, an IC including any one or more of a signal line driver circuit, a scan line driver circuit, and a sensor driver circuit may be mounted on the FPC 72.

A wiring 65 supplies signals and power to the display portion 62 and the driver circuit portion 64. The signals and power are input to the wiring 65 from the outside through the FPC 72, or from the IC 73.

FIG. 1A is a cross-sectional view including the display portion 62, the driver circuit portion 64, and the wiring 65. The display portion 62 includes a transmissive region 91 and a reflective region 92. In the transmissive region 91, display can be performed using light 45 emitted from a backlight. In the reflective region 92, display can be performed using external light 46. The display portion 62 includes a non-display region 93 between adjacent subpixels.

The display device 105 is an example of a liquid crystal display device that includes a liquid crystal element with a horizontal electric field mode.

As illustrated in FIG. 1A, the display device 105 includes the substrate 51, an adhesion layer 142, a transistor 201, a transistor 206, a liquid crystal element 40, a reflective layer 116, an alignment film 133a, an alignment film 133b, a connection portion 204, an adhesion layer 141, a spacer 117, a coloring layer 131, an overcoat 121, the substrate 61, the polarizer 130, and the like.

The display portion 62 includes the transistor 206 and the liquid crystal element 40.

The transistor 206 includes a gate 221, a gate insulating layer 213, and a semiconductor layer (a channel region 231a and a pair of low-resistance regions 231b). The resistivity of the low-resistance region 231b is lower than that of the channel region 231a. The semiconductor layer can transmit visible light. In this embodiment, the case in which an oxide semiconductor layer is used as the semiconductor layer is described as an example unless otherwise specified. For example, the oxide semiconductor layer preferably contains indium and is further preferably an In-M-Zn oxide (M is Al, Ti, Ga, Ge, Y, Zr, La, Ce, Nd, Sn, or Hf) film. The details of the oxide semiconductor layer are described later.

A conductive layer 222 is connected with the low-resistance region 231b through an opening formed in insulating layers 214 and 215.

The transistor 206 is covered by the insulating layers 214 and 215. Note that the insulating layers 214 and 215 can be considered as the component of the transistor 206. The transistor is preferably covered by an insulating layer that reduces the diffusion of an impurity to the semiconductor constituting the transistor.

The gate insulating layer 213 preferably includes an excess oxygen region. When the gate insulating layer 213 includes the excess oxygen region, excess oxygen can be supplied into the channel region 231a. A highly reliable transistor can be provided since oxygen vacancies that are potentially formed in the channel region 231a can be filled with excess oxygen.

The insulating layer 214 preferably includes nitrogen or hydrogen. When the insulating layer 214 and the low-resistance region 231b are in contact with each other, nitrogen or hydrogen in the insulating layer 214 is added into the low-resistance region 231b. The carrier density of the low-resistance region 231b becomes high when nitrogen or hydrogen is added.

The liquid crystal element 40 is a liquid crystal element with fringe field switching (FFS) mode. The liquid crystal element 40 includes a pixel electrode 111, a common electrode 112, and a liquid crystal layer 113. The alignment of the liquid crystal layer 113 can be controlled with the electrical field generated between the pixel electrode 111 and the common electrode 112. The liquid crystal layer 113 is positioned between the alignment films 133a and 133b.

The pixel electrode 111 is electrically connected to the low-resistance region 231b of the semiconductor layer of the transistor 206.

In a connection portion 207, the low-resistance region 231b of the semiconductor layer is connected to the pixel electrode 111. The low-resistance region 231b of the semiconductor layer includes a portion that is in contact with side surfaces of an opening portion in an insulating layer 211. The low-resistance region 231b of the semiconductor layer is in contact with the side surfaces of the opening portion in the insulating layer 211, while at the same time being connected to the pixel electrode 111. This enables the pixel electrode 111 to be placed flatly.

By using a material that transmits visible light in the semiconductor layer and the pixel electrode 111, the connection portion 207 can be provided in the transmissive region 91. Thus, the area of transmissive region 91 can be increased.

The connection portion 207 is flat on the substrate 61 side. Thus, the surface of each of the pixel electrode 111, an insulating layer 220, the common electrode 112, and the alignment film 133a on the substrate 61 side are all flat. Note that the surfaces of the pixel electrode 111, the insulating layer 220, the common electrode 112 and the alignment film 133a that are described above each overlap with the connection portion 207 and are positioned closer to the substrate 61 than the connection portion 207. Therefore, portions of the liquid crystal layer 113 that overlap with the connection portion 207 can be used to display images, similarly to other areas. This can increase the aperture ratio of a display device and facilitate the fabrication of a display device with high resolution.

When the low-resistance region 231b of the semiconductor layer is directly connected to the pixel electrode 111, the possibilities in the layout of the pixel can be increased. For example, the low-resistance region 231b and the pixel electrode 111 may be electrically connected through a conductive layer that is provided closer to the substrate 51 than the insulating layer 214. In this case, however, two connection portions, i.e., a connection portion connecting the conductive layer and the low-resistance region 231b, and a connection portion connecting the conductive layer and the pixel electrode 111, need to be provided. In contrast, the structure illustrated in FIG. 1A and the like can reduce such connection portions. Therefore, this structure can achieve a smaller pixel size without changing design rules, which enables a display device with high resolution.

The reflective layer 116 is provided to overlap with the conductive layer 222 and the gate 221 of the transistor 206. The reflective layer 116 is provided in contact with the pixel electrode 111.

The reflective layer 116 may overlap with one of or both the pixel electrode 111 and the common electrode 112, or the reflective layer 116 does not need to overlap with the pixel electrode 111 or the common electrode 112. The reflective layer 116 may be electrically connected to the pixel electrode 111.

The gate 221 and the conductive layer 222 each preferably have a low resistance value, and a metal, an alloy, or the like can be suitably used. The same applies to wirings (including a signal line and a scan line) electrically connected to the gate 221 and the conductive layer 222. On the other hand, the gate 221, the conductive layer 222, and the wirings that are formed using such a material block visible light. Thus, a region that blocks visible light is provided in at least a part of the display portion 62.

Thus, in one embodiment of the present invention, the reflective layer 116 is provided to overlap with the region that blocks visible light in the display portion 62. When such a structure is employed, the region that blocks visible light in the display portion 62 can be used as the reflective region 92. Furthermore, a portion of the display device that contributes to display can be enlarged, and accordingly, the display device can have a high aperture ratio. Moreover, the display device can have high resolution.

For the reflective layer 116, a material that reflects visible light can be used. Examples of the material that reflects visible light include aluminum, silver, and an alloy including any of these metal materials. Furthermore, a metal material such as gold, platinum, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La); or an alloy containing silver such as an alloy of silver and copper, an alloy of silver, palladium, and copper (also referred to as Ag—Pd—Cu or APC), or an alloy of silver and magnesium may be used.

In the display device 105, the thicknesses of the insulating layers 211, 214, and 215 do not directly affect the characteristics of the transistors 201 and 206. Thus, the insulating layers 211, 214, and 215 can be made thick. This can reduce the parasitic capacitance between the pixel electrode 111 or the reflective layer 116 and the gate 221, the parasitic capacitance between the pixel electrode 111 or the reflective layer 116 and the semiconductor layer, the parasitic capacitance between the pixel electrode 111 or the reflective layer 116 and the conductive layer 222, or the like.

Figure 2B:
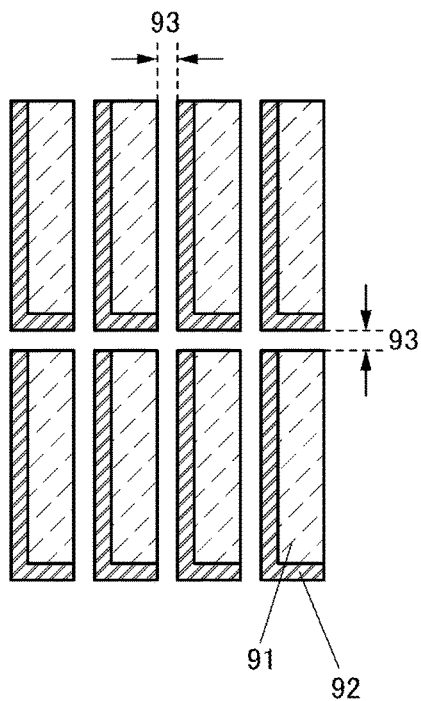
FIGS. 2B and 2C are drawings showing layout examples of pixels.
Figure 2C:
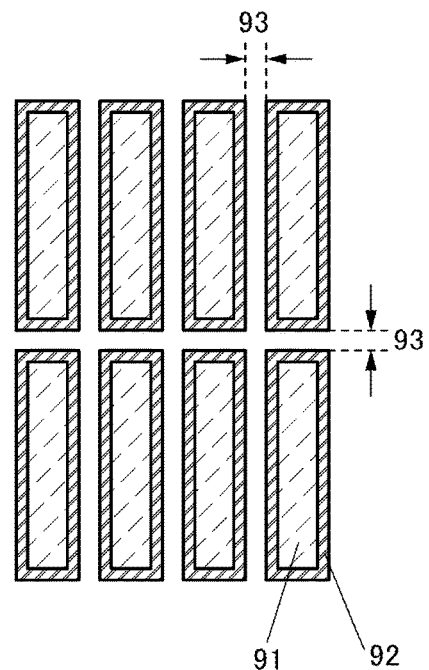

FIGS. 2B and 2C are top views showing layout examples of the transmissive regions 91, the reflective regions 92, and the non-display region 93 in the display portion 62. The transmissive region 91 and the reflective region 92 are provided in a region occupied by one subpixel. That is, the transmissive regions 91 and the reflective regions 92 are arranged in matrix. In FIG. 2B, the reflective region 92 is provided along two sides of the transmissive region 91. In FIG. 2C, the reflective region 92 is provided to surround the transmissive region 91. Two or more reflective regions 92 may be provided for one transmissive region 91. Two transmissive regions 91 that are driven by different transistors (two transmissive regions 91 included in difference subpixels) are separated from each other by the non-display region 93. The top views of the layout of the transmissive regions 91 and the reflective regions 92 are not limited to those shown in FIGS. 2B and 2C.

In the display device of one embodiment of the present invention, a part of the region that blocks visible light in a pixel (subpixel) can be used as the reflective region 92, so that the non-display region 93 between adjacent subpixels can be extremely narrowed. For example, the distance between the pixel electrodes 111 or the width of the non-display region 93 can be equal to the minimum feature size. The width of the non-display region 93 can be narrowed as much as possible in accordance with the degree of an alignment margin. For example, the width of the non-display region 93 can be determined in accordance with the degree of the alignment margin of the reflective layer 116 and the pixel electrode 111. The width of the non-display region 93 may be smaller than the minimum feature size.

By narrowing the non-display region 93, a large number of pixels (subpixels) can be provided in the display portion 62. Furthermore, the aperture ratio of the pixel can be increased. Moreover, the degree of freedom in pixel layout can be increased.

The reflective region can be obtained by providing a layer that reflects visible light between the liquid crystal layer and a layer that blocks visible light in a subpixel. For example, the reflective region 92 can be provided to overlap with one or more of the gate, the semiconductor layer, a source electrode, and a drain electrode of the transistor. Furthermore, the reflective region 92 can be provided to overlap with one or more of a wiring and an electrode in a pixel and a wiring (e.g., a signal line, a scan line, and a power supply line) connected to the pixel. In the case where an electrical element such as a capacitor is included in the pixel, the reflective region 92 can be provided to overlap with an electrode of the electrical element.

The common electrode 112 illustrated in FIG. 1A has a top-surface shape (also referred to as a planar shape) that has a comb-like shape, or that is provided with a slit. The insulating layer 220 is provided between the pixel electrode 111 and the common electrode 112. The pixel electrode 111 includes a portion that overlaps the common electrode 112 with the insulating layer 220 provided therebetween. Furthermore, the common electrode 112 is not placed above the pixel electrode 111 in some areas of a region where the pixel electrode 111 and the coloring layer 131 overlap.

The pixel electrode and the common electrode included in the liquid crystal element 40 do not necessarily have a flat-plate like shape and may have a variety of opening patterns (also referred to as a slit) or a comb-like shape including a bending portion or a branching portion.

An alignment film is preferably provided in contact with the liquid crystal layer 113. The alignment film can control the alignment of the liquid crystal layer 113. In the display device 105, the alignment film 133a is positioned between the common electrode 112 (or the insulating layer 220) and the liquid crystal layer 113, and the alignment film 133b is positioned between the overcoat 121 and the liquid crystal layer 113.

The pixel electrode 111 is embedded into the insulating layer 211. The surface of the pixel electrode 111 on the liquid crystal layer 113 side can form the same surface (or the same plane) with the surface of the insulating layer 211 on the liquid crystal layer 113 side. That is, the surface of the pixel electrode 111 on the liquid crystal layer 113 side and the surface of the insulating layer 211 on the liquid crystal layer 113 side are positioned on the same plane, are in contact with the same plane, have no step differences in their boundaries, or have the same height, for example.

A cross-sectional view of the liquid crystal layer 113 and its surroundings in the display portion 62 is shown in FIG. 1B. As illustrated in FIG. 1B, the common electrode 112 is embedded into the insulating layer 220. The surface of the common electrode 112 on the liquid crystal layer 113 side can form the same surface (or the same plane) with the surface of the insulating layer 220 on the liquid crystal layer 113 side. That is, the surface of the common electrode 112 on the liquid crystal layer 113 side and the surface of the insulating layer 220 on the liquid crystal layer 113 side are positioned on the same plane, are in contact with the same plane, have no substantial step differences in their boundaries, or have the same height, for example. Furthermore, the alignment film 133a is provided flatly.

In FIG. 1C, the common electrode 112 is provided above the surface of the insulating layer 220 on the liquid crystal layer 113 side. The alignment film 133a has an uneven surface (see the frames in the dashed-dotted lines) that reflects the thickness of the common electrode 112. This can lead to variation in the thickness (also referred to as a cell gap) of the liquid crystal layer 113 in the display portion 62, which inhibits favorable display of images.

Furthermore, near the edge of the common electrode 112, the initial alignment of the liquid crystal layer 113 is more prone to variation due to the uneven surface of the alignment film 133a in some cases. The contrast of the display device degrades in some cases, when regions of the liquid crystal layer 113 that are more prone to initial alignment variation are used for the display of images. Furthermore, in the case where the region more prone to initial alignment variation exist between two adjacent subpixels, the degradation in contrast can be reduced by covering the region with a light-blocking layer and the like. However, this can reduce the aperture ratio.

As illustrated in FIGS. 1A and 1B, when the surface of the common electrode 112 on the liquid crystal layer 113 side and the surface of the insulating layer 220 on the liquid crystal layer 113 side form the same surface, the spacing between the alignment films 133a and 133b can be made uniform within the display portion 62. That is, the thickness of the common electrode 112 does not affect the thickness of the liquid crystal layer 113. The thickness of the liquid crystal layer 113 becomes constant within the display portion 62. From the above, the display device 105 can display high-quality images with high color reproducibility.

Furthermore, by providing the alignment film 133a flatly, the initial alignment can be made uniform more easily, even near the edge of the common electrode 112. Providing the alignment film 133a flatly can reduce the generation of the region prone to the initial alignment variation of the liquid crystal layer 113 between two adjacent subpixels. Thus, the aperture ratio of the display device can be increased, and the display device can easily achieve a high resolution.

As described above, the display device according to one embodiment of the present invention can reduce the step difference generated near the edge of the common electrode 112, leading to less alignment defects due to the step difference.

A conductive material that transmits visible light is used for both the pixel electrode 111 and the common electrode 112.

For example, a material containing one or more of indium (In), zinc (Zn), and tin (Sn) is preferably used for the conductive material that transmits visible light. Specifically, indium oxide, indium tin oxide (ITO), indium zinc oxide, indium oxide containing tungsten oxide, indium zinc oxide containing tungsten oxide, indium oxide containing titanium oxide, indium tin oxide containing titanium oxide, indium tin oxide containing silicon oxide (ITSO), zinc oxide, and zinc oxide containing gallium are given, for example. Note that a film including graphene can be used as well. The film including graphene can be formed, for example, by reducing a film containing graphene oxide.

Preferably, at least one of the pixel electrode 111 or the common electrode 112 includes an oxide conductive layer. The oxide conductive layer preferably includes one or more metal elements that are included in the semiconductor layer of the transistor 206. For example, the pixel electrode 111 preferably contains indium and is further preferably the In-M-Zn oxide (M is Al, Ti, Ge, Ga, Y, Zr, La, Ce, Sn, Mg, Nd, or Hf) film. Similarly, the common electrode 112 preferably contains indium and is further preferably the In-M-Zn oxide film.

At least one of the pixel electrode 111 and the common electrode 112 may be formed with an oxide semiconductor. When two or more layers constituting the display device are formed using oxide semiconductors containing the same metal element, the same manufacturing equipment (e.g., film-formation equipment or processing equipment) can be used in two or more steps; manufacturing cost can thus be reduced.

Oxides are preferably used in both the pixel electrode 111 and the semiconductor layer. For example, when a non-oxide material (e.g., a metal) is used for one of the components above and an oxide is used for the other component, a contact resistance between the pixel electrode 111 and the semiconductor layer may increase due to the oxidation of the non-oxide material. By using an oxide for both the pixel electrode 111 and the semiconductor layer, the contact resistance is reduced, and the display device 105 can be made more reliable.

When the pixel electrode 111 and the semiconductor layer include an oxide semiconductor with a common metal element, the adhesion between the pixel electrode 111 and the low-resistance region 231b of the semiconductor layer can be reinforced in some cases.

An oxide semiconductor is a semiconductor material whose resistance can be controlled by oxygen vacancies in the film of the semiconductor material and/or the concentration of impurities such as hydrogen or water in the film of the semiconductor material. Thus, the resistivity of the oxide conductive layer can be controlled by selecting between treatment for increasing oxygen vacancies and/or impurity concentration on the oxide semiconductor layer, or treatment for reducing oxygen vacancies and/or impurity concentration on the oxide semiconductor layer.

Note that such an oxide conductive layer formed using an oxide semiconductor layer can be referred to as an oxide semiconductor layer having a high carrier density and a low resistance, an oxide semiconductor layer having conductivity, or an oxide semiconductor layer having high conductivity.

In addition, the manufacturing cost can be reduced by forming the oxide semiconductor layer and the oxide conductive layer using the same metal element. For example, the manufacturing cost can be reduced by using a metal oxide target with the same metal composition. By using the metal oxide target with the same metal composition, an etching gas or an etchant used in the processing of the oxide semiconductor layer can also be used for processing of the oxide conductive layer. Note that even when the oxide semiconductor layer and the oxide conductive layer have the same metal elements, their composition of the metal elements are different in some cases. For example, metal elements in the film can desorb during the fabrication process of the display device, which results in a different metal composition.

For example, when a silicon nitride film containing hydrogen is used for the insulating layer 211, and an oxide semiconductor is used for the pixel electrode 111, the conductivity of the oxide semiconductor can be increased by the hydrogen that is supplied from the insulating layer 211.

For example, when a silicon nitride film containing hydrogen is used for the insulating layer 220, and an oxide semiconductor is used for the pixel electrode 112, the conductivity of the oxide semiconductor can be increased by the hydrogen that is supplied from the insulating layer 220.

In the display device 105, the coloring layer 131 is provided in a portion closer to the substrate 61 than the liquid crystal layer 113. The coloring layer 131 is positioned at least in a portion overlapping with the transmissive region 91. In the case where the coloring layer 131 is located also in a portion overlapping with the reflective region 92, full-color display can be performed using the reflective region 92. In the case where the coloring layer 131 is not provided in the reflective region 92, monochrome display can be performed using the reflective region 92. A light-blocking layer may be provided between the transmissive region 91 and the reflective region 92 and in the non-display region 93.

The overcoat 121 is preferably provided between the coloring layer 131 and the liquid crystal layer 113. The overcoat 121 can reduce the diffusion of an impurity contained in the coloring layer 131 and the like into the liquid crystal layer 113.

The spacer 117 has a function of keeping the distance between the substrate 51 and the substrate 61 greater than or equal to a certain distance.

In the example shown in FIG. 1A, the bottom surface of the spacer 117 is in contact with the overcoat 121; however, one embodiment of the present invention is not limited thereto. The spacer 117 may be provided on the substrate 51 side, or the substrate 61 side.

In the example shown in FIG. 1A, the alignment films 133a and 133b are in contact with each other in a region where the alignment films 133a and 133b overlap with the spacer 117; however, the alignment films 133a and 133b are not necessarily in contact with each other. Furthermore, the spacer 117 provided over one substrate may be, but is not necessarily, in contact with a structure provided over the other. For example, the liquid crystal layer 113 may be positioned between the spacer 117 and the structure.

A particulate spacer may be used as the spacer 117. As the particulate spacer, materials such as silica can be used. The spacer is preferably made of a material with elasticity, such as a resin or rubber. In this case, the particulate spacer may take a shape that is vertically crushed.

The substrates 51 and 61 are bonded to each other by the adhesion layer 141. The liquid crystal layer 113 is encapsulated in a region that is surrounded by the substrates 51 and 61, and the adhesion layer 141.

In the display device 105, two polarizers are positioned in a way that the display portion 62 is sandwiched by the two polarizers. FIG. 1A illustrates the polarizer 130 on the substrate 61 side. The light 45 emitted from the backlight provided in a position closer to the outside than the polarizing plate on the substrate 51 side enters the transmissive region 91 through the polarizing plate. The external light 46 incident from the substrate 61 side enters the reflective region 92 through the polarizer 130 and is reflected by the reflective layer 116. In this case, the optical modulation of the light can be controlled by controlling the alignment of the liquid crystal layer 113 with a voltage supplied between the pixel electrode 111 and the common electrode 112. That is, the intensity of light that is ejected through the polarizer 130 can be controlled. Furthermore, the coloring layer 131 absorbs light of wavelengths other than a specific wavelength range from the incident light. As a result, the ejected light is light that exhibits red, blue, or green colors, for example.

Furthermore, in addition to a polarizer, an circular polarizer can be used, for example. An example of a circular polarizer includes a polarizer which is formed by stacking a linear polarizer and a quarter-wave retardation film. The circular polarizer can reduce the viewing angle dependence of the display quality of the display device.

Note that the liquid crystal element 40 is an element using an FFS mode here; however, one embodiment of the present invention is not limited thereto, and a liquid crystal element using any of a variety of modes can be used. For example, a liquid crystal element using a vertical alignment (VA) mode, a twisted nematic (TN) mode, an in-plane switching (IPS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

Furthermore, the display device 105 may be a normally black liquid crystal display device, for example, a liquid crystal display device using a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element is an element that controls transmission and non-transmission of light by optical modulation action of the liquid crystal. The optical modulation action of a liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode and design to be used.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is preferably used for the liquid crystal layer 113 in order to improve the temperature range. The liquid crystal composition which includes a liquid crystal exhibiting a blue phase and a chiral material has a short response time and exhibits optical isotropy, which makes the alignment process unnecessary. In addition, the liquid crystal composition which includes liquid crystal exhibiting a blue phase and a chiral material has little viewing angle dependence. In addition, since an alignment film does not need to be provided and rubbing treatment is unnecessary, electrostatic discharge damage caused by the rubbing treatment can be prevented and defects or damage of the display device in the manufacturing process can be reduced.

The driver circuit portion 64 includes the transistor 201.

The transistor 201 includes the gate 221, the gate insulating layer 213, the semiconductor layer (the channel region 231a and the pair of low-resistance regions 231b), a conductive layer 222a, and a conductive layer 222b. One of the conductive layers 222a and 222b functions as a source, and the other functions as a drain. The conductive layers 222a and 222b are electrically connected to the low-resistance regions 231b.

In the connection portion 204, the wiring 65 and a conductive layer 255 are connected to each other, the conductive layer 255 and a conductive layer 253 are connected to each other, and the conductive layer 253 and a conductive layer 251 are connected to each other. The conductive layer 251 and a connector 242 are connected to each other. That is, the connection portion 204 is electrically connected to the FPC 72 through the connector 242. By employing this configuration, signals and power can be supplied from the FPC 72 to the wiring 65.

The wiring 65 can be formed with the same material and the same fabrication step as those used in the conductive layer 222 that is included in the transistor 206. The conductive layer 255 can be formed with the same material and the same fabrication step as those used in the low-resistance region 231b that is included in the semiconductor layer. The conductive layer 253 can be formed with the same material and the same fabrication step as those used in the pixel electrode 111 that is included in the liquid crystal element 40. The conductive layer 251 can be formed with the same material and the same fabrication step as those used in the common electrode 112 that is included in the liquid crystal element 40. Fabricating the conductive layers constituting the connection portion 204 in such a manner, i.e., using the same materials and the same fabrication processes as those used in the conductive layers composing the display portion 62 and the driver circuit portion 64, is preferable because this can reduce the number of process steps.

The transistors 201 and 206 may or may not have the same structure. That is, the transistors included in the driver circuit portion 64 and the transistors included in the display portion 62 may or may not have the same structure. In addition, the driver circuit portion 64 may have a plurality of transistors with different structures, and the display portion 62 may have a plurality of transistors with different structures. For example, a transistor including two gates that are electrically connected to each other is preferably used for one or more of a shift register circuit, a buffer circuit, and a protection circuit included in a scan line driver circuit.

Figure 3A:
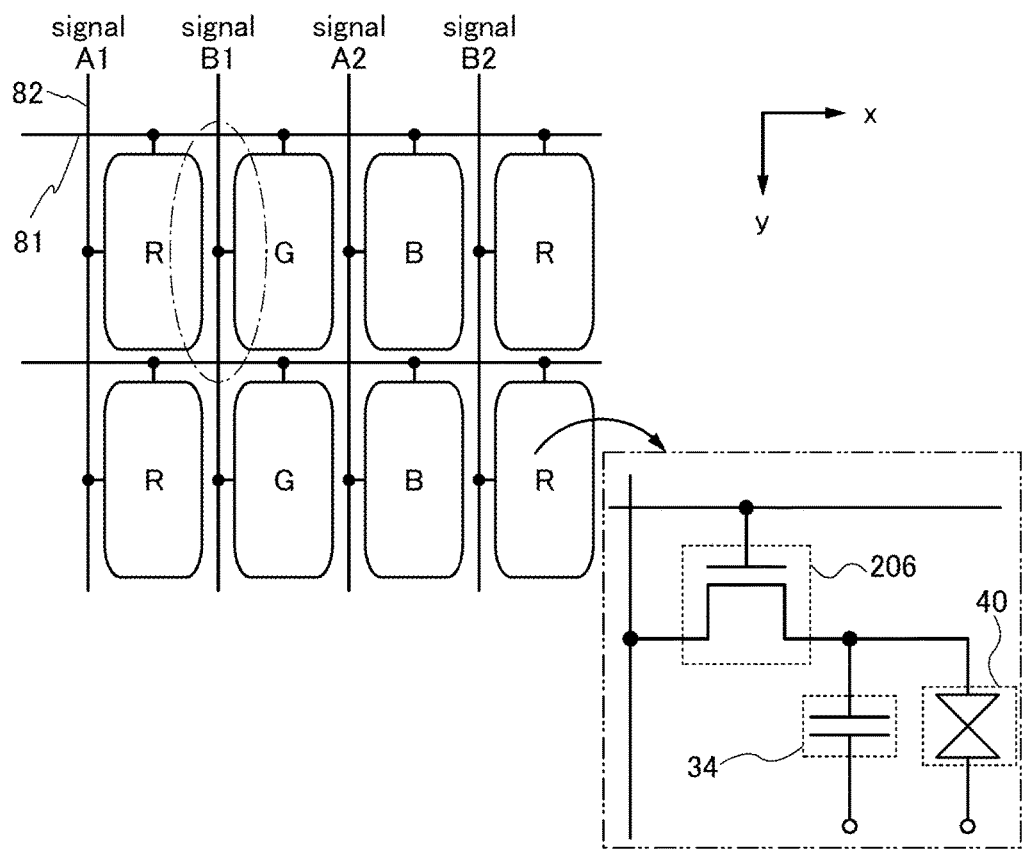
FIGS. 3A and 3B show layout examples and structure examples of pixels.
Figure 3B:
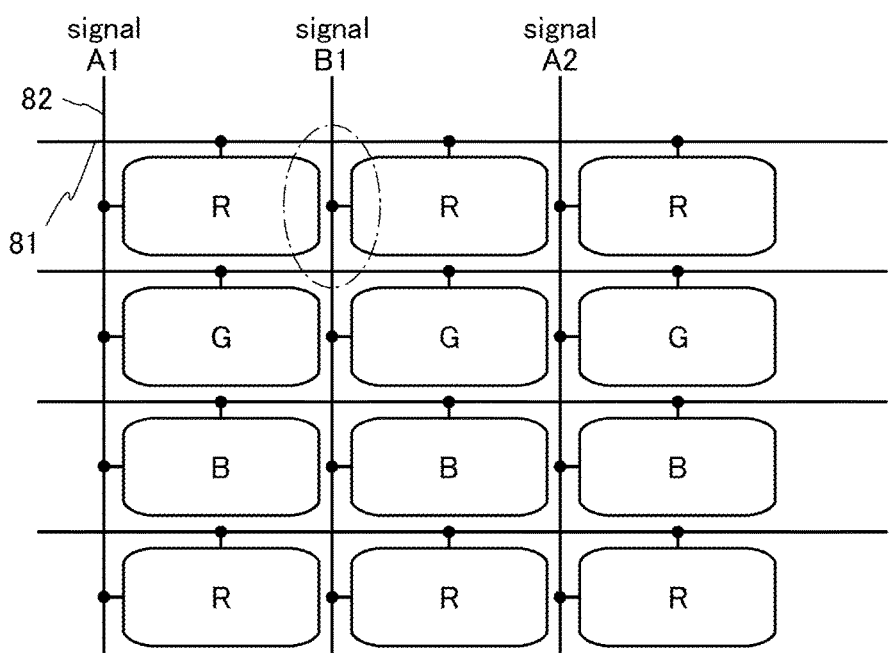

The pixel arrangement examples are shown in FIGS. 3A and 3B. FIGS. 3A and 3B show examples in which one pixel is composed of a red subpixel R, a green subpixel G, and a blue subpixel B. In FIGS. 3A and 3B, a plurality of scan lines 81 extend in the x direction, and a plurality of signal lines 82 extend in the y direction. The scan lines 81 and the signal lines 82 intersect with each other.

As shown by the dashed two dotted line in FIG. 3A, a subpixel includes the transistor 206, a capacitor 34, and the liquid crystal element 40. The gate of the transistor 206 is electrically connected to the scan line 81. One of the source and the drain of the transistor 206 is electrically connected to the signal line 82, and the other is electrically connected to one electrode of the capacitor 34 and one electrode of the liquid crystal element 40. The other electrode of the capacitor 34 and the other electrode of the liquid crystal element 40 are each supplied with a constant potential.

Examples of a driving method of a liquid crystal display device include the following: frame inversion driving, where the polarity of the signals are inverted frame by frame; gate-line inversion driving, where the polarity of the signals are inverted row by row; source-line inversion driving, where the polarity of the signals are inverted column by column; and dot-line inversion driving, where the polarity of the signals are inverted column by column and row by row. The burn-in of the images can be prevented by inverting the polarity of the signals using these driving methods.

FIGS. 3A and 3B show examples where the source-line inversion driving is adopted. Signals A1 and A2 are signals with the same polarity. Signals B1 and B2 are signals with the same polarity. Signals A1 and B1 are signals with different polarities. Signals A2 and B2 are signals with different polarities.

As the resolution of the display device become higher, the distance between the subpixels become shorter. Thus, as shown in the frame outlined in a dashed-dotted line in FIG. 3A, in the subpixel where the signal A1 is input, the liquid crystal is prone to the effects caused by potentials in both the signal A1 and the signal B1, in the vicinities of the signal line 82 where the signal B1 is input. This can make the liquid crystal more prone to alignment defects.

In FIG. 3A, the direction in which a plurality of subpixels exhibiting the same color are aligned is the y direction, and is substantially parallel to the direction that the signal lines 82 extend in. As shown in the frame outlined by a dashed-dotted line in FIG. 3A, subpixels exhibiting different colors are adjacent to each other, with the longer sides of the subpixels facing each other.

In FIG. 3B, the direction in which the plurality of subpixels exhibiting the same color are aligned is the x direction, and intersects with the direction that the signal lines 82 extend in. As shown in the frame outlined in a dashed-dotted line in FIG. 3B, subpixels exhibiting the same color are adjacent to each other, with the shorter sides of the subpixels facing each other.

When the side of the subpixel that is substantially parallel to the direction in which the signal lines 82 extend is the shorter sides of the subpixel as illustrated in FIG. 3B, the region where the liquid crystal is more prone to alignment defects can be made narrower, compared with the case (illustrated in FIG. 3A) where the side of the subpixel that is substantially parallel to the direction in which the signal lines 82 extend is the longer sides of the subpixel. When the region where the liquid crystal is more prone to alignment defects is positioned between subpixels exhibiting the same color as illustrated in FIG. 3B, display defects are less easily recognized by a user of the display device when compared with the case (see FIG. 3A) where the region is positioned between subpixels exhibiting different colors.

Therefore, in one embodiment of the present invention, the direction in which the plurality of subpixels exhibiting the same color are arranged preferably intersects with the direction that the signal lines 82 extend in.

Figure 4A:
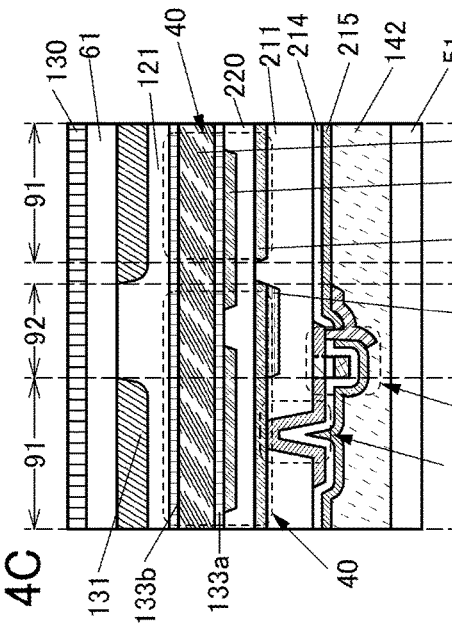
FIGS. 4A to 4D are cross-sectional views showing examples of a display device.
Figure 4C:
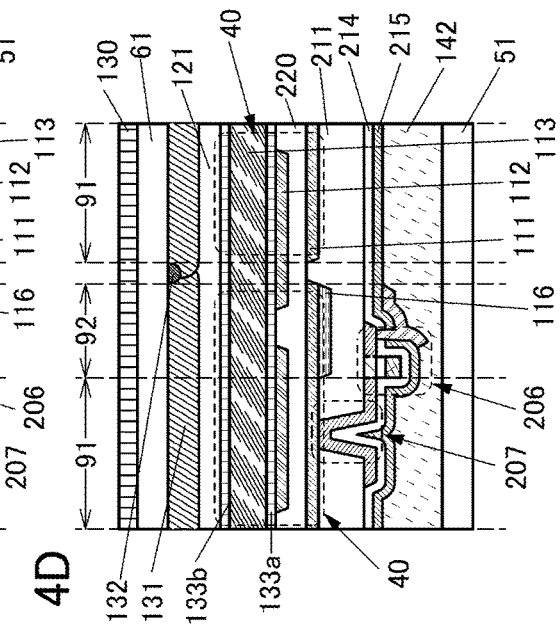
Figure 4B:
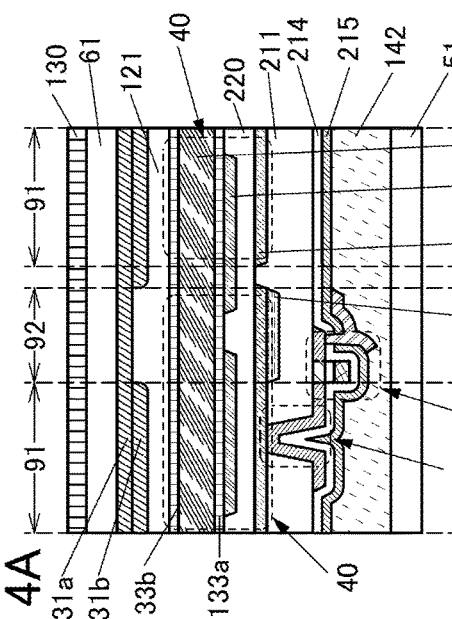

FIGS. 4A and 4B show examples in each of which a thickness of the coloring layer in the transmissive region 91 is different from a thickness of the coloring layer in the reflective region 92.

In the reflective region 92, light passes through the coloring layer twice. In contrast, in the transmissive region 91, light passes through the coloring layer only once. Therefore, in the case where the coloring layer has the same thickness in the transmissive region 91 and the reflective region 92, there is a possibility that the color tone of display varies.

In FIGS. 4A and 4B, the thickness of the coloring layer in the reflective region 92 is smaller than the thickness of the coloring layer in the transmissive region 91. Thus, display with excellent color tone can be achieved in both of the transmissive region 91 and the reflective region 92. Moreover, color unevenness in the display can be reduced.

The thickness of the coloring layer in the reflective region 92 is preferably greater than or equal to 40% and less than or equal to 60% of the thickness of the coloring layer in the transmissive region 91.

In FIG. 4A, the transmissive region 91 includes a stack of a coloring layer 131a and a coloring layer 131b, and the reflective region 92 includes only the coloring layer 131a. In the case where the coloring layer is separated into two or more layers in this manner, a thickness of the coloring layer in the transmissive region 91 can be made different from a thickness of the coloring layer in the reflective region 92.

In FIG. 4B, a thickness of the coloring layer 131 in the transmissive region 91 is different from a thickness of the coloring layer 131 in the reflective region 92. With the use of, for example, a multi-tone mask (a gray tone mask or a half tone mask), the thickness of the coloring layer 131 in the transmissive region 91 can be made different from the thickness of the coloring layer 131 in the reflective region 92.

In the example shown in FIG. 4C, the coloring layer 131 is not provided in the reflective region 92. In the case where only monochrome display is performed in the reflective region 92, the coloring layer 131 is not necessarily provided in the reflective region 92.

Figure 4D:
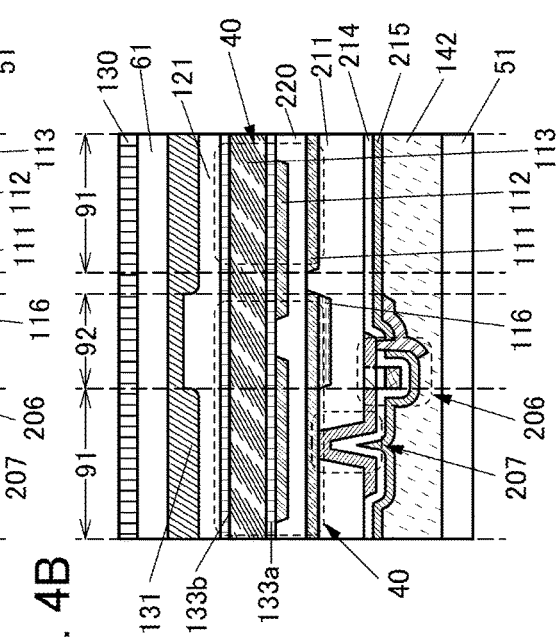

In the example shown in FIG. 4D, a light-blocking layer 132 is provided between adjacent coloring layers 131. The light-blocking layer 132 is preferably provided between subpixels exhibiting different colors. The light-blocking layer 132 may be provided between subpixels exhibiting the same color. In the display portion 62, a portion where the light-blocking layer 132 is provided can be called "non-display region 93". The light-blocking layer 132 is provided on the substrate 61 side.

FIGS. 5A to 5C show examples in each of which a gap adjusting film 134 is provided in the reflective region 92.

A polarization state of light is changed depending on a traveling distance of light in the liquid crystal layer 113 because the liquid crystal layer 113 has refractive index anisotropy. In the reflective region 92, light passes through the liquid crystal layer 113 twice. In contrast, in the transmissive region 91, light passes through the liquid crystal layer 113 only once. Therefore, in the case where the liquid crystal layer 113 has the same thickness in the transmissive region 91 and the reflective region 92, there is a possibility that excellent display cannot be performed in one of the regions.

In the case where the gap adjusting film 134 is provided in the reflective region 92, a thickness of the liquid crystal layer 113 in the transmissive region 91 can be larger than a thickness of the liquid crystal layer 113 in the reflective region 92, whereby the transmissive region 91 and the reflective region 92 can have the same optical distance. Thus, excellent display can be performed in both of the transmissive region 91 and the reflective region 92.

The gap adjusting film 134 can be formed using a material that transmits visible light. For example, an organic material such as acrylic or polyimide can be used for forming the gap adjusting film 134.

The gap adjusting film 134 is preferably provided on the substrate 61 side, in which case the gap adjusting film 134 can be formed easily. The order of formation of the gap adjusting film 134 relative to the coloring layer 131, the light-blocking layer 132, and the overcoat 121 is not limited in particular.

In FIGS. 5A and 5B, the gap adjusting film 134 is positioned between the substrate 61 and the coloring layer 131. In FIG. 5C, the gap adjusting film 134 is positioned between the overcoat 121 and the alignment film 133b.

Because of the gap adjusting film 134, a center portion and an end portion of the transmissive region 91 or the reflective region 92 have a difference in the thickness of the liquid crystal layer 113 in some cases. The difference in the thickness of the liquid crystal layer 113 may result in a variation in the initial alignment of liquid crystals, so that display failure may occur. In FIG. 5C, the light-blocking layer 132 is provided at the boundary between the transmissive region 91 and the reflective region 92. In this structure, a region different from the other region in the thickness of the liquid crystal layer 113 does not contribute to display, and thus, display failure can be prevented.

The thickness of the liquid crystal layer 113 in the reflective region 92 is preferably greater than or equal to 40% and less than or equal to 60% of the thickness of the liquid crystal layer 113 in the transmissive region 91.

In the examples shown in FIG. 1A and other drawings, an entire surface of the reflective layer 116 overlaps with the pixel electrode 111. In contrast, the reflective layer 116 may partly overlap with the pixel electrode 111 as shown in FIGS. 5A and 5B. In the example shown in FIG. 5A, the reflective layer 116 is positioned closer to the liquid crystal layer 113 than the pixel electrode 111. In the example shown in FIG. 5B, the pixel electrode 111 is provided in a position closer to the liquid crystal layer 113 than the reflective layer 116. In FIGS. 5A and 5B, the reflective layer 116 is electrically connected to the pixel electrode 111. That is, the reflective layer 116 can serve as a pixel electrode in the reflective region 92. Thus, a portion without the pixel electrode 111 in the reflective region 92 can also be used to perform display.

FIGS. 6A and 6B each show a structure in which the semiconductor layer is formed using a material that blocks visible light.

In the case where the semiconductor layer is formed using a material that blocks visible light, a portion overlapping with the semiconductor layer is preferably used as the reflective region 92.

In FIG. 6A, the low-resistance region of the semiconductor layer is directly connected to the pixel electrode 111, and the pixel electrode 111 is directly connected to the reflective layer 116. The reflective layer 116 is positioned between the semiconductor layer and the liquid crystal layer 113. The pixel electrode 111 extends to be in the transmissive region 91.

In FIG. 6B, the low-resistance region of the semiconductor layer is directly connected to the reflective layer 116, and the conductive layer 106 that transmits visible light is directly connected to the reflective layer 116. In FIG. 6B, the reflective layer 116 serves as a pixel electrode. The conductive layer 106 that transmits visible light is electrically connected to the reflective layer 116. The conductive layer 106 that transmits visible light can also serve as a pixel electrode.

In the case where the semiconductor layer is formed using a material that blocks visible light or a material that partly absorbs visible light, a contact area where the pixel electrode is in contact with the transistor is preferably included in the reflective region. By providing the contact area in a portion that contributes to display, the aperture ratio of the display device can be increased. Furthermore, the resolution of the display device can be increased.

Next, the details of the materials that can be used for components of the display device of this embodiment and the like are described. Note that description on the components already described is omitted in some cases. The materials described below can be used as appropriate in the display device, the touch panel, and the components thereof described later.

<<Substrates 51 and 61>>

There are no large limitations on the material of the substrate used in the display device of one embodiment of the present invention; a variety of substrates can be used. For example, a glass substrate, a quartz substrate, a sapphire substrate, a semiconductor substrate, a ceramic substrate, a metal substrate, a plastic substrate or the like can be used.

The weight and thickness of the display device can be reduced by using a thin substrate. Furthermore, a flexible display device can be obtained by using a substrate that is thin enough to have flexibility.

The display device of one embodiment of the present invention is fabricated by forming a transistor and the like over the fabrication substrate, then transferring the transistor and the like on another substrate. The use of the fabrication substrate enables the following: a formation of a transistor with favorable characteristics; a formation of a transistor with low power consumption; a manufacturing of a durable display device, an addition of heat resistance to the display device, a manufacturing of a more lightweight display device, or a manufacturing of a thinner display device. Examples of a substrate to which a transistor is transferred include, in addition to the substrate over which the transistor can be formed, a paper substrate, a cellophane substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), and the like), a leather substrate, a rubber substrate, and the like.

<<Transistors 201 and 206>>

A transistor included in the display device of one embodiment of the present invention may have a top-gate structure or a bottom-gate structure. Gate electrodes may be provided above and below a channel. A semiconductor material used in the transistor is not particularly limited, and an oxide semiconductor, silicon, or germanium can be used, for example.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. The use of a semiconductor having crystallinity is preferable as the degradation of a transistor's characteristics can be reduced.

For example, a Group 14 element, a compound semiconductor, or an oxide semiconductor can be used for the semiconductor layer. Typically, a semiconductor including silicon, a semiconductor including gallium arsenide or an oxide semiconductor including indium can be used for the semiconductor layer.

An oxide semiconductor is preferably used for the semiconductor in which the channel of a transistor is formed. In particular, using an oxide semiconductor with a larger bandgap than that of silicon is preferable. The use of a semiconductor material with a larger bandgap than that of silicon and a small carrier density is preferable because the current during the off state (off-state current) of the transistor can be reduced.

The oxide semiconductor preferably contains at least indium (In) or zinc (Zn), for example. The oxide semiconductor further preferably contains an In-M-Zn oxide (M is a metal such as Al, Ti, Ga, Ge, Y, Zr, La, Ce, Nd, Sn, or Hf).

As the semiconductor layer, it is preferable to use an oxide semiconductor layer including a plurality of crystal portions in which the c-axes of the crystal portions are oriented substantially perpendicular to a surface on which the semiconductor layer is formed or the top surface of the semiconductor layer, and adjacent crystal portions have no grain boundary.

The use of such an oxide semiconductor for the semiconductor layer makes it possible to provide a highly reliable transistor in which a change in the electrical characteristics is reduced.

Charge accumulated in a capacitor through the transistor can be retained for a long time because of low off-state current of the transistor. The use of such a transistor in pixels allows a driver circuit to stop while the gray level of an image displayed on display regions of the pixels is maintained. As a result, a display device with extremely low power consumption is obtained.

The transistors 201 and 206 preferably include an oxide semiconductor layer that is highly purified to reduce the formation of oxygen vacancies. Accordingly, the off-state current of the transistor can be made small. Accordingly, an electrical signal such as an image signal can be held for a long period, and a writing interval can be set long in an on state. Accordingly, the frequency of refresh operation can be reduced, which leads to an effect of reducing power consumption.

In the transistors 201 and 206, relatively high field-effect mobility can be obtained, whereby high-speed operation is possible. The use of such transistors that are capable of high-speed operation in the display device enables the fabrication of the transistor in the display region and the transistors in the driver circuit portion over the same substrate. This means that a semiconductor device separately formed with a silicon wafer or the like does not need to be used as the driver circuit, which enables a reduction of the number of components in the display device. In addition, using the transistor that can operate at high speed in the display region also can enable the provision of a high-quality image.

<<Oxide Semiconductor Layer>>

The oxide semiconductor layer preferably includes a film represented by an In-M-Zn oxide that contains at least indium (In), zinc (Zn), and M (a metal such as Al, Ti, Ga, Ge, Y, Zr, La, Ce, Nd, Sn, or Hf). In order to reduce variations in electrical characteristics of the transistor including the oxide semiconductor, the oxide semiconductor preferably contains a stabilizer in addition to the In-M-Zn oxide.

Examples of the stabilizer, including metals that can be used as M, are gallium (Ga), tin (Sn), hafnium (Hf), aluminum (Al), zirconium (Zr) and the like. As another stabilizer, lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) can be used.

As an oxide semiconductor included in an oxide semiconductor layer, any of the followings can be used, for example: an In—Ga-based oxide, an In—Zn-based oxide, an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. Further, a metal element in addition to In, Ga, and Zn may be contained.

Note that in the case where the oxide semiconductor layer includes an In-M-Zn oxide, when the summation of In and M is assumed to be 100 atomic %, the atomic proportions of In and M are preferably higher than 25 atomic % and lower than 75 atomic %, respectively, more preferably higher than 34 atomic % and lower than 66 atomic %, respectively.

The energy gap of the oxide semiconductor layer is 2 eV or more, preferably 2.5 eV or more, more preferably 3 eV or more. The use of such an oxide semiconductor having a wide energy gap leads to a reduction in off-state current of a transistor.

The thickness of the oxide semiconductor layer is greater than or equal to 3 nm and less than or equal to 200 nm, preferably greater than or equal to 3 nm and less than or equal to 100 nm and further preferably greater than or equal to 3 nm and less than or equal to 50 nm.

In the case where the oxide semiconductor layer includes an In-M-Zn oxide (M is Al, Ti, Ga, Ge, Y, Zr, La, Ce, Nd, Sn, or Hf), it is preferable that the atomic ratio of metal elements of a sputtering target used for forming a film of the In-M-Zn oxide satisfy In≥M and Zn≥M. As the atomic ratio of the metal elements of such a sputtering target, In:M:Zn=1:1:1, In:M:Zn=1:1:1.2, In:M:Zn=3:1:2, In:M:Zn=1:3:4, In:M:Zn=1:3:6, and the like are given. Note that the atomic ratio of metal elements in the formed oxide semiconductor layer varies from the above atomic ratio of metal elements of the sputtering target within a range of ±40% as an error.

An oxide semiconductor film with low carrier density is used as the semiconductor layer. For example, an oxide semiconductor film whose carrier density is lower than or equal to $1\times10^{17}/cm^3$, preferably lower than or equal to $1\times10^{15}/cm^3$, more preferably lower than or equal to $1\times10^{13}/cm^3$, more preferably lower than or equal to $1\times10^{11}/cm^3$ is used as the semiconductor layer.

Note that, without limitation to those described above, a material with an appropriate composition can be used depending on required semiconductor characteristics and electrical characteristics (e.g., field-effect mobility and threshold voltage) of the transistor.

When silicon or carbon that is one of elements belonging to Group 14 is contained in the oxide semiconductor layer, oxygen vacancies are increased in the oxide semiconductor layer, and the oxide semiconductor layer becomes an n-type. Thus, the concentration of silicon or carbon (the concentration is measured by SIMS) in the oxide semiconductor layer is lower than or equal to $2\times10^{18}$ atoms/cm$^3$, preferably lower than or equal to $2\times10^{17}$ atoms/cm$^3$.

Further, the concentration of alkali metal or alkaline earth metal of the oxide semiconductor layer, which is measured by SIMS, is lower than or equal to $1\times10^{18}$ atoms/cm$^3$, preferably lower than or equal to $2\times10^{16}$ atoms/cm$^3$. Alkali metal and alkaline earth metal can potentially generate carriers when bonded to an oxide semiconductor, in which case the off-state current of the transistor can potentially be increased. Therefore, it is preferable to reduce the concentration of alkali metal or alkaline earth metal in the semiconductor layer.

When nitrogen is contained in the oxide semiconductor layer, electrons serving as carriers are generated and the carrier density increases, so that the semiconductor layer easily becomes n-type. Thus, a transistor including an oxide semiconductor that contains nitrogen is likely to be normally-on. For this reason, nitrogen in the oxide semiconductor layer is preferably reduced as much as possible; the concentration of nitrogen which is measured by SIMS is preferably set to, for example, lower than or equal to $5\times10^{18}$ atoms/cm$^3$.

The oxide semiconductor layer may have a non-single-crystal structure, for example. The non-single crystal structure includes a c-axis aligned crystalline oxide semiconductor (CAAC-OS), a polycrystalline structure, a microcrystalline structure, or an amorphous structure, for example. Among the non-single crystal structure, the amorphous structure has the highest density of defect states, whereas CAAC-OS has the lowest density of defect states.

The oxide semiconductor layer may have an amorphous structure, for example. An oxide semiconductor layer which has an amorphous structure has a disordered atomic arrangement and no crystalline component, for example. Alternatively, the oxide films having an amorphous structure have, for example, an absolutely amorphous structure and no crystal portion.

Note that the oxide semiconductor layer may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Alternatively, the mixed film may have a stacked structure of two or more of a region having an amorphous structure, a region having a microcrystalline structure, a region having a polycrystalline structure, a CAAC-OS region, and a region having a single-crystal structure.

<<Insulating Layer>>

An organic insulating material or an inorganic insulating material can be used as an insulating material that can be used for the insulating film, the overcoat, the spacer, or the like included in the display device. Examples of an organic insulating material include an acrylic resin, an epoxy resin, a polyimide resin, a polyamide resin, a polyamide-imide resin, a siloxane resin, a benzocyclobutene-based resin, and a phenol resin. Examples of inorganic insulating films include a silicon oxide film, a silicon oxynitride film, a silicon nitride oxide film, a silicon nitride film, an aluminum oxide film, an aluminum nitride film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film.

<<Conductive Layer>>

For the conductive layer such as the gate, the source, and the drain of a transistor and the wiring, and the electrode of the display device, a single-layer structure or a stacked structure using any of metals such as aluminum, titanium, chromium, nickel, copper, yttrium, zirconium, molybdenum, silver, tantalum, and tungsten, or an alloy containing any of these metals as its main component can be used. For example, a two-layer structure in which a titanium film is stacked over an aluminum film; a two-layer structure in which a titanium film is stacked over a tungsten film; a two-layer structure in which a copper film is stacked over a molybdenum film; a two-layer structure in which a copper film is stacked over an alloy film containing molybdenum and tungsten; a two-layer structure in which a copper film is stacked over an alloy film containing copper, magnesium, and aluminum; a three-layer structure in which titanium film or a titanium nitride film, an aluminum film or a copper film, and a titanium film or a titanium nitride film are stacked in this order; a three-layer structure in which a molybdenum film or a molybdenum nitride film, an aluminum film or a copper film, and a molybdenum film or a molybdenum nitride film are stacked in this order; or the like can be employed. For example, in the case where a source electrode 225a and a drain electrode 225b have a three-layer structure, it is preferable that each of the first and third layers be a film formed of titanium, titanium nitride, molybdenum, tungsten, an alloy containing molybdenum and tungsten, an alloy containing molybdenum and zirconium, or molybdenum nitride, and that the second layer be a film formed of a low-resistance material such as copper, aluminum, gold, silver, or an alloy containing copper and manganese. Note that light-transmitting conductive materials such as ITO, indium oxide containing tungsten oxide, indium zinc oxide containing tungsten oxide, indium oxide containing titanium oxide, indium tin oxide containing titanium oxide, indium zinc oxide, or ITSO may be used.

An oxide conductive layer can be formed by controlling the resistivity of the oxide semiconductor.

<<Adhesion Layer 141>>

A curable resin such as a heat-curable resin, a photocurable resin, or a two-component type curable resin can be used for the adhesion layer 141. For example, an acrylic resin, a urethane resin, an epoxy resin, or a siloxane resin or the like can be used.

<<Connector 242>>

As the connector 242, for example, an anisotropic conductive film (ACF), an anisotropic conductive paste (ACP), and the like can be used.

<<Coloring Layer 131>>

The coloring layer 131 is a colored layer that transmits light in a specific wavelength range. Examples of materials that can be used for the coloring layer 131 include a metal material, a resin material, and a resin material containing a pigment or dye.

<<Light-Blocking Layer 132>>

The light-blocking layer 132 is provided between adjacent coloring layers 131. A black matrix formed with, for example, a metal material or a resin material containing a pigment or dye can be used as the light-blocking layer 132. Note that it is preferable to provide the light-blocking layer 132 also in a region other than the display portion 62, such as the driver circuit portion 64, in which case undesired leakage of guided light or the like can be inhibited (see FIG. 7 and the like).

1-2. Structure Example 2 of Display Device

Figure 7:
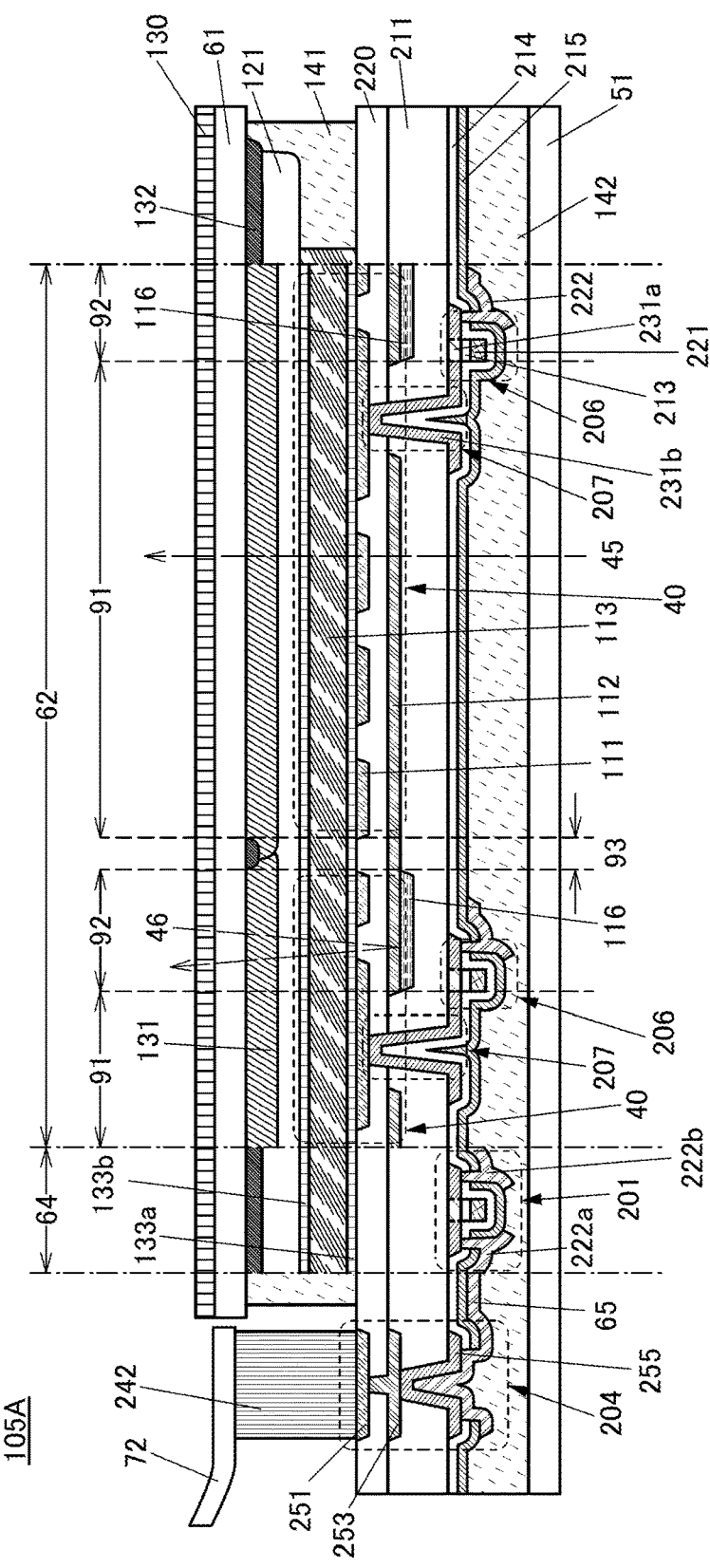
FIG. 7 is a cross-sectional view showing an example of a display device.
Figure 8:
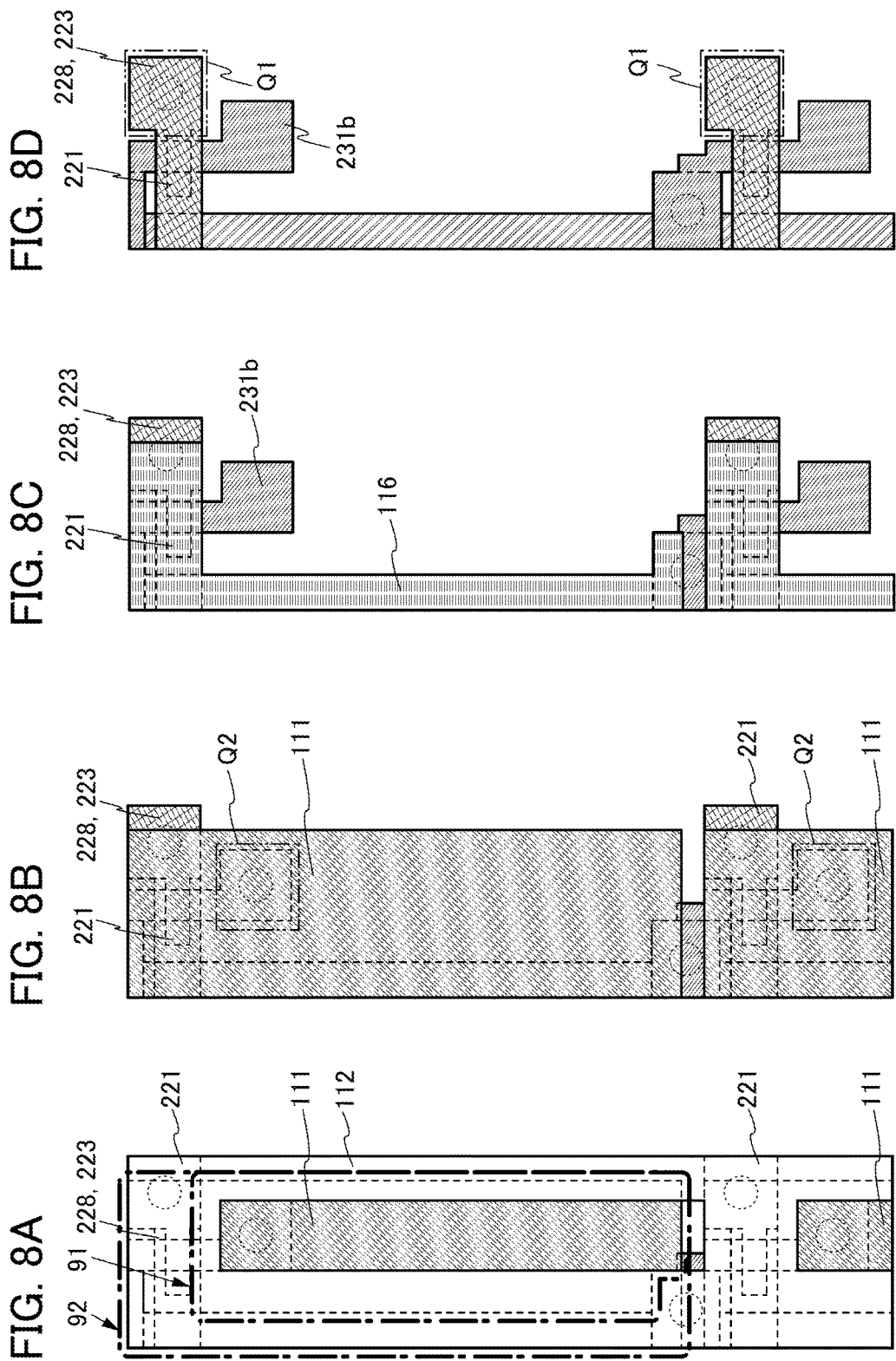
FIGS. 8A to 8D are top views showing an example of a subpixel.
Figure 9:
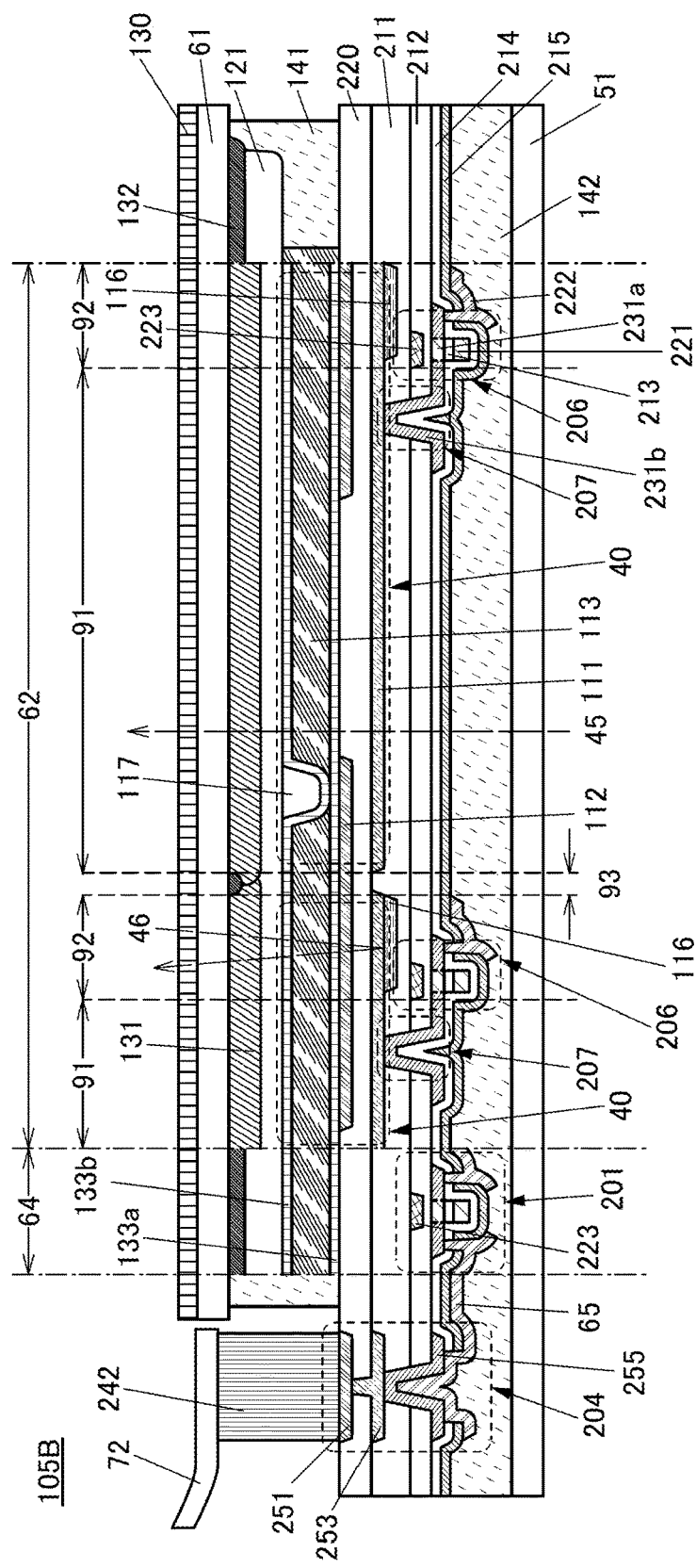
FIG. 9 is a cross-sectional view showing an example of a display device.
Figure 14:
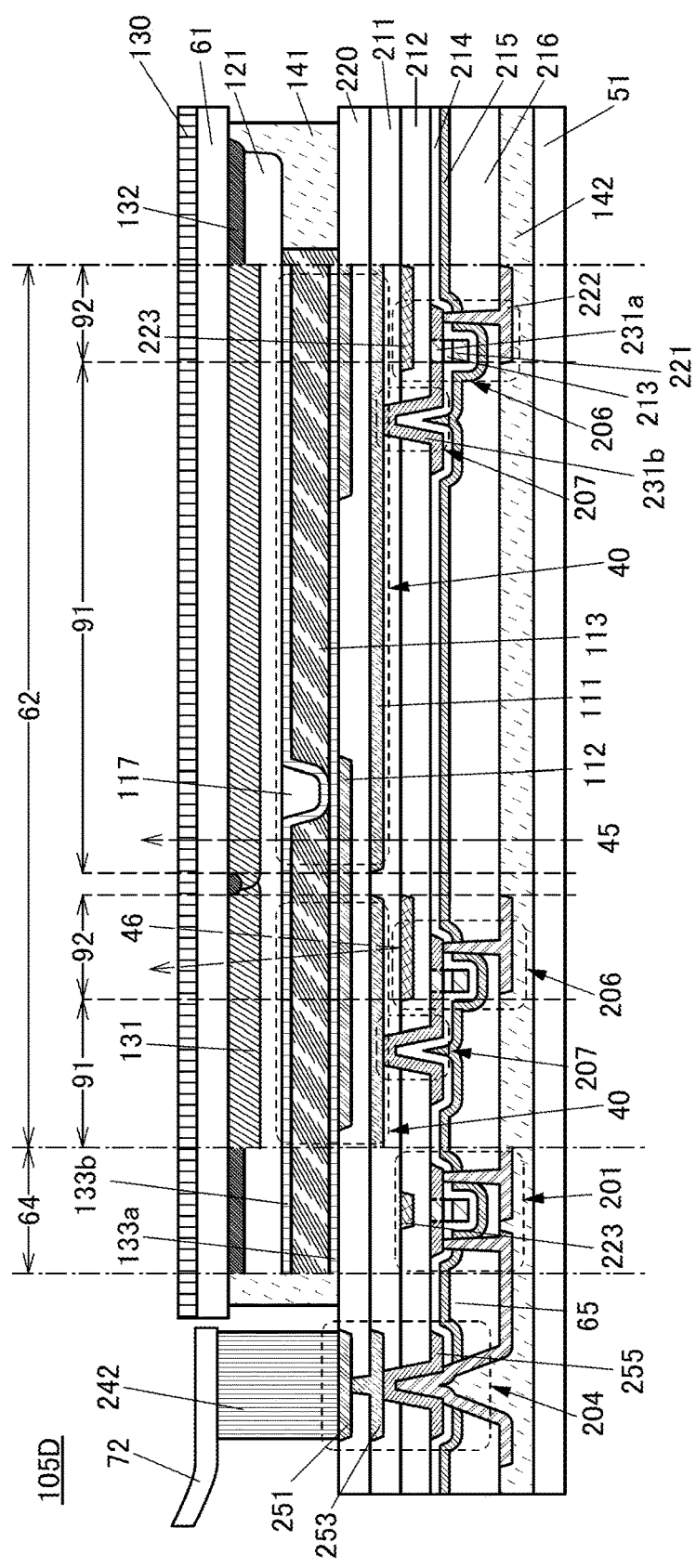
FIG. 14 is a cross-sectional view showing an example of a display device.

FIG. 7 to FIG. 14 show examples of a display device. FIG. 7 is a cross-sectional view of a display device 105A. FIGS. 8A to 8D are top views of a subpixel included in a display device 105B. FIG. 9 is a cross-sectional view of the display device 105B. FIGS. 10A to 10C, FIGS. 11A to 11C, and FIGS. 12A to 12C show modification examples of the top views of the subpixel. FIG. 13A is a cross-sectional view of a display device 105C. FIG. 14 is a cross-sectional view of a display device 105D. Note that perspective views of the display device 105A, the display device 105B, the display device 105C, and the display device 105D are similar to the perspective view of the display device 105 shown in FIGS. 2A to 2C, and therefore, description thereof is omitted here.

The display device 105A illustrated in FIG. 7 is different from the display device 105 described above in the positional relationship between the pixel electrode 111 and the common electrode 112.

The display device 105 illustrated in FIG. 1A or the like has a structure where the alignment film 133a and the common electrode 112 are in contact with each other, while the display device 105A illustrated in FIG. 7 has a structure where the alignment film 133a and the pixel electrode 111 are in contact with each other.

As illustrated in FIG. 7, in the display device 105A, the low-resistance region 231b of the semiconductor layer is in contact with the side surfaces of the opening portions in the insulating layers 211 and 220, and connects with the pixel electrode 111. This enables the pixel electrode 111 to be placed flatly.

In the display device 105A, the common electrode 112 is embedded into the insulating layer 211. The surface of the common electrode 112 on the liquid crystal layer 113 side can form the same surface with the surface of the insulating layer 211 on the liquid crystal layer 113 side.

As shown in FIG. 7, when the surface of the pixel electrode 111 on the liquid crystal layer 113 side and the surface of the insulating layer 220 on the liquid crystal layer 113 side form the same surface, the spacing between the alignment films 133a and 133b can be made uniform within the display portion 62. That is, the thickness of the pixel electrode 111 does not affect the thickness of the liquid crystal layer 113. The thickness of the liquid crystal layer 113 becomes constant within the display portion 62. From the above, the display device 105A can display high-quality images with high color reproducibility.

Furthermore, by providing the alignment film 133a flatly, the initial alignment can be made uniform more easily, even near the edge of the pixel electrode 111. Providing the alignment film 133a flatly can reduce the generation of the region prone to the initial alignment variation of the liquid crystal layer 113 between two adjacent subpixels. Thus, the aperture ratio can be increased, and the display device can easily achieve a high resolution.

In FIG. 7, the reflective layer 116 is provided to overlap with the common electrode 112. The reflective layer 116 is electrically connected to the common electrode 112. In the case where the reflective layer 116 is electrically connected to the common electrode 112, the stacking order of the reflective layer 116 and the common electrode 112 is not limited in particular.

The display device 105A includes the light-blocking layer 132 in the driver circuit portion 64 and the non-display region 93.

FIGS. 8A to 8D are top views of the subpixel included in the display device 105B. FIG. 9 is a cross-sectional view of the display device 105B. FIG. 8A is a top view, seen from the common electrode 112 side, of a stacked structure including the common electrode 112 to the conductive layer 222 in the subpixel of the display device 105B. In FIG. 8A, the transmissive region 91 and the reflective region 92 are shown by dashed-dotted lines. FIG. 8B is a top view obtained by excluding the common electrode 112 from the stacked structure shown in FIG. 8A. FIG. 8C is a top view obtained by excluding the pixel electrode 111 from the stacked structure shown in FIG. 8B. FIG. 8D is a top view obtained by excluding the reflective layer 116 from the stacked structure shown in FIG. 8C.

The display device 105B shown in FIG. 9 includes a light-blocking layer 132, an insulating layer 212, and a gate 223, in addition to the structure of the display device 105 described above.

In a display device of one embodiment of the present invention, a transistor with gate electrodes provided above and below a channel may be used.

In the contact area Q1 illustrated in FIG. 8D, the gates 221 and 223 are electrically connected. A transistor that that has two gates that are electrically connected to each other can have a higher field-effect mobility and thus have higher on-state current than the other transistors. Consequently, a circuit capable of high-speed operation can be obtained. Furthermore, the area occupied by a circuit portion can be reduced. The use of the transistor having a high on-state current can reduce signal delay in wirings and can suppress display unevenness even in a display panel or a display device in which the number of wirings is increased because of an increase in size or resolution. In addition, the use of such a configuration allows fabrication of a highly reliable transistor.

In the contact area Q2 illustrated in FIG. 8B, the low-resistance region 231b of the semiconductor layer is connected to the pixel electrode 111. The use of a material that transmits visible light in the semiconductor layer allows the contact area Q2 to be provided in the transmissive region 91. This can increase the aperture ratio and facilitate the fabrication of a display device with high resolution.

In other words, in FIGS. 8A to 8D, a part of one conductive layer functions as a scan line 228, and another part of the conductive layer functions as the gate 223. One of the gates 221 and 223 that has the lower resistance of the two is preferably the conductive layer that also serves as the scan line.

In other words, in FIGS. 8A to 8D, a part of one conductive layer functions as a signal line 229, and another part of the conductive layer functions as the conductive layer 222.

The gates 221 and 223 can each include a single layer of one of a metal material and an oxide conductor (OC), or stacked layers of both a metal material and an oxide conductor. For example, one of the gates 221 and 223 may include an oxide conductor, and the other of the gates 221 and 223 may include a metal material.

The transistor 206 can be formed to include the oxide semiconductor layer as a semiconductor layer, and include the oxide conductive layer as at least one of the gates 221 and 223. In this case, the oxide semiconductor layer and the oxide conductive layer are preferably formed using an oxide semiconductor.

FIG. 8A and FIG. 9 illustrate an example where one opening is provided in the common electrode 112 in one subpixel. As the resolution of display devices become higher, the area of one pixel becomes smaller. Thus, the number of openings provided in the common electrode 112 is not limited to more than one; one opening can be provided. In a display device with high resolution, the area of the subpixel is small; therefore, an adequate electric field for the alignment of liquid crystals over the entire display region of the subpixel can be generated, even when there is only one opening in the common electrode 112. The opening of the common electrode 112 may be provided in either one of the transmissive region 91 and the reflective region 92 or both.

FIGS. 10A to 10C, FIGS. 11A to 11C, and FIGS. 12A to 12C are modification examples of the top views of the subpixel. FIG. 10A, FIG. 11A, and FIG. 12A are top views, seen from the common electrode 112 side, of a stacked structure (e.g., see FIG. 9) including the common electrode 112 to the conductive layer 222 in a subpixel. In FIG. 10A, FIG. 11A, and FIG. 12A, the transmissive region 91 and the reflective region 92 are shown by dashed-dotted lines. FIG. 10B, FIG. 11B, and FIG. 12B are top views obtained by excluding the common electrode 112 from the stacked structure shown in FIG. 10A, FIG. 11A, and FIG. 12A. FIG. 10C, FIG. 11C, and FIG. 12C are top views obtained by excluding the pixel electrode 111 from the stacked structure shown in FIG. 10B, FIG. 11B, and FIG. 12B.

The pixel electrode 111 and the reflective layer 116 in a subpixel can be provided to overlap with at least one of a transistor included in the subpixel, a transistor included in an adjacent subpixel, and a scan line and a signal line that are electrically connected to the transistors.

In FIGS. 10A to 10C, the pixel electrode 111 and the reflective layer 116 overlap with the signal line 229 (partly serving as the conductive layer 222). A transistor electrically connected to the signal line 229 and the pixel electrode 111 are included in the same subpixel. The pixel electrode 111 and the reflective layer 116 overlap with the scan line 228. A transistor electrically connected to the scan line 228 and the pixel electrode 111 are included in different subpixels. Specifically, the transistor is included in an adjacent subpixel on the lower side of the drawing.

In FIGS. 11A to 11C, the pixel electrode 111 and the reflective layer 116 overlap with the signal line 229. A transistor electrically connected to the signal line 229 and the pixel electrode 111 are included in different subpixels. Specifically, the transistor is included in an adjacent subpixel on the right side of the drawing. The pixel electrode 111 and the reflective layer 116 overlap with the scan line 228. A transistor electrically connected to the scan line 228 and the pixel electrode 111 are included in the same subpixel.

In FIGS. 12A to 12C, the pixel electrode 111 and the reflective layer 116 overlap with the signal line 229. A transistor electrically connected to the signal line 229 and the pixel electrode 111 are included in different subpixels. Specifically, the transistor is included in an adjacent subpixel on the right side of the drawing. The pixel electrode 111 and the reflective layer 116 overlap with the scan line 228. A transistor electrically connected to the scan line 228 and the pixel electrode 111 are included in different subpixels. Specifically, the transistor is included in an adjacent subpixel on the lower side of the drawing.

In FIG. 13A, two transmissive regions 91 and two reflective regions 92 of the display device 105C are shown. The pixel electrode 111 electrically connected to the transistor 206 on the right side overlaps with the transistor 206 on the left side. The reflective layer 116 is provided between the pixel electrode 111 and the transistor 206 on the left side. That is, in the display device 105C, the transmissive region 91 on the right side and the reflective region 92 on the left side are driven by the transistor 206 on the right side to perform display.

As shown in FIG. 13B, the pixel electrode 111 is not necessarily provided in the reflective region 92.

As described above, the degree of freedom in pixel layout is high in the display device of one embodiment of the present invention. Therefore, by appropriately disposing the pixel electrode 111 and the reflective layer 116 in accordance with the design rule or the like, the area of the transmissive region 91 and the reflective region 92 can be increased, and the aperture ratio can be increased easily.

The display device 105D shown in FIG. 14 includes the insulating layer 212, an insulating layer 216, and the gate 223 in addition to the structure of the above-described display device 105. The display device 105D does not include the reflective layer 116 that the display device 105 includes.

The gate 223 in the display device 105D also serves as a layer that reflects visible light in the reflective region 92. Thus, it is not necessary to form the reflective layer additionally, so that the structure and the manufacturing process of the display device can be simplified.

When a material that transmits visible light (e.g., an oxide conductor) is used for the gate 221, light from the backlight may enter the channel region 231a. This may degrade the reliability of the transistor 206.

Accordingly, the conductive layer 222 is preferably placed to overlap the channel region 231a, as shown in FIG. 14. This can inhibit the channel region 231a being irradiated with light from the backlight, thereby inhibiting the reliability degradation of the transistor 206.

Note that an insulating layer is formed thick between the gate 221 and the conductive layer 222, so that the parasitic capacitance between the gate 221 and the conductive layer 222 is reduced. For example, an organic insulating layer may be provided as the insulating layer 216.

1-3. Fabrication Method Example 1 of Display Device

One example of the fabrication method of the display device 105D illustrated in FIG. 14 is described with reference to FIG. 15A to FIG. 19B. Note that Embodiment 2 can be referred to for the details of the fabrication method of the transistor.

Note that the thin films constituting the display device (i.e., the insulating film, the semiconductor film, the conductive film, and the like) can be formed by any of a sputtering method, a chemical vapor deposition (CVD) method, a vacuum evaporation method, a pulsed laser deposition (PLD) method, an atomic layer deposition (ALD) method, or the like. As examples of a CVD method, a plasma-enhanced CVD (PECVD) method or a thermal CVD method or the like can be given. As an example of the thermal CVD method, metal organic CVD (MOCVD) method can be given.

Alternatively, the thin films constituting the display device (i.e., the insulating film, the semiconductor film, the conductive film, and the like) can be formed by a method such as spin coating, dipping, spray coating, inkjet printing, dispensing, screen printing, or offset printing, or with a doctor knife, a slit coater, a roll coater, a curtain coater, or a knife coater.

The thin films constituting the display device can be processed using a photolithography method or the like. Alternatively, island-shaped thin films may be formed by a film formation method using a blocking mask. Alternatively, the thin films may be processed by a nano-imprinting method, a sandblasting method, a lift-off method, or the like. Examples of the photolithography method include a method in which a resist mask is formed over a thin film to be processed, the thin film is processed by etching or the like, and the resist mask is removed, and a method in which a photosensitive thin film is formed, and the photosensitive thin film is exposed to light and developed to be processed in a desired shape.

As light used in exposure in a photolithography method, light with an i-line (with a wavelength of 365 nm), light with a g-line (with a wavelength of 436 nm), light with an h-line (with a wavelength of 405 nm), and light in which the i-line, the g-line, and the h-line are mixed can be given. Alternatively, ultraviolet light, KrF laser light, ArF laser light, or the like can be used. Exposure may be performed by liquid immersion exposure technique. As light used in exposure, extreme ultra-violet light (EUV), X-rays or the like can be given. An electron beam can be used instead of a light used in exposure. It is preferable to use extreme ultra-violet light (EUV), X-rays, or an electron beam because extremely minute processing can be performed. Note that when exposure is performed by scanning of a beam such as an electron beam, a photomask is not needed.

For etching of the thin film, dry etching, wet etching, a sandblast method, or the like can be used.

A functional element can be formed over a fabrication substrate, separated from the fabrication substrate, and then transferred to another substrate. With this method, for example, a functional element that is formed over a fabrication substrate having high heat resistance can be transferred to a substrate having low heat resistance. Therefore, the manufacturing temperature of the functional element is not limited by the substrate having low heat resistance. Moreover, the functional element can be transferred to a substrate or the like which is more lightweight, flexible and thinner than the fabrication substrate, whereby a variety of devices such as a semiconductor device, a display device, and the like can be made lightweight, flexible, and thin.

Specifically, the functional element formed over the first substrate can be transferred to the second substrate by forming a separation layer over the first substrate, forming an oxide layer above the separation layer, forming the functional element over the oxide layer, bonding the first and second substrates using an adhesion layer, and separating the first and second substrates. FIG. 15A to FIG. 19B illustrate an example where an oxide insulating layer is used for the oxide layer.

First, as shown in FIG. 15A, a separation layer 303 is formed over a fabrication substrate 301, and an oxide insulating layer 305 is formed over the separation layer 303.

A heat-resistant substrate that can withstand at least the processing temperature during the fabrication is used as the fabrication substrate 301. As the fabrication substrate 301, for example, a glass substrate, a quartz substrate, a sapphire substrate, a semiconductor substrate, a ceramic substrate, a metal substrate, or a plastic substrate can be used.

Note that it is preferable to use a large-sized glass substrate as the fabrication substrate 301 in terms of productivity. For example, a glass substrate having a size greater than or equal to the 3rd generation (550 mm×650 mm) and less than or equal to the 10th generation (2950 mm×3400 mm) or a glass substrate having a larger size than the 10th generation is preferably used.

In the case where a glass substrate is used as the fabrication substrate 301, an insulating layer such as a silicon oxide film, a silicon oxynitride film, a silicon nitride film, or a silicon nitride oxide film is preferably formed as a base film between the fabrication substrate 301 and the separation layer 303, in which case contamination from the glass substrate can be prevented.

The separation layer 303 can be formed using an element selected from tungsten, molybdenum, titanium, tantalum, niobium, nickel, cobalt, zirconium, zinc, ruthenium, rhodium, palladium, osmium, iridium, and silicon; an alloy material containing any of the elements; a compound material containing any of the elements; or the like. A crystal structure of a layer containing silicon may be amorphous, microcrystal, or polycrystal. Furthermore, a metal oxide such as aluminum oxide, gallium oxide, zinc oxide, titanium dioxide, indium oxide, indium tin oxide, indium zinc oxide, or an In—Ga—Zn oxide can be used. The separation layer 303 is preferably formed using a high-melting-point metal material such as tungsten, titanium, or molybdenum, in which case the degree of freedom of the process for forming the functional element and the like can be increased.

The separation layer 303 can be formed by, for example, a sputtering method, a plasma CVD method, a coating method (including a spin coating method, a droplet discharging method, a dispensing method, and the like), a printing method, or the like. The thickness of the separation layer 303 is, for example, greater than or equal to 1 nm and less than or equal to 200 nm, or preferably greater than or equal to 10 nm and less than or equal to 100 nm. The separation layer 303 may be formed in a shape of an island over the fabrication substrate 301.

In the case where the separation layer 303 has a single-layer structure, a tungsten layer, a molybdenum layer, or a layer containing a mixture of tungsten and molybdenum is preferably formed. Alternatively, a layer containing an oxide or an oxynitride of tungsten, a layer containing an oxide or an oxynitride of molybdenum, or a layer containing an oxide or an oxynitride of a mixture of tungsten and molybdenum may be formed. Note that the mixture of tungsten and molybdenum corresponds to, for example, an alloy of tungsten and molybdenum.

In the case where the separation layer 303 is formed to have a stacked structure of a layer containing tungsten and a layer containing an oxide of tungsten, the layer containing an oxide of tungsten may be formed as follows: the layer containing tungsten is formed first and an insulating layer formed of an oxide is formed thereover, so that the layer containing an oxide of tungsten is formed at the interface between the tungsten layer and the insulating layer. Alternatively, the layer containing an oxide of tungsten may be formed by performing thermal oxidation treatment, oxygen plasma treatment, nitrous oxide ($N_2O$) plasma treatment, treatment with a highly oxidizing solution such as ozone water, or the like on the surface of the layer containing tungsten. Plasma treatment and heat treatment may be performed in an atmosphere of oxygen, nitrogen, or nitrous oxide alone, or a mixed gas of any of these gasses and another gas. By changing the surface condition of the separation layer 303 by the plasma treatment or heat treatment, adhesion between the separation layer 303 and the insulating film formed later can be controlled.

The oxide insulating layer 305 preferably has a single-layer structure or a stacked structure including any of a silicon oxide film, a silicon oxynitride film, a silicon nitride oxide film, and the like.

The oxide insulating layer 305 can be formed by a sputtering method, a plasma CVD method, a coating method, a printing method, or the like. For example, the oxide insulating layer 305 is formed at a temperature higher than or equal to 250° C. and lower than or equal to 400° C. by a plasma CVD method, whereby the oxide insulating layer 305 can be a dense film having an excellent moisture-resistant property. The thickness of the oxide insulating layer ranges preferably from 10 nm to 3000 nm, more preferably from 200 nm to 1500 nm.

Next, the common electrode 112 and the conductive layer 251 are formed over the oxide insulating layer 305. Note that an insulating layer (nitride insulating layer, oxide insulating layer or the like) may be formed over the oxide insulating layer 305, before the common electrode 112 is formed.

In one embodiment of the present invention, the common electrode 112 is formed before the transistor is formed; thus, the common electrode 112 can be formed on a flat surface.

Next, the insulating layer 220 that covers the common electrode 112 and the conductive layer 251 is formed. Next, the pixel electrode 111 and the conductive layer 253 are formed over the insulating layer 220. Next, the insulating layer 211 that covers the pixel electrode 111 and the conductive layer 253 is formed (FIG. 15B).

Next, the gate 223 is formed over the insulating layer 211, and the insulating layer 212 that covers the gate 223 is formed (FIG. 15C).

Next, an opening portion that reaches the pixel electrode 111 and an opening portion that reaches the conductive layer 253 are formed by partly etching the insulating layers 211 and 212 (FIG. 16A). An example in which the insulating layers 211 and 212 are etched together is shown as an example, but one embodiment of the present invention is not limited to this example.

Next, an island-shaped semiconductor layer 231 is formed to cover the opening portions provided in the insulating layers (FIG. 16B).

Next, an insulating layer 213_0 that covers the semiconductor layer 231 is formed, and a conductive layer 221_0 is formed over the insulating layer 213_0 (FIG. 17A).

Next, the island-shaped gate insulating layer 213 and the island-shaped gate 221 are formed by processing the insulating layer 213_0 and the conductive layer 221_0. Then, the insulating layer 214 that covers the gate insulating layer 213 and the gate 221 is formed (FIG. 17B).

Forming the insulating layer 214 that contains nitrogen or hydrogen and then performing a heat treatment on the insulating layer 214 supplies nitrogen or hydrogen to portions of the semiconductor layer that do not overlap with the gate 221 and the gate insulating layer 213, thereby forming the low-resistance region 231b.

The low-resistance region 231b may be formed by adding impurities to the semiconductor layer 231 after forming the island-shaped gate insulating layer 213 and the island-shaped gate 221, and before forming the insulating layer 214. The low-resistance region 231b may be formed by adding impurities to the semiconductor layer 231 after forming the insulating layer 214. The impurities may be added to the semiconductor layer 231 after forming at least one of the insulating layers 215 and 216, which will be described later.

The supply of impurities to the portion of the semiconductor layer that overlaps with the gate 221 and the gate insulating layer 213 is reduced compared with the supply of impurities to the portion that do not overlap; thus, the decrease in resistivity is inhibited, and the portion that overlaps with the gate 221 and the gate insulating layer 213 can function as the channel region 231a.

Next, the insulating layers 215 and 216 are formed. An opening portion that reaches the low-resistance region 231b and an opening portion that reaches the conductive layer 255 are formed by partly etching the insulating layers 214, 215, and 216. Note that the plurality of insulating layers may be processed in different process steps, or two layers or more can be processed in the same process step at a time. Next, the conductive layer 222 and the wiring 65 are formed by forming a conductive layer over the low-resistance region 231b so that the conductive layer covers the opening portion provided in the insulating layer, and then processing the conductive layer into a desired shape (FIG. 18A).

Next, as illustrated in FIG. 18B, the fabrication substrate 301 and the substrate 51 are bonded to each other with the adhesion layer 142.

Next, as illustrated in FIG. 19A, the fabrication substrate 301 and the oxide insulating layer 305 are separated from each other. An example in which a separation is performed between the separation layer 303 and the oxide insulating layer 305 is shown here.

Before the separation of the fabrication substrate 301 and the oxide insulating layer 305, a starting point of separation is preferably formed using laser light, a sharp knife, or the like. A starting point for separation can be formed by cracking (or breaking) a part of the oxide insulating layer 305. For example, laser light irradiation enables part of the oxide insulating layer 305 to be melted, evaporated, or thermally broken.

Next, the oxide insulating layer 305 and the fabrication substrate 301 are separated from the formed starting point of separation by physical force (e.g., a separation process with a human hand or a jig, or a separation process by rotation of a roller adhered to the substrate). The separation layer 303 and the formation substrate 301 that are separated from the oxide insulating layer 305 are illustrated in the lower part of FIG. 19A.

Next, the oxide insulating layer 305 is removed. For the removal of the oxide insulating layer 305, for example, one or both of a wet etching method and a dry etching method can be used. Removal of the oxide insulating layer 305 allows the exposure of the common electrode 112 and the conductive layer 251 (FIG. 19B).

Next, the alignment film 133a is formed over a surface of the common electrode 112. Note that when the oxide insulating layer 305 serves as the alignment film 133a, some portions of the oxide insulating layer 305 can be left unremoved. For example, a portion of the oxide insulating layer 305 that overlaps with the common electrode 112 may be left remaining. In addition, the oxide insulating layer 305 may be partly removed so that the conductive layer 251 is exposed.

Subsequently, a liquid crystal layer 113 is encapsulated between the substrate 51 and the substrate 61 over which the coloring layer 131, the light-blocking layer 132, the alignment film 133b and the like are formed, using the adhesion layer 141. Through the process described above, the display device 105D can be fabricated.

As described above, in one embodiment of the present invention, functional elements constituting the display device, such as a transistor and a liquid crystal element, are formed over the fabrication substrate. Thus, there is almost no limitation on the heat that is applied during the formation processes of the functional elements. Highly reliable functional elements that are fabricated in a high-temperature process can be transferred on a substrate constituting the display device, with high yield. This enables the fabrication of a highly reliable display device.

In one embodiment of the present invention, an electrode of the liquid crystal element can be formed on a flat surface because the electrode of the liquid crystal element is formed before a transistor is formed. Thus, variation of the cell gap and variation in the initial alignment of the liquid crystal can be reduced. This allows the increase of aperture ratio and the fabrication of a display device with high resolution.

1-4. Fabrication Method Example 2 of Display Device

An example of the fabrication method of the display device 105A illustrated in FIG. 7 is described in reference to FIGS. 20A to 20C and FIGS. 21A and 21B.

FIGS. 20A to 20C and FIGS. 21A and 21B illustrate an example in which an oxide insulating layer and an oxide conductive layer are used as the oxide layers that are in contact with the separation layer.

Figures 20A, 20B, 20C:
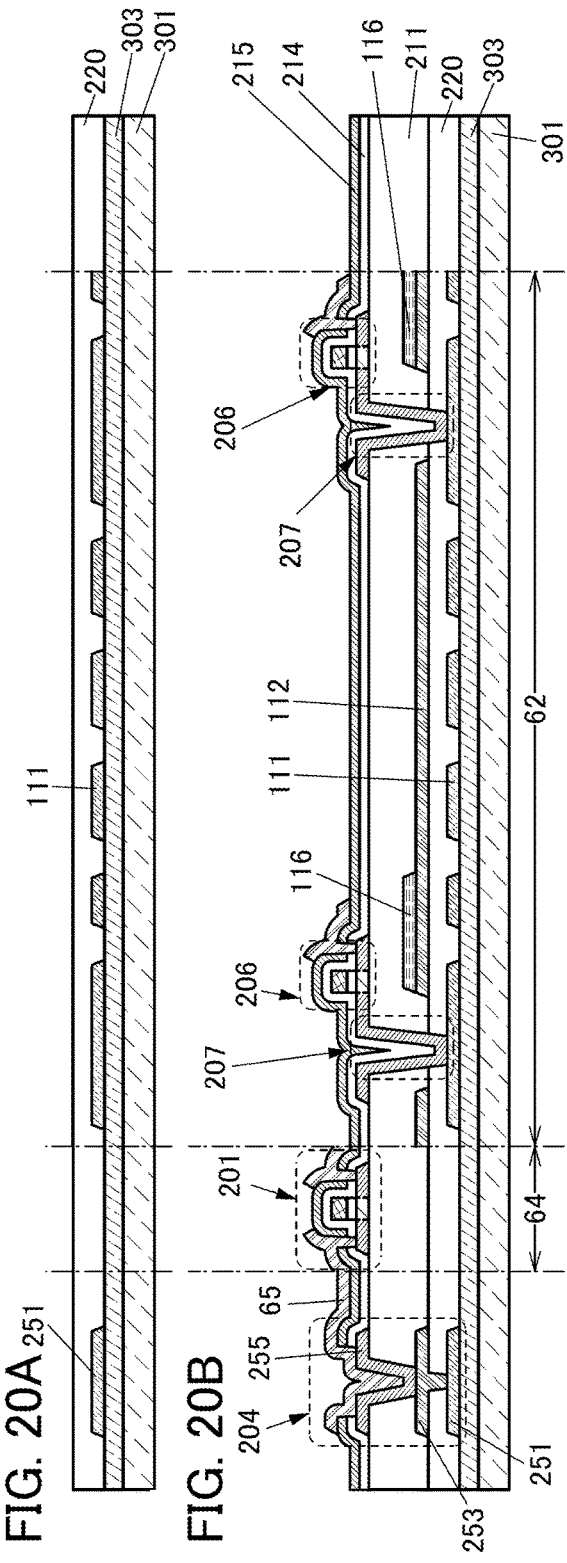
FIGS. 20A to 20C are cross-sectional views illustrating an example of a fabrication method of a display device.

First, as illustrated in FIG. 20A, the separation layer 303 is formed over the fabrication substrate 301.

Next, the pixel electrode 111 and the conductive layer 251 are formed over the separation layer 303 (FIG. 20A). Here, the pixel electrode 111 and the conductive layer 251 are formed using an oxide conductive layer.

Examples of materials that can be used for the oxide conductive layer include indium oxide, ITO, indium oxide containing tungsten oxide, indium zinc oxide containing tungsten oxide, indium oxide containing titanium oxide, indium tin oxide containing titanium oxide, indium zinc oxide, and ITSO.

Alternatively, an In-M-Zn oxide that contains at least indium (In), zinc (Zn), and M (M is a metal such as Al, Ti, Ga, Ge, Y, Zr, La, Ce, Nd, Sn, or Hf) can be used for the oxide conductive layer. The oxide conductive layer preferably contains one or more kinds of metal elements included in the oxide semiconductor layer of the transistor.

In one embodiment of the present invention, the pixel electrode 111 is formed before the transistor is formed; thus, the pixel electrode 111 can be formed on a flat surface.

Next, the insulating layer 220 that covers the pixel electrode 111 and the conductive layer 251 is formed. When the insulating layer 220 is a single film, the insulating layer 220 is an oxide insulating layer. When the insulating layer 220 has a stacked structure, the layer included in the insulating layer 220 that is in contact with the separation layer 303 is an oxide insulating layer.

Next, the common electrode 112 and the conductive layer 253 are formed over the insulating layer 220. Next, the reflective layer 116 is formed over a part of the common electrode 112. A region in which the reflective layer 116 is formed serves as the reflective region 92. Next, the insulating layer 211 that covers the common electrode 112 and the conductive layer 253 is formed. Next, the transistors 201 and 206 and the like are formed over the insulating layer 211 (FIG. 20B).

Next, as illustrated in FIG. 20C, the fabrication substrate 301 and the substrate 51 are bonded to each other with the adhesion layer 142.

Figure 21A:
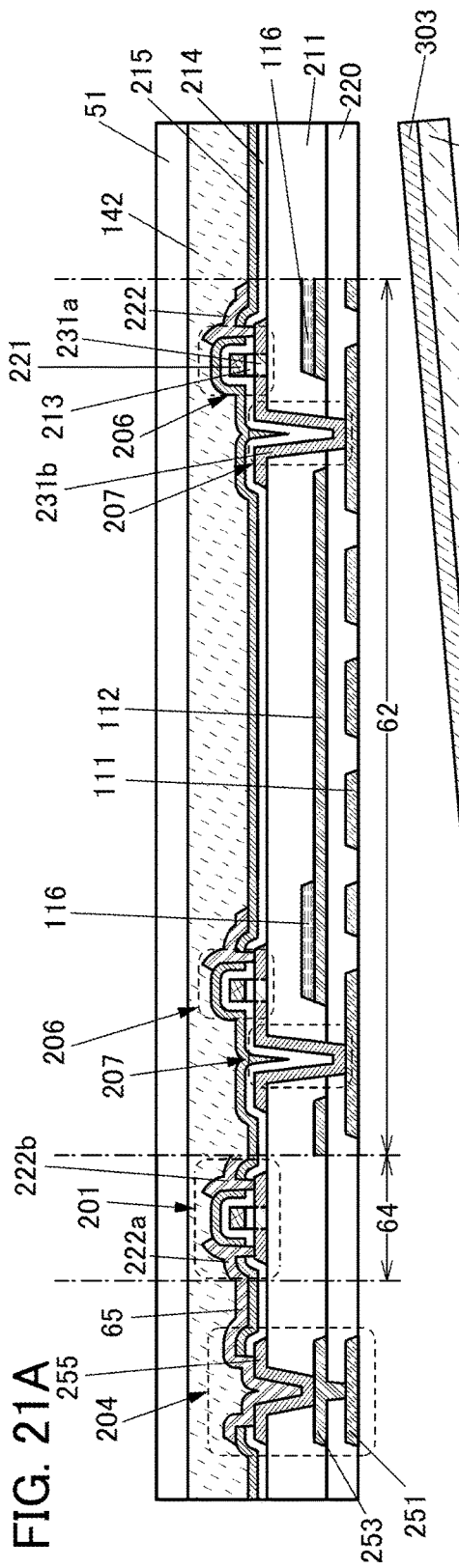
FIGS. 21A and 21B are cross-sectional views illustrating an example of a fabrication method of a display device.

Next, as illustrated in FIG. 21A, the fabrication substrate 301 and the pixel electrode 111, the conductive layer 251, and the insulating layer 220 are separated. An example in which a separation is performed between the separation layer 303 and the pixel electrode 111, the conductive layer 251, and the insulating layer 220 is shown here. The separation layer 303 and the formation substrate 301 that are separated from the pixel electrode 111, the conductive layer 251, and the insulating layer 220 are illustrated in the lower part of FIG. 21A.

Figure 21B:
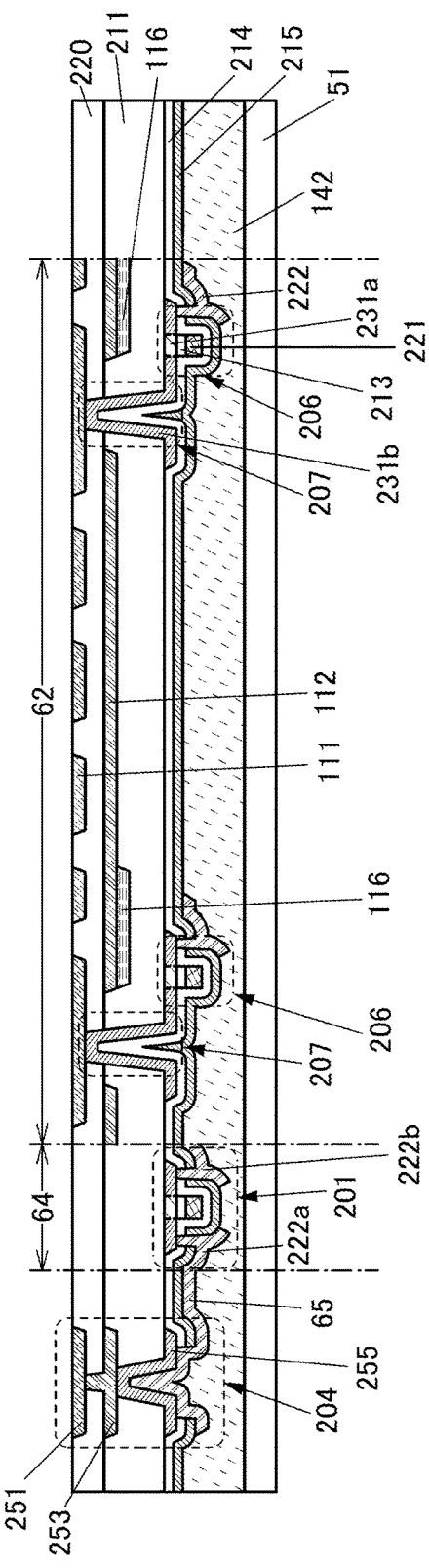

In this fabrication method example, an oxide conductive layer is used for the pixel electrode 111 and the conductive layer 251, and an oxide insulating layer is used for the insulating layer 220. Thus, the fabrication substrate 301 and the substrate 51 can be separated without formation of an oxide layer at the interface between the separation layer 303 and the pixel electrode 111, the conductive layer 251, and the insulating layer 220 (FIGS. 21A and 21B). This allows the separation of the fabrication substrate 301 and the exposure of the pixel electrode 111 and the conductive layer 251. Because a process step to remove an oxide layer becomes unnecessary, the fabrication process of the display device can be shortened. Note that in the case where the common electrode 112 is formed before the pixel electrode 111, an oxide conductive layer is used as the common electrode 112, whereby the manufacture substrate 301 can be separated from the substrate 51 without formation of another oxide layer.

Next, the alignment film 133a is formed over the pixel electrode 111. Subsequently, the liquid crystal layer 113 is encapsulated between the substrate 51 and the substrate 61 over which the coloring layer 131, the light-blocking layer 132, the alignment film 133b and the like are formed, using the adhesion layer 141. Through the process described above, the display device 105A can be fabricated.

As described above, in one embodiment of the present invention, most of functional elements that constitute a display device, such as a such as a transistor or a liquid crystal element, are fabricated on the fabrication substrate; therefore, the functional elements can be fabricated using high temperature regardless of the materials of the substrate 51 and the substrate 61. This enables the fabrication of a highly reliable display panel.

In one embodiment of the present invention, an electrode of the liquid crystal element can be formed on a flat surface because the electrode of the liquid crystal element is formed before a transistor is formed. Thus, variation of the cell gap and variation in the initial alignment of the liquid crystal can be reduced.

In one embodiment of the present invention, the fabrication of the display device can progress directly after the separation of the fabrication substrate, without performing a process step to remove an unnecessary film. This enables a shortening of the fabrication process and the reduction in manufacturing cost.

1-5. Fabrication Method Example 3 of Display Device

An example of the fabrication method of the display device 105D illustrated in FIG. 14 is described in reference to FIGS. 22A to 22C and FIGS. 23A and 23B.

FIGS. 22A to 22C and FIGS. 23A and 23B illustrate an example in which a separation is performed at the interface between the fabrication substrate and the separation layer. In the example, the separation layer is used as an alignment film.

First, as illustrated in FIG. 22A, a separation layer 309 is formed over the fabrication substrate 301.

The separation layer 309 is later used as the alignment film 133a. An organic resin such as polyimide, polyester, polyolefin, polyamide, polycarbonate, or acrylic can be formed as the separation layer 309. Next, laser irradiation or heat treatment is preferably performed to improve the adhesion between the fabrication substrate and the organic resin.

Next, the common electrode 112 and the conductive layer 251 are formed over the separation layer 309.

In one embodiment of the present invention, the common electrode 112 is formed before the transistor is formed; thus, the common electrode 112 can be formed on a flat surface.

Next, the insulating layer 220 that covers the common electrode 112 and the conductive layer 251 is formed. Next, the pixel electrode 111 and the conductive layer 253 are formed over the insulating layer 220. Next, the insulating layer 211 that covers the pixel electrode 111 and the conductive layer 253 is formed. Next, the transistors 201 and 206 and the like are formed over the insulating layer 211 (FIG. 22B).

Next, as illustrated in FIG. 22C, the fabrication substrate 301 and the substrate 51 are bonded to each other with the adhesion layer 142.

Next, as illustrated in FIG. 23A, the fabrication substrate 301 and the separation layer 309 are separated from each other. For example, the separation can be performed at the interface between the fabrication substrate 301 and the separation layer 309 by performing laser irradiation with higher energy density than the energy density of the above-described laser irradiation, or performing heat treatment at a temperature higher than the temperature of the above-described heat treatment. Note that the treatment to improve the adhesion between the fabrication substrate and the organic resin and one of the treatments described here, e.g., laser irradiation or heat treatment, may be performed. In addition, a liquid may be injected into the interface between the fabrication substrate 301 and the separation layer 309 before or during the separation.

Alternatively, the separation may be performed at the interface between a metal layer and the separation layer 309 by providing the metal layer between the fabrication substrate 301 and the separation layer 309, and heating the metal layer by supplying a current to the metal layer.

Next, a part of the separation layer 309 is removed, thereby exposing the conductive layer 251 (FIG. 23B). The remaining part of the separation layer 309 can be used as the alignment film 133a. Of the separation layer 309, the top surface of the part that is left remaining is preferably subjected to a rubbing treatment.

Subsequently, the liquid crystal layer 113 is encapsulated between the substrate 51 and the substrate 61 over which the coloring layer 131, the light-blocking layer 132, and the alignment film 133b are formed, using the adhesion layer 141. Through the methods described above, the display device 105C can be fabricated.

As described above, in one embodiment of the present invention, most of functional elements that constitute a display device, such as a transistor or a liquid crystal element, are fabricated on the fabrication substrate; therefore, the functional elements can be fabricated using high temperature regardless of the materials used for the substrate 51 and the substrate 61. This enables the fabrication of a highly reliable display panel.

In one embodiment of the present invention, an electrode of the liquid crystal element can be formed on a flat surface because the electrode of the liquid crystal element is formed before forming a transistor. Thus, variation of the cell gap and variation in the initial alignment of the liquid crystal can be reduced.

1-6. Structure Example 3 of Display Device

Examples of the display device are shown in FIG. 24. FIG. 24 is a cross-sectional view of a display device 105E. Note that the perspective view of the display device 105E is not drawn here, as it is similar to the perspective view of the display device 105 illustrated in FIGS. 2A to 2C.

The display device 105E illustrated in FIG. 24 is an example of a liquid crystal display device that includes a liquid crystal element with a vertical electric field mode.

As illustrated in FIG. 24, the display device 105E includes the substrate 51, the adhesion layer 142, the transistor 201, the transistor 206, the liquid crystal element 40, the reflective layer 116, the alignment film 133a, the alignment film 133b, the connection portion 204, a connection portion 252, the adhesion layer 141, the coloring layer 131, the light-blocking layer 132, the overcoat 121, the substrate 61, the polarizer 130, and the like.

The display portion 62 includes the transistor 206 and the liquid crystal element 40.

The transistor 206 includes the gate 221, the gate insulating layer 213, and a semiconductor layer (the channel region 231a and the low-resistance region 231b).

The conductive layer 222 is connected with the low-resistance region 231b through an opening formed in the insulating layers 214 and 215.

The liquid crystal element 40 is a liquid crystal element with a vertical alignment (VA) mode. The liquid crystal element 40 includes the pixel electrode 111, the common electrode 112, and the liquid crystal layer 113. The liquid crystal layer 113 is positioned between the pixel electrode 111 and the common electrode 112.

A conductive layer 227 that transmits visible light is provided between the pixel electrode 111 and the insulating layer 212. The insulating layer 220 is positioned between the pixel electrode 111 and the conductive layer 227. The pixel electrode 111 functions as one electrode of a capacitor. The conductive layer 227 functions as the other electrode of the capacitor. The conductive layer 227 is supplied with a predetermined potential through a wiring (not drawn), for example.

The pixel electrode 111 is electrically connected to the low-resistance region 231b of the semiconductor layer of the transistor 206.

In the connection portion 207, the low-resistance region 231b of the semiconductor layer is connected to the pixel electrode 111. The low-resistance region 231b of the semiconductor layer includes a portion that is in contact with side surfaces of an opening portion in the insulating layer 212 and the insulating layer 220. The low-resistance region 231b of the semiconductor layer is in contact with the side surfaces of the opening portion in the insulating layer 212 and the insulating layer 220, while at the same time being connected to the pixel electrode 111. This enables the pixel electrode 111 to be placed flatly.

The use of a material that transmits visible light for the semiconductor layer allows the connection portion 207 to be provided in the transmissive region 91. Thus, the area of the transmissive region 91 can be increased.

The connection portion 207 on the substrate 61 side does not include an uneven surface. Thus, the surface of each of the pixel electrode 111, the insulating layer 220, and the alignment film 133a on the substrate 61 side is flat. Therefore, a region provided with the connection portion 207 can be used to display images, similarly to other regions. This can increase the aperture ratio of the display device and facilitate the fabrication of a display device with high resolution.

The reflective layer 116 is provided to overlap with the conductive layer 222 and the gate 221 of the transistor 206. The reflective layer 116 is provided in contact with the pixel electrode 111.

The reflective layer 116 is provided to overlap with the region that blocks visible light in the display portion 62. When such a structure is employed, the region that blocks visible light in the display portion 62 can be used as the reflective region 92. Furthermore, a portion of the display device that contributes to display can be enlarged, and accordingly, the display device can have a high aperture ratio. Moreover, the display device can have high resolution.

The common electrode 112 is electrically connected to a conductive layer 118 through a connector 243. The conductive layer 118 can be formed with the same material and the same fabrication step as those used for the pixel electrode 111. In the connection portion 252, a conductive layer that is provided closer to the substrate 51 than the liquid crystal layer 113 is electrically connected to the common electrode 112. This allows a constant potential to be supplied to the common electrode 112 through the FPC 72.

As the connector 243, a conductive particle can be used, for example. A particle of an organic resin, silica, or the like coated with a metal material can be used as the conductive particle. Nickel or gold is preferably used as the metal material because contact resistance can be decreased. A use of a particle coated with layers of two or more kinds of metal materials, such as a particle coated with nickel and further with gold, is also preferable. A material capable of elastic deformation or plastic deformation is preferably used as the connector 243. As illustrated in FIG. 24, the conductive particle has a shape that is vertically crushed in some cases. With the crushed shape, the contact area between the connector 243 and a conductive layer electrically connected to the connector 243 can be increased, thereby reducing contact resistance and reducing issues such as disconnection.

The connector 243 is preferably provided so as to be covered with the adhesion layer 141. For example, the connector 243 may be dispersed within the adhesion layer 141 before the curing thereof.

When the overcoat 121 has a planarization function, the common electrode 112 can be provided flatly. This allows a thickness variation of the liquid crystal layer 113 to be reduced.

The transistors 201 and 206 may include the gate 223 that is formed with the same material and the same fabrication step as those used in the conductive layer 227 that transmits visible light. FIG. 24 illustrates an example in which the gate 223 is provided only in the driver circuit portion 64.

1-7. Structure Example 4 of Display Device

One embodiment of the present invention can be applied to a display device in which a touch sensor is implemented; such a display device is also referred to as an input/output device or a touch panel. Any of the structures of the display device described above can be applied to the touch panel. In this embodiment, the description focuses on an example in which the touch sensor is implemented in the display device 105C.

There is no limitation on the sensing element (also referred to as a sensor element) included in the touch panel of one embodiment of the present invention. A variety of sensors capable of sensing an approach or a contact of an object such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, a touch panel including a capacitive sensor element is described as an example.

Examples of the capacitive touch sensor element include a surface capacitive touch sensor element and a projected capacitive touch sensor element. Examples of the projected capacitive sensor element include a self-capacitive sensor element and a mutual capacitive sensor element. The use of a mutual capacitive sensor element is preferable because multiple points can be sensed simultaneously.

The touch panel of one embodiment of the present invention can have any of a variety of structures, including a structure in which a display device and a sensor element that are separately formed are attached to each other and a structure in which an electrode and the like included in a sensor element are provided on one or both of a substrate supporting a display element and a counter substrate.

Figure 25A:
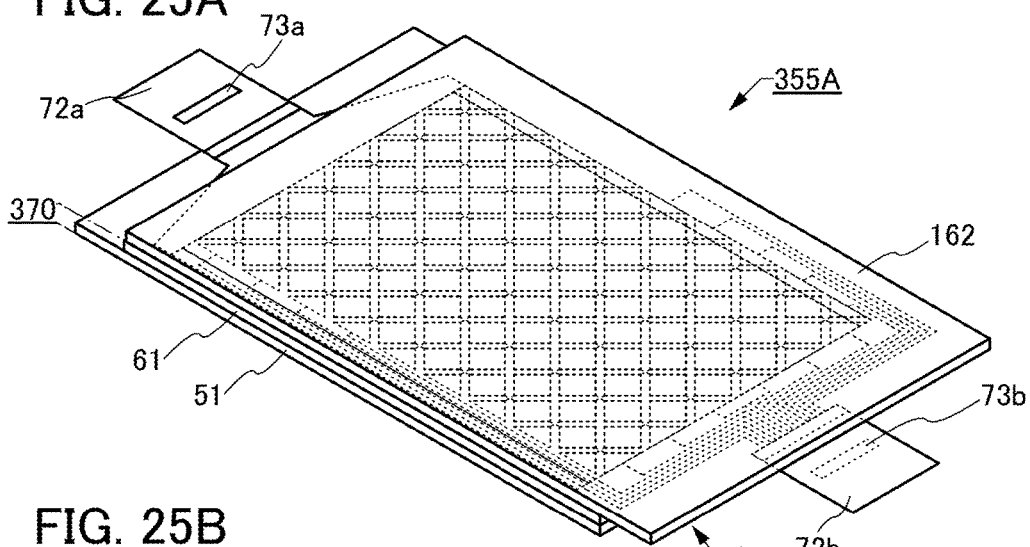
FIGS. 25A and 25B are perspective views illustrating an example of a touch panel.
Figure 25B:
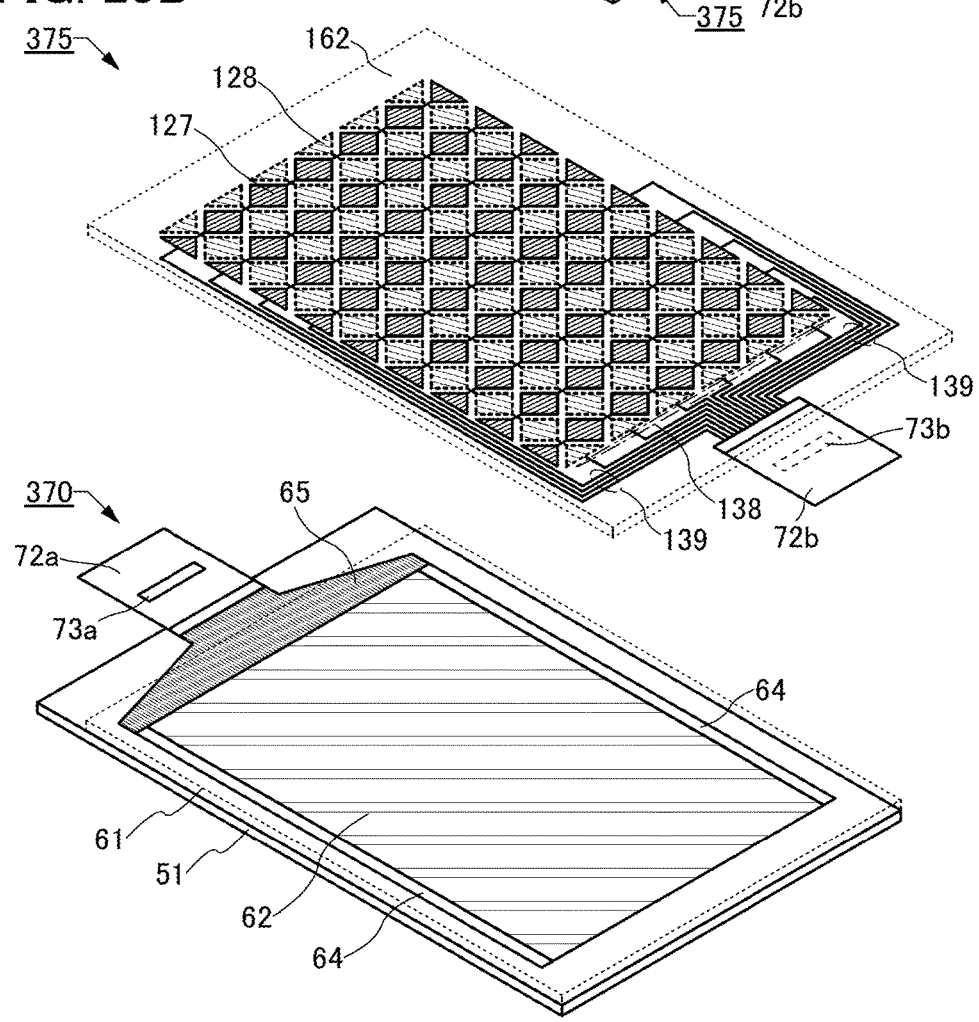

FIGS. 25A to 25C and FIG. 26 each illustrate an example of the display device. FIG. 25A is a perspective view of a touch panel 355A. FIG. 25B is a developed view of the schematic perspective view of FIG. 25A. Note that for simplicity, FIGS. 25A and 25B illustrate only the major components. In FIG. 25B, the outlines of the substrate 61 and a substrate 162 are illustrated only in dashed lines. FIG. 26 is a cross-sectional view of the touch panel 355A.

The touch panel 355A has a structure in which a display device and a sensor element that are fabricated separately are bonded together.

The touch panel 355A includes an input device 375 and a display device 370 that are provided to overlap with each other.

The input device 375 includes the substrate 162, an electrode 127, an electrode 128, a plurality of wirings 138, and a plurality of wirings 139. An FPC 72b is electrically connected to each of the plurality of wirings 138 and the plurality of wirings 139. An IC 73b includes the FPC 72b.

The display device 370 includes the substrate 51 and the substrate 61 which are provided to face each other. The display device 370 includes the display portion 62 and the driver circuit portion 64. The wiring 65 and the like are provided over the substrate 51. An FPC 72a is electrically connected with the wiring 65. An IC 73a is provided on the FPC 72a.

The wiring 65 supplies signals and power to the display portion 62 and the driver circuit portion 64. The signals and power are input to the wiring 65 from the outside or the IC 73a, through the FPC 72a.

FIG. 26 is a cross-sectional view of the display portion 62, the driver circuit portion 64, a region that includes the FPC 72a, a region that includes the FPC 72b, and the like.

The substrates 51 and 61 are bonded to each other by the adhesion layer 141. The substrates 61 and 162 are bonded to each other by an adhesion layer 169. Here, the layers from the substrate 51 to the substrate 61 correspond to the display device 370. The layers from the substrate 162 to an electrode 124 correspond to the input device 375. That is, the adhesion layer 169 bonds the display device 370 and the input device 375 together.

The structure of the display device 370 illustrated in FIG. 26 is a structure similar to the display device 105D illustrated in FIG. 14; detailed description is omitted here. The display device 370 can perform display using both the light 45 emitted from a backlight 161 and the external light 46.

A polarizer 165 is bonded to the substrate 51 with an adhesion layer 167. A backlight 161 is bonded to the polarizer 165 with an adhesion layer 163.

A polarizer 166 is bonded to the substrate 162 by an adhesion layer 168. A protection substrate 160 is bonded to the polarizer 166 by an adhesion layer 164. The protection substrate 160 may be used as the substrate that objects such as a finger or a stylus directly contact, when the touch panel 355A is incorporated into an electronic device. A substrate that can be used as the substrates 51 and 61 or the like can be used as the protection substrate 160. A structure where a protective layer is formed on the surface of the substrate that can be used as the substrates 51 and 61 or the like is preferably used for the protection substrate 160. Alternatively, a reinforced glass or the like is preferably used as the protection substrate 160. The protective layer can be formed with a ceramic coating. The protective layer can be formed using an inorganic insulating material such as silicon oxide, aluminum oxide, yttrium oxide, or yttria-stabilized zirconia (YSZ).

The polarizer 166 may be provided between the input device 375 and the display device 370. In that case, the protection substrate 160, the adhesion layer 164, and the adhesion layer 168 that are illustrated in FIG. 26 are not necessarily provided. In other words, the substrate 162 can be positioned on the outermost surface of the touch panel 355A. The above-described material that can be used for the protection substrate 160 is preferably used for the substrate 162.

The electrodes 127 and 128 are provided over the substrate 162, on the substrate 61 side. The electrodes 127 and 128 are formed on the same plane. An insulating layer 125 is provided to cover the electrodes 127 and 128. The electrode 124 is electrically connected to two of the electrodes 128 that are provided on both sides of the electrode 127, through an opening provided in the insulating layer 125.

In the conductive layers included in the input device 375, the conductive layers (e.g., the electrodes 127 and 128) that overlap with an opening portion (the transmissive region or the reflective region) of a pixel are formed using a material that transmits visible light.

The wiring 139 that is obtained by processing the same conductive layer as the electrodes 127 and 128 is connected to a conductive layer 126 that is obtained by processing the same conductive layer as the electrode 124. The conductive layer 126 is electrically connected to the FPC 72b through a connector 242b.

Next, an example of a driving method of an input device (touch sensor) that can be applied to the display device of one embodiment of the present invention is described with reference to FIGS. 27A and 27B.

Figure 27A:
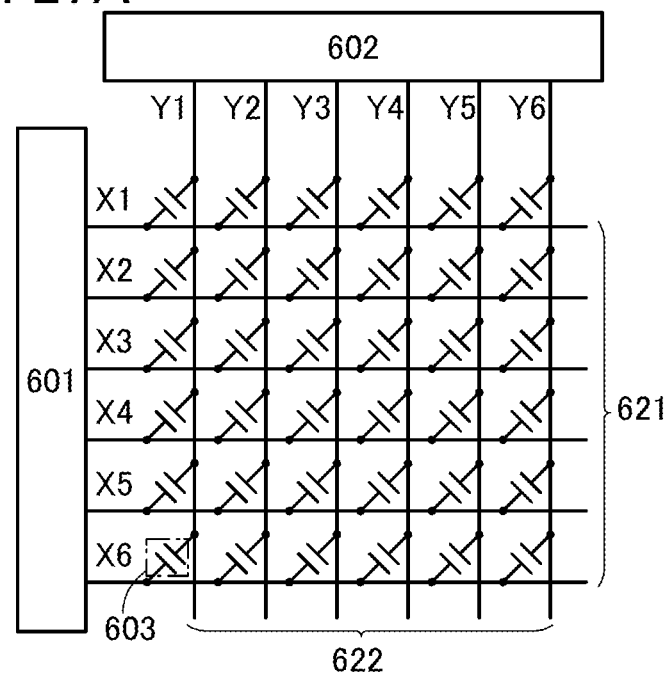
FIG. 27A illustrates an example of a structure of a touch sensor.

FIG. 27A is a block diagram illustrating the structure of a mutual capacitive touch sensor. FIG. 27A illustrates a pulse voltage output circuit 601 and a current sensing circuit 602. Note that in FIG. 27A, six wirings X1 to X6 represent electrodes 621 to which a pulse is applied, and six wirings Y1 to Y6 represent electrodes 622 that sense changes in current. The number of such electrodes is not limited to those illustrated in this example. FIG. 27A also illustrates a capacitor 603 that is formed by the overlap of the electrodes 621 and 622, or by the close arrangement of the electrodes 621 and 622. Note that the functions of the electrodes 621 and 622 may change places with each other.

For example, the electrode 127 corresponds to one of the electrode 621 or the electrode 622, and the electrode 128 corresponds to the other of the electrode 621 or the electrode 622.

The pulse voltage output circuit 601 is, for example, a circuit for sequentially inputting a pulse voltage to the wirings X1 to X6. The current sensing circuit 602 is, for example, a circuit for sensing current flowing through each of the wirings Y1 to Y6.

An application of a pulse voltage to one of the wirings X1 to X6 generates an electric field between the electrodes 621 and 622 of the capacitor 603, and current flows through the electrode 622. Part of the electric field generated between the electrodes is blocked when an object such a finger or a stylus approaches or contacts the device, so that the electric field intensity between the electrodes is changed. Consequently, the amount of current flowing through the electrode 622 is changed.

For example, in the case where there is no approach or no contact of an object, the amount of current flowing in each of the wirings Y1 to Y6 depends on the amount of capacitance of the capacitor 603. In the case where part of an electric field is blocked by the approach or contact of an object, a decrease in the amount of current flowing in the wirings Y1 to Y6 is sensed. The approach or contact of an object can be detected by utilizing this change.

The current sensing circuit 602 may sense using an integral value (time integral value) of current flowing in a wiring. In that case, for example, an integrator circuit can be used. Alternatively, the peak value of current may be sensed. In that case, for example, current may be converted into voltage, and the peak voltage value may be sensed.

Figure 27B:
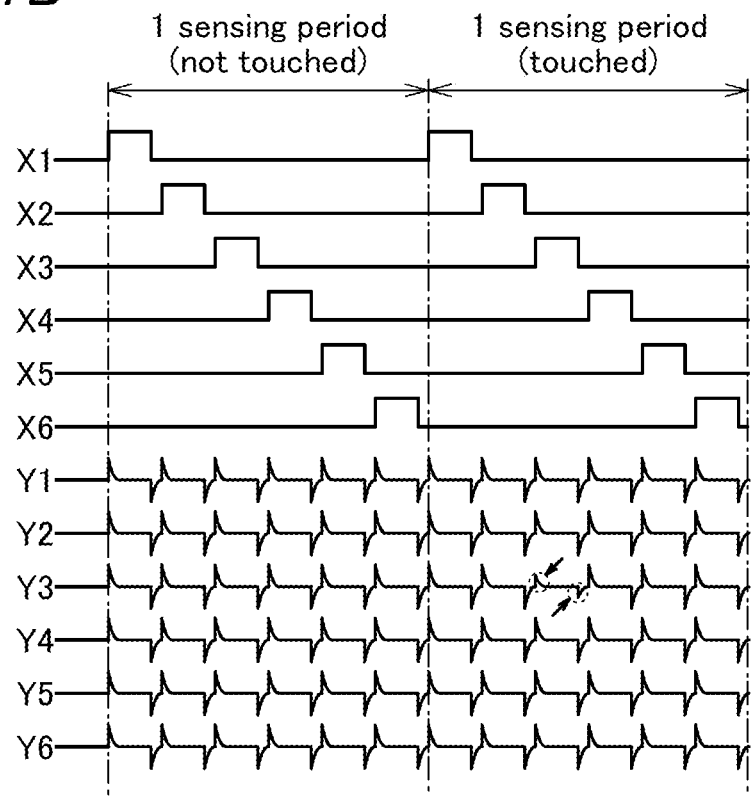
FIG. 27B illustrates an example of a driving method of an input device.

FIG. 27B is an example of a timing chart illustrating input and output waveforms in the mutual capacitive touch sensor in FIG. 27A. In FIG. 27B, sensing in each row and each column is performed in one sensing period. FIG. 27B shows a period when the approach or contact of an object is not detected (when the touch sensor is not touched) and a period when the approach or contact of an object is detected (when the touch sensor is touched). Here, the wirings Y1 to Y6 each show a waveform of a voltage corresponding to the amount of current to be sensed.

As shown in FIG. 27B, the wirings X1 to X6 are sequentially supplied with a pulse voltage. Accordingly, current flows in the wirings Y1 to Y6. When the touch sensor is not touched, substantially the same current flows in the wirings Y1 to Y6 in accordance with a change in voltages of the wirings X1 to X6; thus, the wirings Y1 to Y6 have similar output waveforms. Meanwhile, when the touch sensor is touched, current flowing in a wiring in a position which an object contacts or approaches among the wirings Y1 to Y6 is reduced; thus, the output waveforms are changed as illustrated in FIG. 27B.

FIG. 27B shows an example in which an object contacts or approaches the intersection of the wiring X3 and the wiring Y3 or the vicinity thereof.

A mutual capacitive touch sensor senses a change in current which occurs due to an electric field generated between a pair of electrodes being blocked; the mutual capacitive touch sensor can obtain positional information of an object in this manner. When the sensing sensitivity is high, the coordinates of the object can be determined even when the object is far from a detection surface (e.g., a surface of the touch panel).

By driving a touch panel by a method in which a display period of a display portion and a sensing period of a touch sensor do not overlap with each other, the detection sensitivity of the touch sensor can be increased. For example, a display period and a sensing period may be separately provided in one display frame period. In that case, two or more sensing periods are preferably provided in one frame period. When the sensing frequency is increased, the detection sensitivity can be further increased.

It is preferable that, as an example, the pulse voltage output circuit 601 and the current sensing circuit 602 are formed in an IC chip. For example, the IC is preferably mounted on a touch panel or a substrate in a housing of an electronic device. In the case where the touch panel has flexibility, parasitic capacitance can potentially be increased in a bent portion of the touch panel, and the influence of noise can potentially be increased. In view of this, an IC with a driving method less influenced by noise is preferably used. For example, it is preferable to use an IC to which a driving method capable of increasing a signal-noise ratio (S/N ratio) is applied.

1-8. Structure Example 5 of Display Device

Figure 28A:
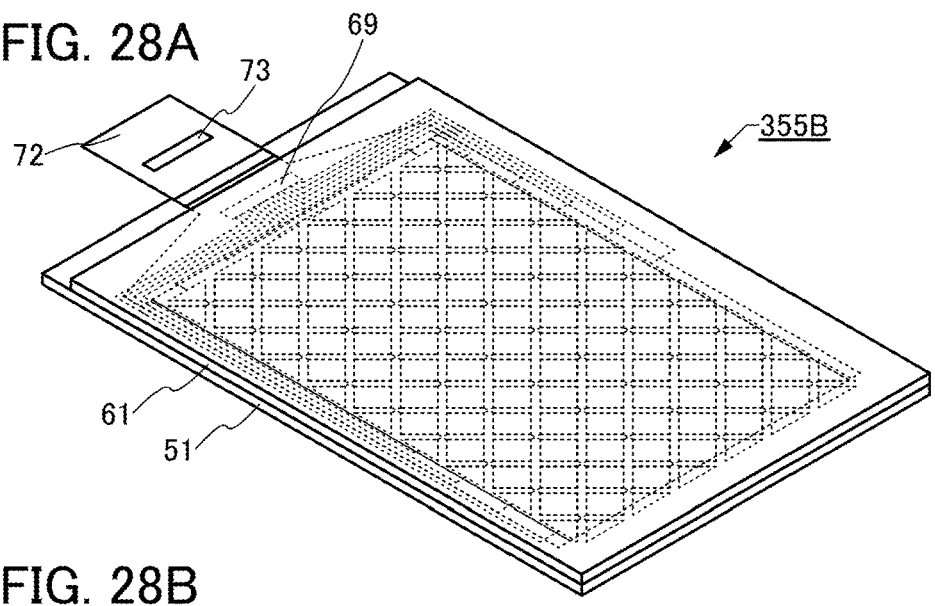
FIGS. 28A and 28B are perspective views each illustrating an example of a touch panel.
Figure 28B:
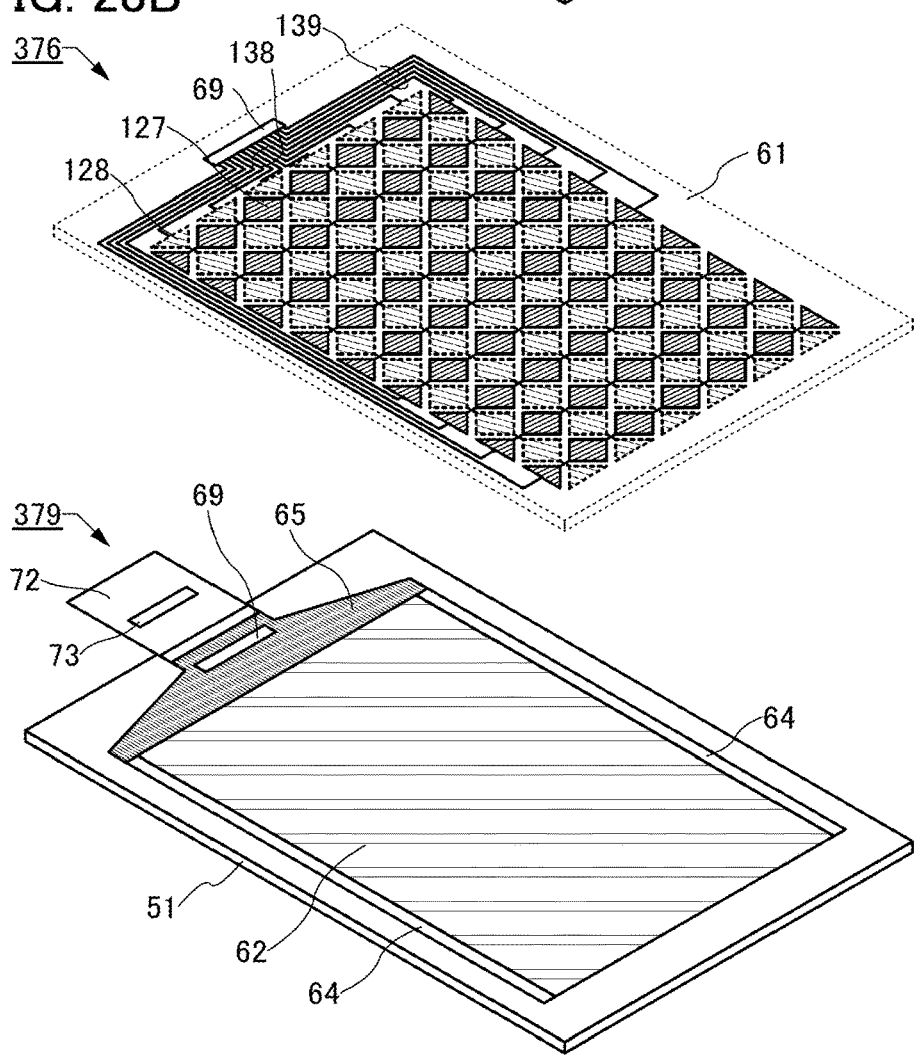
Figure 29:
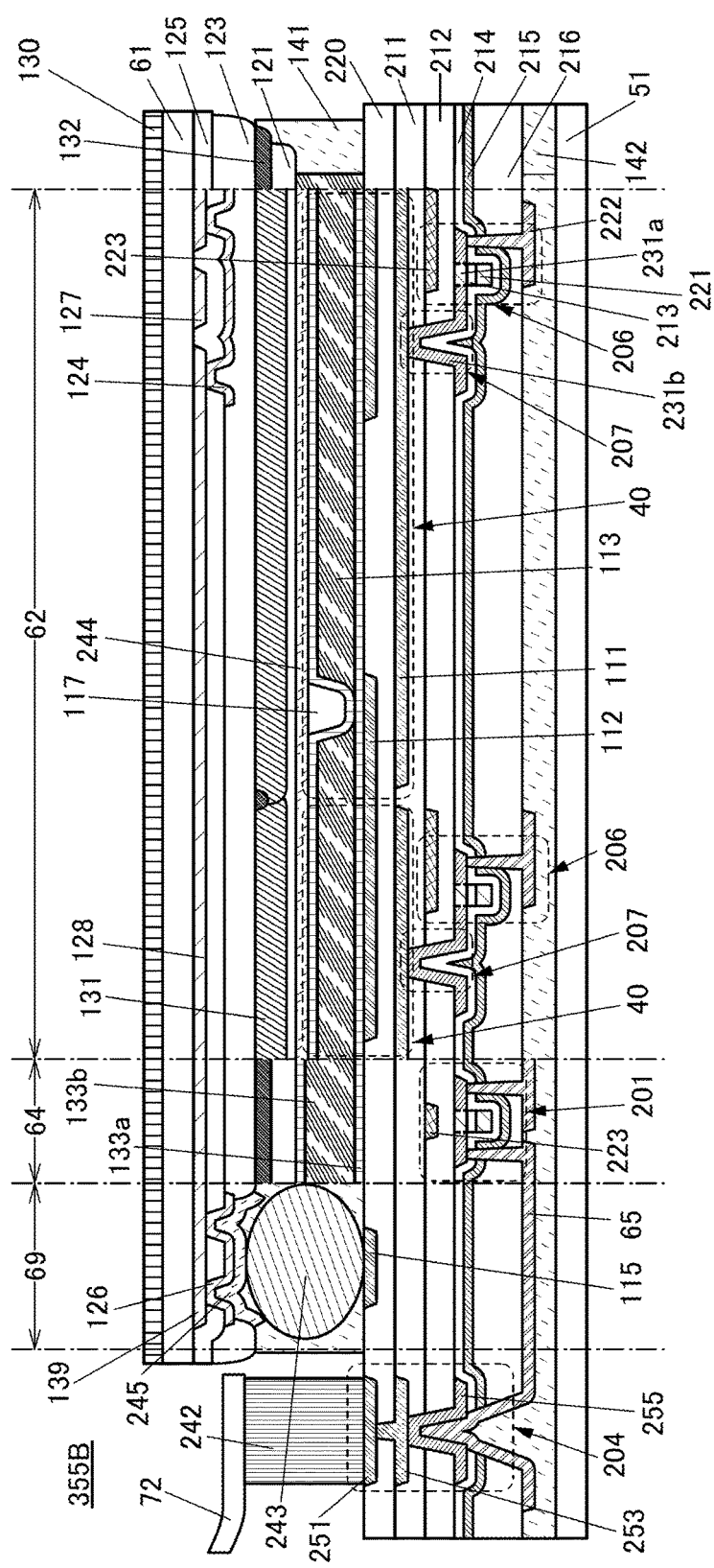
FIG. 29 is a cross-sectional view illustrating an example of a touch panel.

Examples of the touch panel are illustrated in each of the FIGS. 28A to 28C and FIG. 29. FIG. 28A is a perspective view of a touch panel 355B. FIG. 28B is a developed view of the schematic perspective view of FIG. 28A. Note that for simplicity, FIGS. 28A and 28B illustrate only the major components. In FIG. 28B, the outlines of the substrate 61 are illustrated only in dashed lines. FIG. 29 is a cross-sectional view of the touch panel 355B.

The touch panel 355B is an in-cell touch panel that has a function of displaying an image and serves as a touch sensor.

The touch panel 355B has a structure in which electrodes constituting a sensor element and the like are provided only on the counter substrate. Such a structure can make the touch panel thinner and more lightweight or reduce the number of components within the touch panel, compared with a structure in which the display device and the sensor element are fabricated separately and then are bonded together.

In FIGS. 28A and 28B, an input device 376 is provided on the substrate 61. The wirings 138 and 139 and the like of the input device 376 are electrically connected to the FPC 72 included in the display device 379.

With the above structure, the FPCs connected to the touch panel 355B can be provided only on one substrate side (on the substrate 51 side in this embodiment). Although two or more FPCs may be attached to the touch panel 355B, it is preferable that the touch panel 355B be provided with one FPC 72 which has a function of supplying signals to both the display device 379 and the input device 376 as illustrated in FIGS. 28A and 28B, for the simplicity of the structure.

The IC 73 may include a function of driving the input device 376. Another IC that drives the input device 376 may be provided over the FPC 72. Alternatively, an IC that drives the input device 376 may be mounted on the substrate 51.

FIG. 29 is a cross-sectional view including a region that includes the FPC 72, a connection portion 69, the driver circuit portion 64, and the display portion 62, each of which are illustrated in FIG. 28A.

When the gate 223 is formed using a material that reflects visible light, the gate 223 of the transistor 206 can also serve as the reflective layer in the reflective region.

In the connection portion 69, one of the wiring 139 (or the wiring 138) and one of a conductive layer 115 are electrically connected through the connector 243.

The electrodes 124, 127 and 128 and the insulating layer 125 are provided between the substrate 61 and an insulating layer 123. The electrodes 127 and 128 are formed on the same plane. The insulating layer 125 is provided to cover the electrodes 127 and 128. The electrode 124 is electrically connected to two of the electrodes 128 that are provided on both sides of the electrode 127, through an opening provided in the insulating layer 125. The electrodes 124, 127, and 128 each transmit visible light. When these electrodes transmit visible light, each of the electrodes can be placed to overlap with the opening portion (the transmissive region or the reflective region) of a pixel, which is preferable because this can inhibit a reduction in aperture ratio. Note that each of the electrodes 124, 127, and 128 may be formed using a material that blocks visible light. In addition, a light-blocking layer is preferably provided between the electrode that blocks visible light and the substrate 61, so that the electrode is not seen by the user of the display device.

The touch panel 355B includes a conductive layer 244 between the overcoat 121 and the alignment film 133b. The conductive layer 244 can function as a second common electrode. A constant potential is supplied to the conductive layer 244.

The conductive layer 244 and the common electrode 112 are preferably supplied with the same potential. The conductive layer 244 and the common electrode 112 may be connected to different power supply lines and supplied with potentials independently. The conductive layer 244 may be electrically connected to the common electrode 112. For example, the conductive layer 244 and the common electrode 112 can be electrically connected to each other through a connector as in the connection portion 69.

As the resolution of the display device become higher, the distance between the subpixels become shorter, resulting in an alignment defect of the liquid crystal becoming more likely. The display device of one embodiment of the present invention is capable of applying a voltage between the conductive layer 244 and the pixel electrode 111, in addition to applying a voltage between the common electrode 112 and the pixel electrode 111. Thus, the alignment condition of the liquid crystal layer 113 can be more reliably controlled.

The wiring 139 that is obtained by processing the same conductive layer as the electrodes 127 and 128 is connected to the conductive layer 126 that is obtained by processing the same conductive layer as the electrode 124. The conductive layer 126 is connected to a conductive layer 245, which is obtained by processing the same conductive layer as the conductive layer 244. The conductive layer 245 is electrically connected to the conductive layer 115 through the connector 243.

The touch panel 355B is supplied with a signal for driving a pixel and a signal for driving a sensor element from one FPC. Thus, the touch panel 355B can easily be incorporated into an electronic device and allows a reduction in the number of components.

1-9. Structure Example 6 of the Display Device

Figure 30:
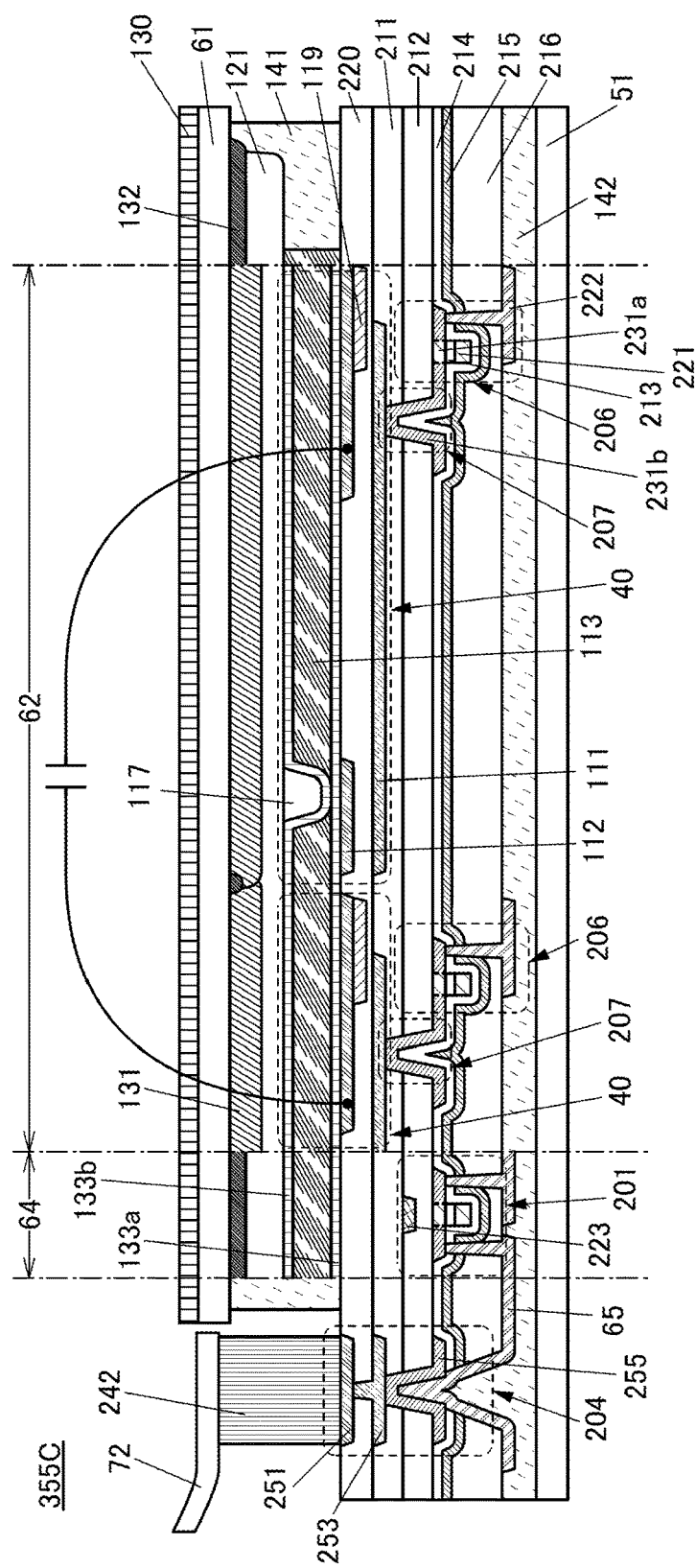
FIG. 30 is a cross-sectional view illustrating an example of a touch panel.

FIG. 30 illustrates an example of the touch panel. FIG. 30 is a cross-sectional view of a touch panel 355C.

The touch panel 355C is an in-cell touch panel that has a function of displaying an image and serves as a touch sensor.

The touch panel 355C has a structure in which electrodes constituting a sensor element and the like are provided only on a substrate that supports a display element. Such a structure can make the touch panel thinner and more lightweight and reduce the number of components within the touch panel, compared with a structure in which the display device and the sensor element are fabricated separately and then are bonded together, or a structure in which the sensor element is fabricated on the counter substrate side.

The touch panel 355C illustrated in FIG. 30 includes an auxiliary wiring 119, in addition to the structure of the display device 105D described above. The transistor 206 does not include the gate 223.

The auxiliary wiring 119 is electrically connected to the common electrode 112. By providing an auxiliary wiring that is electrically connected to the common electrode, a drop in voltage due to the resistance of the common electrode can be inhibited. In addition, when a stacked structure of a conductive layer including a metal oxide and a conductive layer including a metal is used, these conductive layers are formed preferably by a patterning technique using a half tone mask, thereby simplifying the fabrication process.

The auxiliary wiring 119 is a film with smaller resistance than the common electrode 112. For example, the auxiliary wiring 119 can be formed to have a single-layer structure or a stacked structure using any of metal materials such as molybdenum, titanium, chromium, tantalum, tungsten, aluminum, copper, silver, neodymium, and scandium, and an alloy material containing any of these elements.

In the touch panel 355, the auxiliary wiring 119 preferably reflects visible light. The auxiliary wiring 119 that reflects visible light can also serve as a reflective layer in the reflective region.

FIG. 30 is a cross-sectional view that includes two adjacent subpixels. The two subpixels illustrated in FIG. 30 are subpixels included in different pixels.

The touch panel 355C illustrated in FIG. 30 is capable of sensing an approach or a contact or the like of an object utilizing the capacitance formed between the common electrode 112 included in the left subpixel and the common electrode 112 included in the right subpixel. That is, in the touch panel 355C, the common electrode 112 serves as both the common electrode of the liquid crystal element and the electrode of the sensor element.

As described above, an electrode constituting a part of the liquid crystal element also serves as an electrode constituting a part of the sensor element in the touch panel of one embodiment of the present invention; thus, the manufacturing process can be simplified and the manufacturing cost can be reduced. Furthermore, the touch panel can be made thin and lightweight.

The common electrode 112 is electrically connected to the auxiliary wiring 119. By providing the auxiliary wiring 119, a resistance of the electrodes of the sensor element can be reduced. As the resistance of the electrodes of the sensor element is reduced, the time constant of the electrode of the sensor element can be made small. When the time constant of the electrode of the sensor element is smaller, the detection sensitivity can be increased, which enables an increase in detection accuracy.

For example, the time constant of the electrode of the sensor element is greater than 0 seconds and less than or equal to $1\times10^{-4}$ seconds, preferably greater than 0 seconds and less than or equal to $5\times10^{-5}$ seconds, further preferably greater than 0 seconds and less than or equal to $5\times10^{-6}$ seconds, further preferably greater than 0 seconds and less than or equal to $5\times10^{-7}$ seconds, and further preferably greater than 0 seconds and less than or equal to $2\times10^{-7}$ seconds. In particular, when the time constant is smaller than or equal to $1\times10^{-6}$ seconds, high detection sensitivity can be achieved while the influence of noise is reduced.

The signal for driving a pixel and the signal for driving a sensor element may be supplied to the touch panel 355C by one FPC. Thus, the touch panel 355C can easily be incorporated into an electronic device and allows a reduction in the number of components.

Example of the operation method of the touch panel 355C and the like are described below.

Figure 31A:
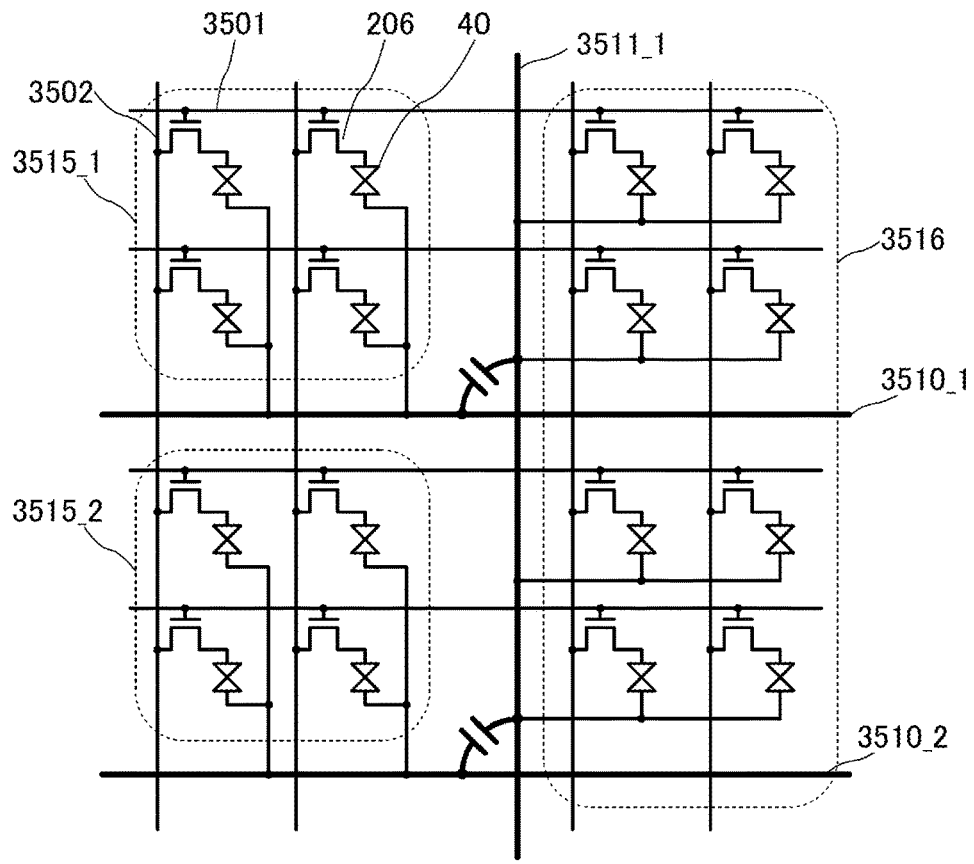
FIGS. 31A and 31B each illustrate an example of a sensing element and pixels.

FIG. 31A is an equivalent circuit diagram of part of a pixel circuit provided in the display portion 62 of the touch panel 355C.

Each pixel includes at least the transistor 206 and the liquid crystal element 40. A gate of the transistor 206 is electrically connected to a wiring 3501. One of a source and a drain of the transistor 206 is electrically connected to a wiring 3502.

The pixel circuit includes a plurality of wirings extending in the X direction (e.g., a wiring 3510_1 and a wiring 3510_2) and a plurality of wirings extending in the Y direction (e.g., a wiring 3511_1). They are provided to intersect with each other, and capacitance is formed therebetween.

Among the pixels provided in the pixel circuit, electrodes of the liquid crystal elements of some pixels adjacent to each other are electrically connected to each other to form one block. The block is classified into two types: an island-shaped block (e.g., a block 3515_1 or a block 3515_2), and a linear block extending in the X direction or the Y direction (e.g., a block 3516 extending in the Y direction). Note that only part of the pixel circuit is illustrated in FIG. 31A, and in reality, these two types of blocks are repeatedly arranged in the X direction and the Y direction. An electrode on one side of the liquid crystal element is, for example, a common electrode. An electrode on the other side of the liquid crystal element is, for example, a pixel electrode.

The wiring 3510_1 (or the wiring 3510_2) extending in the X direction is electrically connected to the island-shaped block 3515_1 (or the block 3515_2). Although not illustrated, the wiring 3510_1 extending in the X direction is electrically connected to a plurality of the island-shaped blocks 3515_1 which are provided discontinuously along the X direction with the linear blocks therebetween. Furthermore, the wiring 3511_1 extending in the Y direction is electrically connected to the linear block 3516.

Figure 31B:
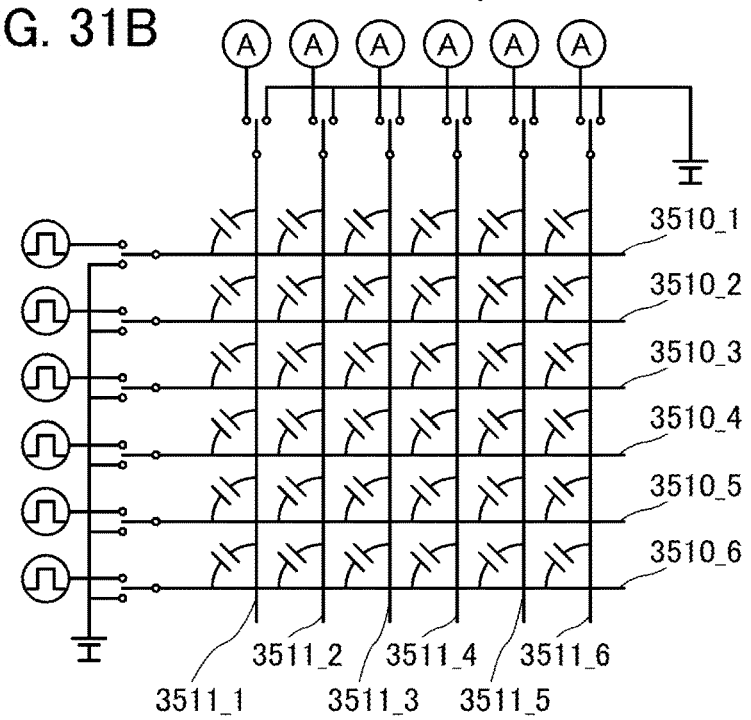

FIG. 31B is an equivalent circuit diagram illustrating the connection relation between a plurality of wirings extending in the X direction (the wirings 3510_1 to 3510_6 are collectively called a wiring 3510 in some cases) and a plurality of wirings extending in the Y direction (wirings 3511_1 to 3511_6 are collectively called a wiring 3511 in some cases). A common potential can be input to each of the wirings 3510 extending in the X direction and each of the wirings 3511 extending in the Y direction. A pulse voltage can be input to each of the wirings 3510 extending in the X direction from a pulse voltage output circuit. Furthermore, each of the wirings 3511 extending in the Y direction can be electrically connected to the sensing circuit. Note that the wiring 3510 and the wiring 3511 can be interchanged with each other.

An example of an operation method of the touch panel 355C is described with reference to FIGS. 32A and 32B.

Here, one frame period is divided into a writing period and a sensing period. The writing period is a period in which image data is written to a pixel, and the wirings 3501 (also referred to as gate lines or scan lines) are sequentially selected. The sensing period is a period in which sensing is performed by the sensor element.

Figure 32A:
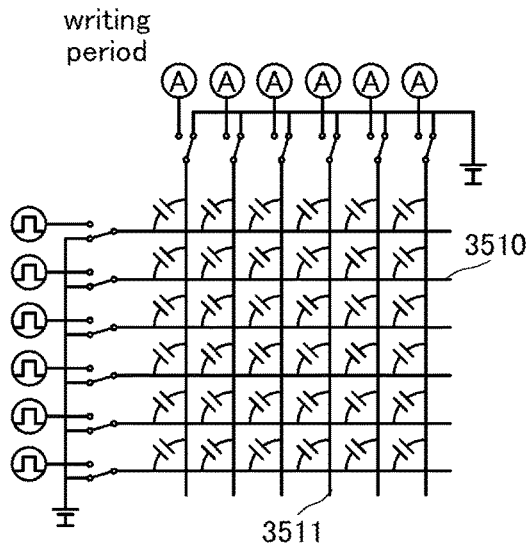
FIGS. 32A to 32E illustrate an example of an operation of a sensing element and pixels.

FIG. 32A is an equivalent circuit diagram in the writing period. In the wiring period, a common potential is input to both the wiring 3510 extending in the X direction and the wiring 3511 extending in the Y direction.

Figure 32B:
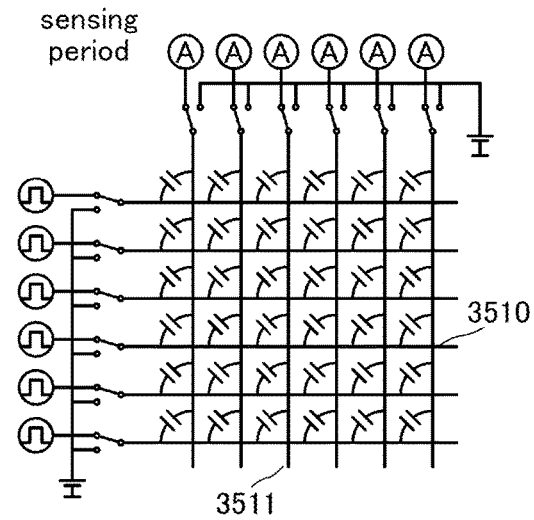

FIG. 32B is an equivalent circuit diagram in the sensing period. In the sensing period, each of the wirings 3511 extending in the Y direction is electrically connected to the detection circuit. Furthermore, a pulse voltage is input to the wirings 3510 extending in the X direction from a pulse voltage output circuit.

Figure 32C:
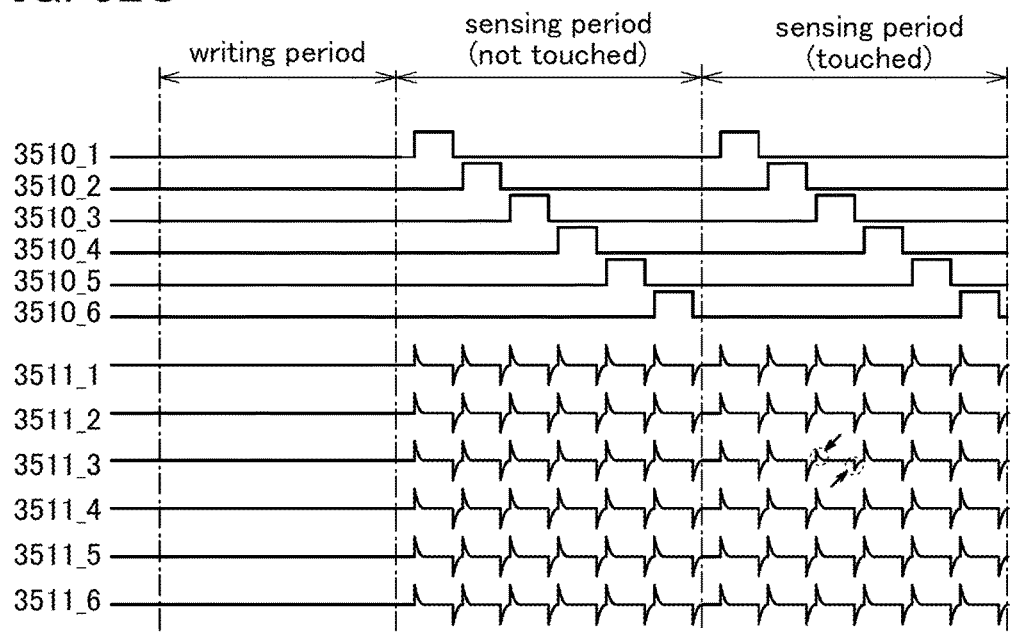

FIG. 32C illustrates an example of a timing chart of the input and output waveforms of a mutual capacitive sensor element.

In FIG. 32C, sensing of an object is performed in all rows and columns in one frame period. FIG. 32C shows two cases in the sensing period: a case in which an object is not sensed (not touched) and a case in which an object is sensed (touched).

A pulse voltage is supplied to the wirings 3510_1 to 3510_6 from the pulse voltage output circuit. When the pulse voltage is applied to the wirings 3510_1 to 3510_6, an electric field is generated between a pair of electrodes forming a capacitor, and current flows in the capacitor. The electric field generated between the electrodes is changed by being blocked by the touch of a finger or a stylus, for example. That is, the capacitance value of the capacitor is changed by touch or the like. By utilizing this, an approach or contact of an object can be sensed.

The wirings 3511_1 to 3511_6 are connected to the detection circuit for detecting the change in current in the wirings 3511_1 to 3511_6 caused by the change in capacitance value of the capacitor. The current value detected in the wirings 3511_1 to 3511_6 is not changed when there is no approach or contact of an object, and is decreased when the capacitance value is decreased because of the approach or contact of an object. In order to detect a change in current, the total amount of current may be detected. In that case, an integrator circuit or the like may be used to detect the total amount of current. Alternatively, the peak current value may be detected. In that case, current may be converted into voltage, and the peak voltage value may be detected.

Note that in FIG. 32C, the waveforms of the wirings 3511_1 to 3511_6 show voltage values corresponding to the detected current values. As illustrated in FIG. 32C, the timing of the display operation is preferably in synchronization with the timing of the sensing operation.

The waveforms of the wirings 3511_1 to 3511_6 change in accordance with pulse voltages applied to the wirings 3510_1 to 3510_6. When there is no approach or contact of an object, the waveforms of the wirings 3511_1 to 3511_6 uniformly change in accordance with changes in the voltages of the wirings 3510_1 to 3510_6. On the other hand, the current value is decreased at the point of approach or contact of an object and accordingly the waveform of the voltage value changes.

By detecting a change in capacitance in this manner, the approach or contact of an object can be detected. Even when an object such as a finger or a stylus does not touch but only approaches a touch panel, a signal may be detected in some cases.

Note that FIG. 32C illustrates an example in which a common potential supplied in the writing period is equal to a low potential supplied in the sensing period in the wiring 3510; however, one embodiment of the present invention is not limited thereto. The common potential may be different from the low potential.

It is preferable that, as an example, the pulse voltage output circuit and the detection circuit are formed in one IC. For example, the IC is preferably mounted on a touch panel or a substrate in a housing of an electronic device. In the case where the touch panel has flexibility, parasitic capacitance can potentially be increased in a bent portion of the touch panel, and the influence of noise can potentially be increased. In view of this, an IC with a driving method less influenced by noise is preferably used. For example, it is preferable to use an IC to which a driving method capable of increasing a signal-noise ratio (S/N ratio) is applied.

It is preferable that a period in which an image is written and a period in which sensing is performed by a sensor element are separately provided as described above. Thus, a decrease in sensitivity of the sensor element caused by noise generated when data is written to a pixel can be suppressed.

Figure 32D:
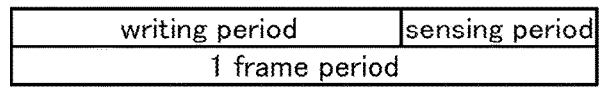
Figure 32E:
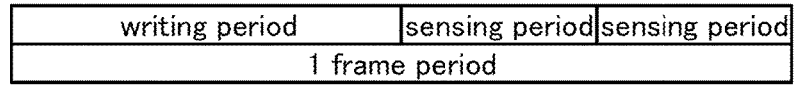

In one embodiment of the present invention, as illustrated in FIG. 32D, one frame period includes one writing period and one sensing period. Alternatively, as shown in FIG. 32E, two sensing periods may be included in one frame period. When a plurality of detection periods are included in one frame period, the detection sensitivity can be further increased. For example, two to four sensing periods may be included in one frame period.

Next, a structure example of the top surface of the sensor element included in the touch panel 355C is described with reference to FIGS. 33A to 33C.

Figure 33A:
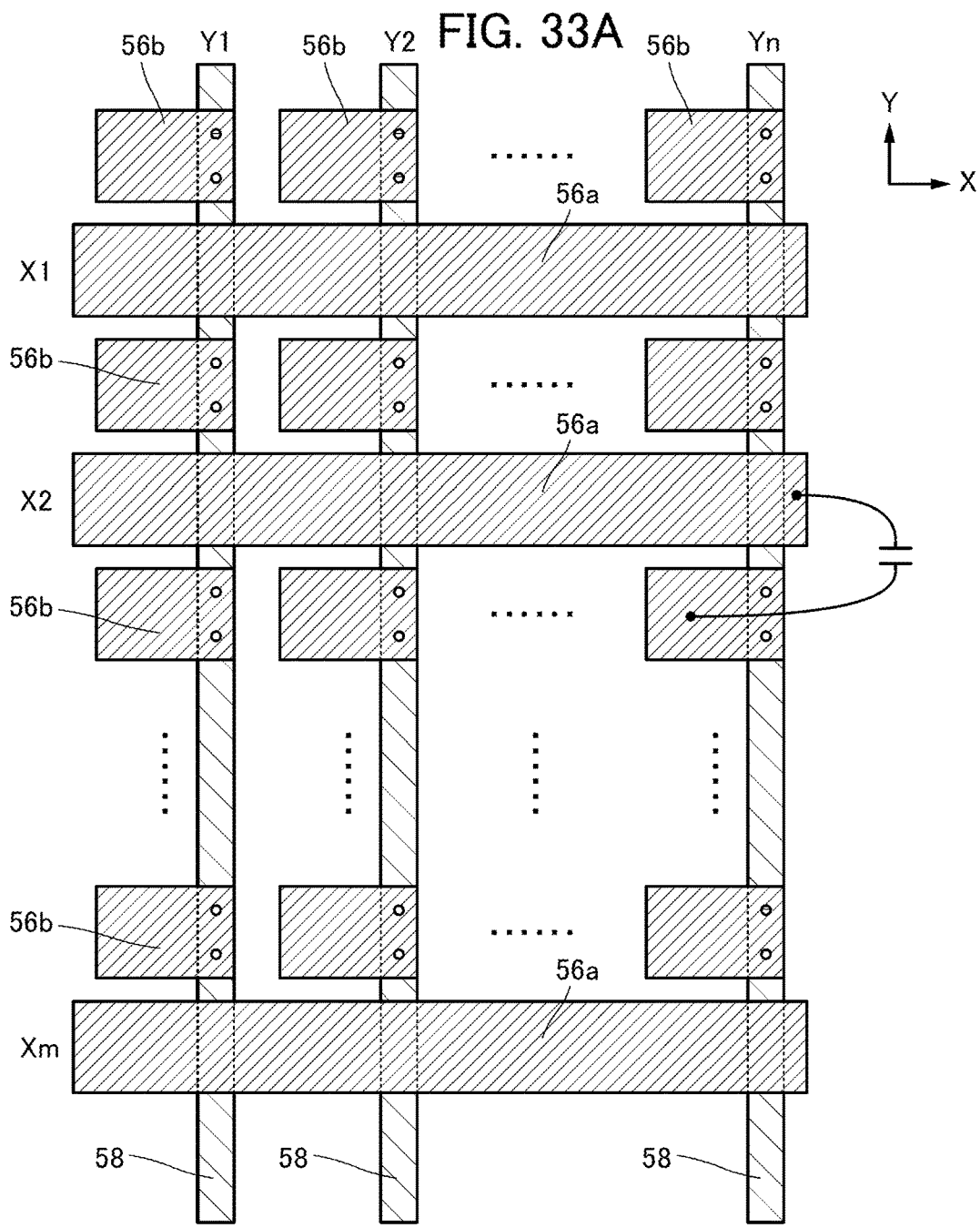
FIGS. 33A to 33C are top views illustrating an example of a sensing element and a pixel.

FIG. 33A shows a top view of the sensor element. The sensor element includes a conductive layer 56a and a conductive layer 56b. The conductive layer 56a serves as one electrode of the sensor element, and the conductive layer 56b serves as the other electrode of the sensor element. The sensor element can sense an approach or contact or the like of an object utilizing the capacitance that is formed between the conductive layers 56a and 56b. Although not illustrated, the conductive layers 56a and 56b may have a top-surface shape that has a comb-like shape or that is provided with a slit.

In one embodiment of the present invention, the conductive layers 56a and 56b also serve as the common electrode of the liquid crystal element.

A plurality of conductive layers 56a are provided in the Y direction and extend in the X direction. A plurality of conductive layers 56b provided in the Y direction are electrically connected to each other via a conductive layer 58 extending in the Y direction. FIG. 33A illustrates an example in which m conductive layers 56a and n conductive layers 58 are provided.

Note that the plurality of conductive layers 56a may be provided in the X direction and in that case, may extend in the Y direction. The plurality of conductive layers 56b provided in the X direction may be electrically connected to each other via the conductive layer 58 extending in the X direction.

Figure 33B:
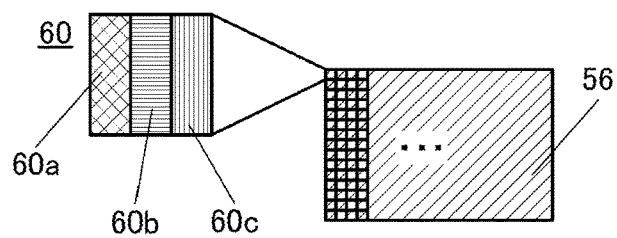
Figure 33C:
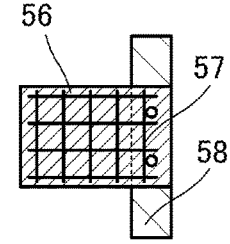

As illustrated in FIG. 33B, a conductive layer 56 serving as an electrode of the sensor element is provided over a plurality of pixels 60. The conductive layer 56 corresponds to each of the conductive layers 56a and 56b in FIG. 33A. The pixel 60 is formed of a plurality of subpixels exhibiting different colors. FIG. 33B shows an example in which the pixel 60 is formed of three subpixels, subpixels 60a, 60b, and 60c.

A pair of electrodes of the sensor element is preferably electrically connected to respective auxiliary wirings. The conductive layer 56 may be electrically connected to an auxiliary wiring 57, as illustrated in FIG. 33C. Note that FIG. 33C illustrates an example in which the auxiliary wirings are stacked over the conductive layers; however, the conductive layers may be stacked over the auxiliary wirings. The plurality of conductive layers 56 provided in the X direction may be electrically connected to the conductive layer 58 through the auxiliary wiring 57.

The resistivity of the conductive layer that transmits visible light is relatively high in some cases. Thus, the resistance of the pair of electrodes of the sensor element is preferably lowered by electrically connecting the pair of electrodes of the sensor element to the auxiliary wiring.

When the resistance of the pair of electrodes of the sensor element is lowered, the time constant of the pair of electrodes can be small. Accordingly, the detection sensitivity of the sensor element can be increased; furthermore, the detection accuracy of the sensor element can be increased.

In the liquid crystal display device of one embodiment of the present invention, the low-resistance region of the semiconductor layer and the pixel electrode of the liquid crystal element are directly connected to each other and positioned in the transmissive region or the reflective region. In the liquid crystal display device of one embodiment of the present invention, at least one of the scan line and the signal line is positioned in the reflective region. The contact area and at least one of the scan line and the signal line can be provided in a portion of the display device that contributes to display, whereby the aperture ratio of the display device can be increased. Furthermore, the display device can have high resolution.

This embodiment can be combined with any of other embodiments as appropriate.

Embodiment 2

In this embodiment, a semiconductor device is described. Specifically, a transistor that can be used for the display device of one embodiment of the present invention and a method for manufacturing the transistor is described with reference to FIG. 34A to FIG. 43C.

2-1. Structure Example 1 of Transistor

Figure 34A:
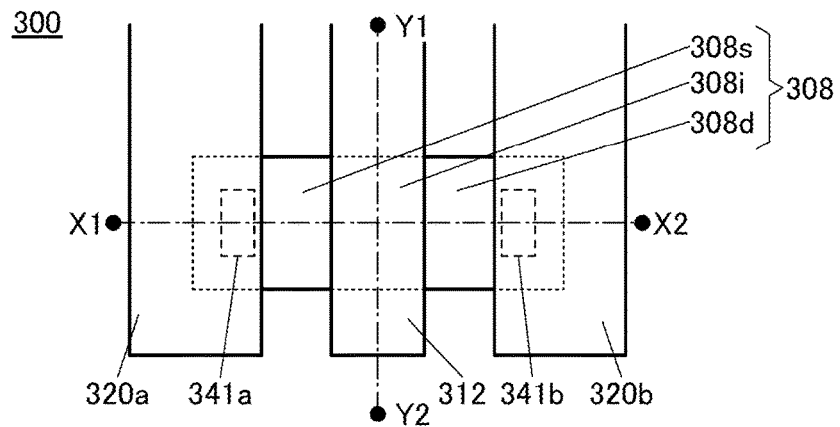
FIGS. 34A to 34C are a top view and cross-sectional views illustrating an example of the semiconductor device.
Figure 34B:
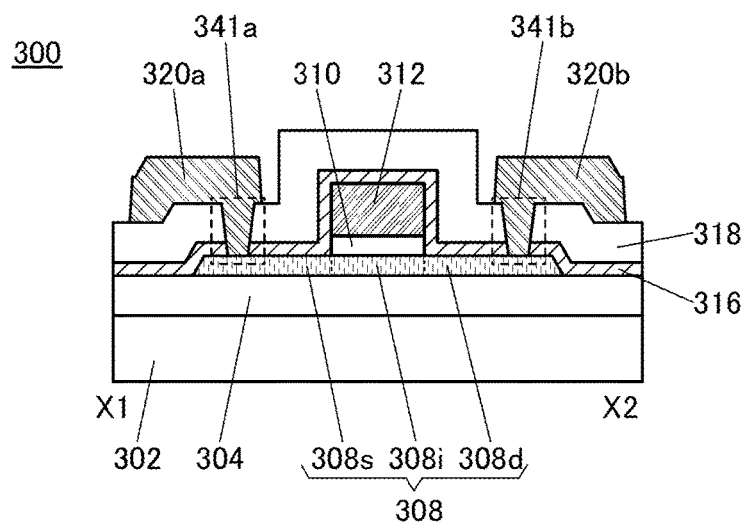
Figure 34C:
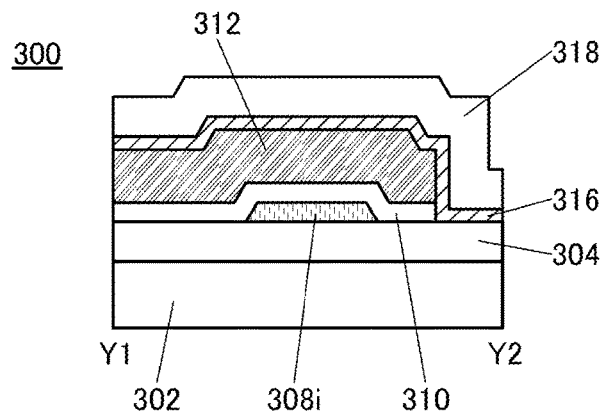

FIGS. 34A to 34C each show an example of a transistor. The transistor illustrated in FIGS. 34A to 34C has a staggered (top-gate) structure.

FIG. 34A is a top view of a transistor 300. FIG. 34B is a cross-sectional view taken along dashed-dotted line X1-X2 in FIG. 34A. FIG. 34C is a cross-sectional view taken along dashed-dotted line Y1-Y2 in FIG. 34A. For clarity, FIG. 34A does not illustrate some components such as an insulating layer 310. As in FIG. 34A, some components are not illustrated in some cases in top views of transistors described below. Furthermore, the direction of dashed-dotted line X1-X2 may be referred to as a channel length (L) direction, and the direction of dashed-dotted line Y1-Y2 may be referred to as a channel width (W) direction.

The transistor 300 illustrated in FIGS. 34A to 34C includes an insulating layer 304 over a substrate 302, an oxide semiconductor layer 308 over the insulating layer 304, the insulating layer 310 over the oxide semiconductor layer 308, a conductive layer 312 over the insulating layer 310, and an insulating layer 316 over the insulating layer 304, the oxide semiconductor layer 308, and the conductive layer 312. The oxide semiconductor layer 308 includes a channel region 308i that overlaps with the conductive layer 312, a source region 308s that is in contact with the insulating layer 316, and a drain region 308d that is in contact with the insulating layer 316. The resistivity of the source region 308s is lower than that of the channel region 308i. The resistivity of the drain region 308d is lower than that of the channel region 308i.

The insulating layer 316 contains nitrogen or hydrogen. The insulating layer 316 is in contact with the source region 308s and the drain region 308d, so that nitrogen or hydrogen that is contained in the insulating layer 316 is added to the source region 308s and the drain region 308d. The carrier densities in the source region 308s and the drain region 308d are higher when nitrogen or hydrogen is added thereto.

The transistor 300 may further include an insulating layer 318 over the insulating layer 316, a conductive layer 320a electrically connected to the source region 308s through an opening portion 341a provided in the insulating layers 316 and 318, and a conductive layer 320b electrically connected to the drain region 308d through an opening portion 341b provided in the insulating layers 316 and 318.

The conductive layer 312 functions as a gate electrode, the conductive layer 320a functions as a source electrode, and the conductive layer 320b functions as a drain electrode.

The insulating layer 310 functions as a gate insulating layer. The insulating layer 310 includes an excess oxygen region. When the insulating layer 310 includes the excess oxygen region, excess oxygen can be supplied to the channel region 308i included in the oxide semiconductor layer 308. A highly reliable semiconductor device can be provided, as oxygen vacancies that can potentially be formed in the channel region 308i can be filled with excess oxygen.

To supply excess oxygen to the oxide semiconductor layer 308, excess oxygen may be supplied to the insulating layer 304 that is formed under the oxide semiconductor layer 308. However, in this case, excess oxygen contained in the insulating layer 304 can potentially also be supplied to the source region 308s and the drain region 308d included in the oxide semiconductor layer 308. When excess oxygen is supplied to the source region 308s and the drain region 308d, the resistance of the source region 308s and the drain region 308d can potentially be increased.

In contrast, in the structure in which the insulating layer 310 formed over the oxide semiconductor layer 308 contains excess oxygen, excess oxygen can be selectively supplied only to the channel region 308i. Alternatively, the carrier density of the source and drain regions 308s and 308d can selectively be increased after excess oxygen is supplied to the channel region 308i and the source and drain regions 308s and 308d, in which case an increase in the resistance of the source and drain regions 308s and 308d can be prevented.

Each of the source region 308s and the drain region 308d included in the oxide semiconductor layer 308 preferably contains an element that forms an oxygen vacancy or an element that is bonded to an oxygen vacancy. Typical examples of the element that forms an oxygen vacancy or the element that is bonded to an oxygen vacancy include hydrogen, boron, carbon, nitrogen, fluorine, phosphorus, sulfur, chlorine, titanium, and a rare gas. Typical examples of the rare gas element include helium, neon, argon, krypton, and xenon. In the case where the insulating layer 316 contains one or more of the elements that form an oxygen vacancy, such an element is diffused from the insulating layer 316 to the source region 308s and the drain region 308d. In addition or alternatively, the element that forms an oxygen vacancy is added to the source region 308s and the drain region 308d by impurity addition treatment.

When an impurity element is added to the oxide semiconductor layer, a bond between a metal element and oxygen in the oxide semiconductor layer is cut, so that an oxygen vacancy is formed. Alternatively, when the impurity element is added to the oxide semiconductor layer, oxygen bonded to a metal element in the oxide semiconductor layer is bonded to the impurity element, and the oxygen is released from the metal element, whereby an oxygen vacancy is formed. As a result, the oxide semiconductor layer has a higher carrier density and thus the conductivity thereof becomes higher.

Next, details of the components of the semiconductor device in FIGS. 34A to 34C is described.

As the substrate 302, any of a variety of substrates can be used without particular limitation. A material similar to the material used in the substrates 51 and 61 and described in Embodiment 1 and the like can be used as a material for the substrate 302.

The insulating layer 304 can be formed by a sputtering method, a CVD method, a vapor deposition method, a PLD method, a printing method, a coating method, or the like as appropriate. For example, the insulating layer 304 can be formed to have a single-layer structure or stacked structure of an oxide insulator and/or a nitride insulator. Note that an oxide insulating layer is preferably used for at least a region of the insulating layer 304 that is in contact with the oxide semiconductor layer 308, in order to improve characteristics of the interface with the oxide semiconductor layer 308. When the insulating layer 304 is formed using an oxide insulator that releases oxygen by heating, oxygen contained in the insulating layer 304 can be moved to the oxide semiconductor layer 308 by heat treatment.

The thickness of the insulating layer 304 is greater than or equal to 50 nm, greater than or equal to 100 nm and less than or equal to 3000 nm, or greater than or equal to 200 nm and less than or equal to 1000 nm. When the insulating layer 304 is thick, the amount of oxygen released from the insulating layer 304 can be increased, and the interface state at the interface between the insulating layer 304 and the oxide semiconductor layer 308 and oxygen vacancy included in the channel region 308i of the oxide semiconductor layer 308 can be reduced.

The insulating layer 304 can be formed with a single-layer structure or a stack structure using, for example, silicon oxide, silicon oxynitride, silicon nitride oxide, silicon nitride, aluminum oxide, hafnium oxide, gallium oxide, or a Ga—Zn oxide. In this embodiment, the insulating layer 304 has a stacked structure of a silicon nitride film and a silicon oxynitride film. With the insulating layer 304 having a stacked structure including a silicon nitride film as a lower layer and a silicon oxynitride film as an upper layer, oxygen can be efficiently introduced into the oxide semiconductor layer 308.

The oxide semiconductor layer 308 can be formed using a material similar to that of the oxide semiconductor layer described in Embodiment 1.

The insulating layer 310 functions as a gate insulating layer of the transistor 300. In addition, the insulating layer 310 has a function of supplying oxygen to the oxide semiconductor layer 308, particularly to the channel region 308i. For example, the insulating layer 310 can be formed with a single-layer structure or a stacked structure of an oxide insulating layer or a nitride insulating layer. Note that at least an oxide insulating layer is used to form a region of the insulating layer 310 in contact with the oxide semiconductor layer 308, to improve the characteristics of the interface between the oxide semiconductor layer 308 and the insulating layer 310. Materials such as silicon oxide, silicon oxynitride, silicon nitride oxide, or silicon nitride can be used for the insulating layer 310.

The thickness of the insulating layer 310 can be greater than or equal to 5 nm and less than or equal to 400 nm, greater than or equal to 5 nm and less than or equal to 300 nm, or greater than or equal to 10 nm and less than or equal to 250 nm.

It is preferable that the insulating layer 310 have few defects and typically have as few signals observed by electron spin resonance (ESR) spectroscopy as possible. Examples of the signals include a signal due to an E' center observed at a g-factor of 2.001. Note that the E' center is due to the dangling bond of silicon. As the insulating layer 310, a silicon oxide film or a silicon oxynitride film whose spin density of a signal due to the E' center is lower than or equal to $3 \times 10^{17}$ spins/cm$^3$ and preferably lower than or equal to $5 \times 10^{16}$ spins/cm$^3$ is suitable.

In addition to the signal described above, a signal originating from nitrogen dioxide ($NO_2$) is observed in the insulating layer 310 in some cases. The signal is divided into three signals according to the N nuclear spin; a first signal, a second signal, and a third signal. The first signal is observed at a g-factor of greater than or equal to 2.037 and less than or equal to 2.039. The second signal is observed at a g-factor of greater than or equal to 2.001 and less than or equal to 2.003. The third signal is observed at a g-factor of greater than or equal to 1.964 and less than or equal to 1.966.

It is suitable to use an insulating film whose spin density of a signal due to nitrogen dioxide ($NO_2$) is higher than or equal to $1 \times 10^{17}$ spins/cm$^3$ and lower than $1 \times 10^{18}$ spins/cm$^3$ as the insulating layer 310, for example.

Note that a nitrogen oxide ($NO_x$) such as nitrogen dioxide ($NO_2$) forms a state in the insulating layer 310. The state is positioned in the energy gap of the oxide semiconductor layer 308. Thus, when nitrogen oxide ($NO_x$) is diffused to the interface between the insulating layer 310 and the oxide semiconductor layer 308, an electron can potentially be trapped by the level on the insulating layer 310 side. As a result, the trapped electrons remain in the vicinity of the interface between the insulating layer 310 and the oxide semiconductor layer 308; thus, the threshold voltage of the transistor is shifted in the positive direction. Therefore, a shift in the threshold voltage of the transistor can be reduced when a film with a low nitrogen oxide content is used as the insulating layer 310.

As an insulating layer that releases little nitrogen oxide ($NO_x$), for example, a silicon oxynitride film can be used. The silicon oxynitride film is a film of which the amount of released ammonia is larger than the amount of released nitrogen oxide ($NO_x$) in thermal desorption spectroscopy (TDS); the typical amount of released ammonia is greater than or equal to $1 \times 10^{18}$/cm$^3$ and less than or equal to $5 \times 10^{19}$/cm$^3$. Note that the released amount of ammonia is the total amount of ammonia released by heat treatment in a range from 50° C. to 650° C. or a range from 50° C. to 550° C. in TDS.

Since nitrogen oxide ($NO_x$) reacts with ammonia and oxygen in heat treatment, the use of an insulating film that releases a large amount of ammonia reduces nitrogen oxide ($NO_x$).

Note that the nitrogen concentration within the insulating layer 310, which is measured by secondary ion mass spectrometry (SIMS), is preferably lower than or equal to $6 \times 10^{20}$ atoms/cm$^3$.

Alternatively, the insulating layer 310 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), or hafnium oxide. The use of such a high-k material enables a reduction in gate leakage current of a transistor.

The insulating layer 316 contains nitrogen or hydrogen. The insulating layer 316 may contain fluorine. As the insulating layer 316, for example, a nitride insulating layer can be used. The nitride insulating layer can be formed using silicon nitride, silicon nitride oxide, silicon oxynitride, silicon nitride fluoride, silicon fluoronitride, or the like. The hydrogen concentration in the insulating layer 316 is preferably higher than or equal to $1 \times 10^{22}$ atoms/cm$^3$. The insulating layer 316 is in contact with the source region 308s and the drain region 308d of the oxide semiconductor layer 308. Thus, the concentration of an impurity (nitrogen or hydrogen) in the source region 308s and the drain region 308d in contact with the insulating layer 316 is increased, leading to an increase in the carrier density of the source region 308s and the drain region 308d.

As the insulating layer 318, for example, an oxide insulating layer can be used. Alternatively, a stack including an oxide insulating layer and a nitride insulating layer can be used as the insulating layer 318. For the insulating layer 318, silicon oxide, silicon oxynitride, silicon nitride oxide, aluminum oxide, hafnium oxide, gallium oxide, or a Ga—Zn oxide can be used, for example.

The insulating layer 318 is preferably a film functioning as a barrier film against hydrogen, water, or the like from the outside.

The thickness of the insulating layer 318 can be greater than or equal to 30 nm and less than or equal to 500 nm, or greater than or equal to 100 nm and less than or equal to 400 nm.

The conductive layers 312, 320a and 320b can be formed by a sputtering method, a vacuum evaporation method, a PLD method, a thermal CVD method, or the like. The conductive layers 312, 320a and 320b can be formed using a material similar to that of the conductive layer described in Embodiment 1.

Light-transmitting conductive materials such as ITO, indium oxide containing tungsten oxide, indium zinc oxide containing tungsten oxide, indium oxide containing titanium oxide, indium tin oxide containing titanium oxide, indium zinc oxide, or ITSO can be used for the conductive layers 312, 320a and 320b. Furthermore, the conductive layers 312, 320a, and 320b may have a stacked structure of the light-transmitting conductive material and the metal element, both of which are described above.

Note that an oxide semiconductor typified by an In—Ga—Zn oxide may be used for the conductive layer 312. The carrier density of the oxide semiconductor becomes high when nitrogen or hydrogen is supplied from the insulating layer 316. In other words, the oxide semiconductor functions as an oxide conductor (OC). Accordingly, the oxide semiconductor can be used for a gate electrode.

The conductive layer 312 can have, for example, a single-layer structure of an oxide conductor (OC), a single-layer structure of a metal film, or a stacked structure of an oxide conductor (OC) and a metal film.

Note that the use of a single-layer structure of a light-blocking metal film or a stacked structure of an oxide conductor (OC) and a light-blocking metal film is suitable for the conductive layer 312, as the channel region 308*i* formed under the conductive layer 312 can be shielded from light. In the case where the conductive layer 312 has a stacked structure of an oxide semiconductor or an oxide conductor (OC) and a light-shielding metal film, formation of a metal film (e.g., a titanium film or a tungsten film) over the oxide semiconductor or the oxide conductor (OC) produces any of the following effects: the resistance of the oxide semiconductor or the oxide conductor (OC) is reduced by the diffusion of the constituent element of the metal film to the oxide semiconductor or oxide conductor (OC) side, the resistance is reduced by damage (e.g., sputtering damage) during the deposition of the metal film, and the resistance is reduced when oxygen vacancies are formed by the diffusion of oxygen in the oxide semiconductor or the oxide conductor (OC) to the metal film.

The thickness of the conductive layers 312, 320*a* and 320*b* can be greater than or equal to 30 nm and less than or equal to 500 nm, or greater than or equal to 100 nm and less than or equal to 400 nm.

2-2. Structure Example 2 of Transistor

Next, structures of a transistor different from that in FIGS. 34A to 34C are described with reference to FIGS. 35A to 35C.

Figure 35A:
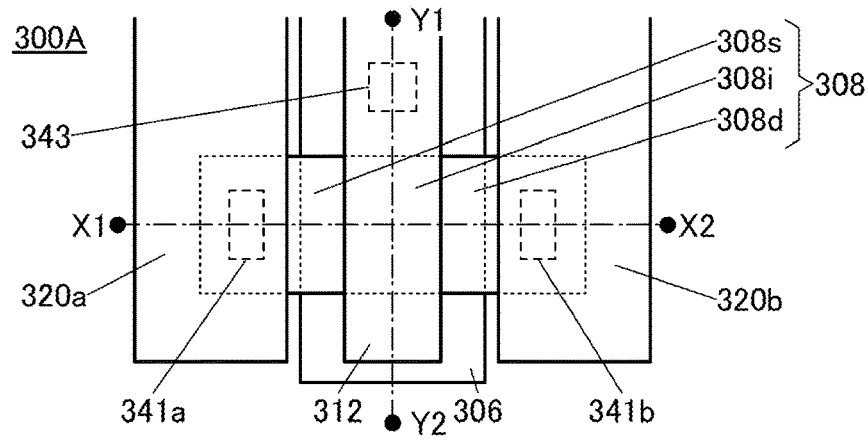
FIGS. 35A to 35C are a top view and cross-sectional views illustrating an example of the semiconductor device.

FIG. 35A is a top view of a transistor 300A. FIG. 35B is a cross-sectional view taken along dashed-dotted line X1-X2 in FIG. 35A. FIG. 35C is a cross-sectional view taken along dashed-dotted line Y1-Y2 in FIG. 35A.

Figure 35B:
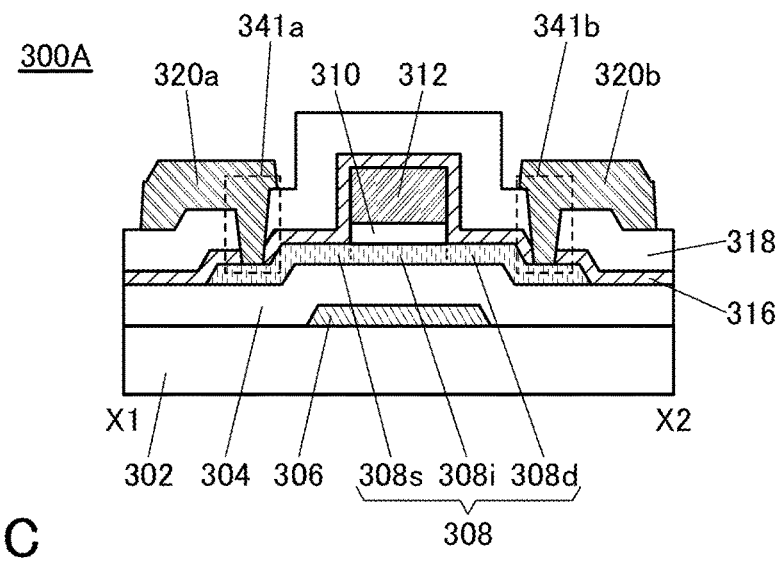
Figure 35C:
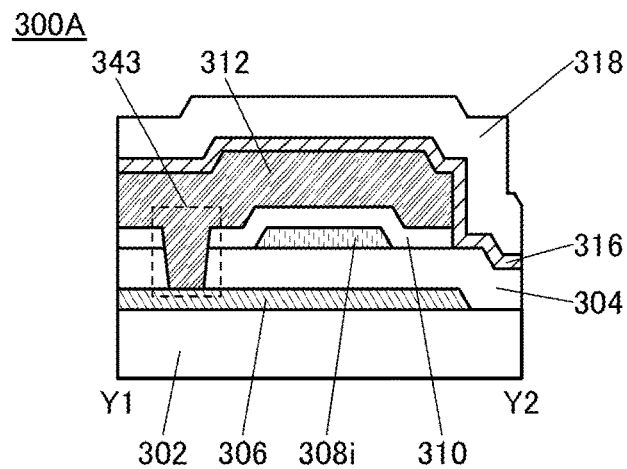

The transistor 300A illustrated in FIGS. 35A to 35C includes an conductive layer 306 over the substrate 302, the insulating layer 304 over the conductive layer 306, the oxide semiconductor layer 308 over the insulating layer 304, the insulating layer 310 over the oxide semiconductor layer 308, the conductive layer 312 over the insulating layer 310, and the insulating layer 316 over the insulating layer 304, the oxide semiconductor layer 308, and the conductive layer 312. The oxide semiconductor layer 308 includes the channel region 308*i* that overlaps with the conductive layer 312, the source region 308*s* that is in contact with the insulating layer 316, and the drain region 308*d* that is in contact with the insulating layer 316. The resistivity of the source region 308*s* is lower than that of the channel region 308*i*. The resistivity of the drain region 308*d* is lower than that of the channel region 308*i*.

The transistor 300A includes the conductive layer 306 and an opening portion 343 in addition to the components of the transistor 300 described above.

The opening portion 343 is provided in the insulating layers 304 and 310. The conductive layer 306 is electrically connected to the conductive layer 312 through the opening portion 343. Thus, the conductive layers 306 and 312 are supplied with the same potential. Note that different potentials may be applied to the conductive layers 306 and 312 without providing the opening portion 343. Alternatively, the conductive layer 306 may be used as a light-blocking layer without providing the opening portion 343. For example, light irradiating the channel region 308*i* from the bottom can be reduced by forming the conductive layer 306 with a light-blocking material.

In addition, when the structure of the transistor 300A is used, the conductive layer 306 serves as a first gate electrode (also referred to as a bottom-gate electrode), and the conductive layer 312 serves as a second gate electrode (also referred to as a top-gate electrode). Furthermore, the insulating layer 304 serves as a first gate insulating layer, and the insulating layer 310 serves as a second gate insulating layer.

A material similar to that of the conductive layers 312, 320*a*, and 320*b* described above can be used for the conductive layer 306. In particular, the conductive layer 306 is preferably formed with a material containing copper, as the use of such a material allows a reduction in resistivity. For example, each of the conductive layers 306, 320*a*, and 320*b* preferably has a stacked structure in which a copper film is provided over a titanium nitride film, a tantalum nitride film, or a tungsten film. In this case, parasitic capacitance generated between the conductive layer 306 and the conductive layer 320*a* and parasitic capacitance generated between the conductive layer 306 and the conductive layer 320*b* can be reduced by using the transistor 300A as a pixel transistor and/or a driving transistor of a display device. Thus, the conductive layers 306, 320*a*, and 320*b* can be used not only as the first gate electrode, the source electrode, and the drain electrode of the transistor 300A, but also as power source supply wirings, signal supply wirings, connection wirings, or the like of the display device.

In this manner, unlike the transistor 300 described above, the transistor 300A in FIGS. 35A to 35C has a structure in which a conductive layer functioning as a gate electrode is provided over and under the oxide semiconductor layer 308. As in the transistor 300A, the semiconductor device of one embodiment of the present invention may have a plurality of gate electrodes.

As illustrated in FIG. 35C, the oxide semiconductor layer 308 faces the conductive layers 306 and 312 that functions as first and second electrodes, respectively. The oxide semiconductor layer 308 is sandwiched between the conductive films that function as the two gate electrodes.

Furthermore, the length of the conductive layer 312 in the channel width direction is longer than the length of the oxide semiconductor layer 308 in the channel width direction. In the channel width direction, the entire oxide semiconductor layer 308 is covered with the conductive layer 312 with the insulating layer 310 placed therebetween. Since the conductive layer 312 is connected to the conductive layer 306 through the opening portion 343 provided in the insulating layers 304 and 310, a side surface of the oxide semiconductor layer 308 in the channel width direction faces the conductive layer 312 with the insulating layer 310 placed therebetween.

In other words, in the channel width direction of the transistor 300A, the conductive layers 306 and 312 are connected to each other through the opening portion 343 provided in the insulating layers 304 and 310, and the conductive layers 306 and 312 surround the oxide semiconductor layer 308 with the insulating layers 304 and 310 placed therebetween.

Such a structure enables the oxide semiconductor layer 308 included in the transistor 300A to be electrically surrounded by electric fields of the conductive layer 306 functioning as a first gate electrode and the conductive layer 312 functioning as a second gate electrode. A device structure of a transistor, like that of the transistor 300A, in which electric fields of a first gate electrode and a second gate electrode electrically surround the oxide semiconductor layer 308 in which a channel region is formed, can be referred to as a surrounded channel (S-channel) structure.

Since the transistor 300A has the S-channel structure, an electric field for inducing a channel can be effectively applied to the oxide semiconductor layer 308 by the conductive layer 306 or the conductive layer 312; thus, the current drive capability of the transistor 300A can be improved and high on-state current characteristics can be obtained. Since the on-state current can be increased, a size reduction of the transistor 300A is possible. Furthermore, since the transistor 300A has a structure in which the oxide semiconductor layer 308 is surrounded by the conductive layer 306 and the conductive layer 312, the mechanical strength of the transistor 300A can be increased.

When seen in the channel width direction of the transistor 300A, an opening portion different from the opening portion 343 may be formed on the oxide semiconductor layer 308 side in which the opening portion 343 is not formed.

When a transistor has a pair of gate electrodes between which a semiconductor film is positioned as in the transistor 300A, one of the gate electrodes may be supplied with a signal A and the other gate electrode may be supplied with a fixed potential Vb. Alternatively, one of the gate electrodes may be supplied with the signal A and the other gate electrode may be supplied with a signal B. Alternatively, one of the gate electrodes may be supplied with a fixed potential Va and the other gate electrode may be supplied with the fixed potential Vb.

The signal A is, for example, a signal for controlling the on/off state. The signal A may be a digital signal with two kinds of potentials, a potential V1 and a potential V2 (V1>V2). For example, the potential V1 can be a high power supply potential, and the potential V2 can be a low power supply potential. The signal A may be an analog signal.

The fixed potential Vb is, for example, a potential for controlling a threshold voltage VthA of the transistor. The fixed potential Vb may be the potential V1 or the potential V2. In that case, a potential generator circuit for generating the fixed potential Vb is not necessary, which is preferable. The fixed potential Vb may be different from the potential V1 or the potential V2. When the fixed potential Vb is low, the threshold voltage VthA can be high in some cases. As a result, drain current generated when gate-source voltage Vgs is 0 V can be reduced and leakage current in the circuit including the transistor can be reduced in some cases. The fixed potential Vb may be, for example, lower than the low power supply potential. On the other hand, in some cases, the threshold voltage VthA can be low by setting the fixed potential Vb high. As a result, drain current generated when the gate-source voltage Vgs is a high power supply potential can be increased and the operating speed of the circuit including the transistor can be improved in some cases. The fixed potential Vb may be, for example, higher than the low power supply potential.

The signal B is, for example, a signal for controlling the on/off state. The signal B may be a digital signal with two kinds of potentials, a potential V3 and a potential V4 (V3>V4). For example, the potential V3 can be a high power supply potential, and the potential V4 can be a low power supply potential. The signal B may be an analog signal.

When both the signal A and the signal B are digital signals, the signal B may have the same digital value as the signal A. In this case, it may be possible to increase the on-state current of the transistor and the operating speed of the circuit including the transistor. Here, the potential V1 and the potential V2 of the signal A may be different from the potential V3 and the potential V4 of the signal B. For example, if a gate insulating layer for the gate to which the signal B is input is thicker than a gate insulating layer for the gate to which the signal A is input, the potential amplitude of the signal B (V3-V4) may be larger than the potential amplitude of the signal A (V1-V2). In this manner, the influence of the signal A and that of the signal B on the on/off state of the transistor can be substantially the same in some cases.

When both the signal A and the signal B are digital signals, the signal B may have a digital value different from that of the signal A. In this case, the signal A and the signal B can separately control the transistor, and thus, higher performance can be achieved. The transistor which is, for example, an n-channel transistor, can function by itself as a NAND circuit, a NOR circuit, or the like in the following case: the transistor is turned on only when the signal A has the potential V1 and the signal B has the potential V3, or the transistor is turned off only when the signal A has the potential V2 and the signal B has the potential V4. The signal B may be a signal for controlling the threshold voltage VthA. For example, the potential of the signal B in a period in which the circuit including the transistor operates may be different from the potential of the signal B in a period in which the circuit does not operate. The potential of the signal B may vary depending on the operation mode of the circuit. In this case, the potential of the signal B is not necessarily changed as frequently as the potential of the signal A.

When both the signal A and the signal B are analog signals, the signal B may be an analog signal having the same potential as the signal A, an analog signal having a potential of the signal A multiplied by a constant, an analog signal whose potential is higher or lower than the potential of the signal A by a constant, or the like. In this case, it may be possible to increase the on-state current of the transistor and the operating speed of the circuit including the transistor. The signal B may be an analog signal different from the signal A. In this case, the signal A and the signal B can separately control the transistor, and thus, higher performance can be achieved.

The signal A may be a digital signal, and the signal B may be an analog signal. Alternatively, the signal A may be an analog signal, and the signal B may be a digital signal.

When both of the gate electrodes of the transistor are supplied with the fixed potentials, the transistor can function as an element equivalent to a resistor in some cases. For example, in the case where the transistor is an n-channel transistor, the effective resistance of the transistor can be sometimes low (high) when the fixed potential Va or the fixed potential Vb is high (low). When both the fixed potential Va and the fixed potential Vb are high (low), the effective resistance can be lower (higher) than that of a transistor with only one gate in some cases.

Note that the other components of the transistor 300A are similar to those of the transistor 300 described above, and an effect similar to that of the transistor 300 can be obtained.

2-3. Structure Example 3 of Transistor

Next, a structure example different from that of the transistor in FIGS. 35A to 35C are described with reference to FIGS. 36A and 36B, and FIGS. 37A and 37B.

Figure 36A:
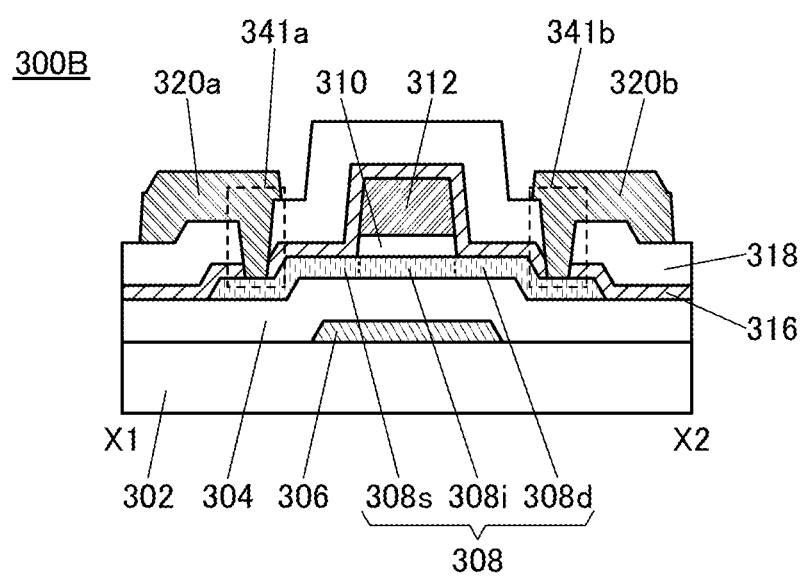
FIGS. 36A and 36B are cross-sectional views illustrating an example of a semiconductor device.
Figure 36B:
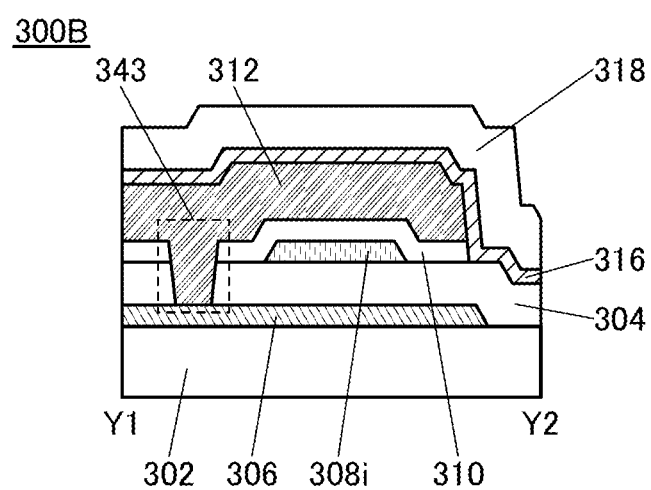
Figure 37A:
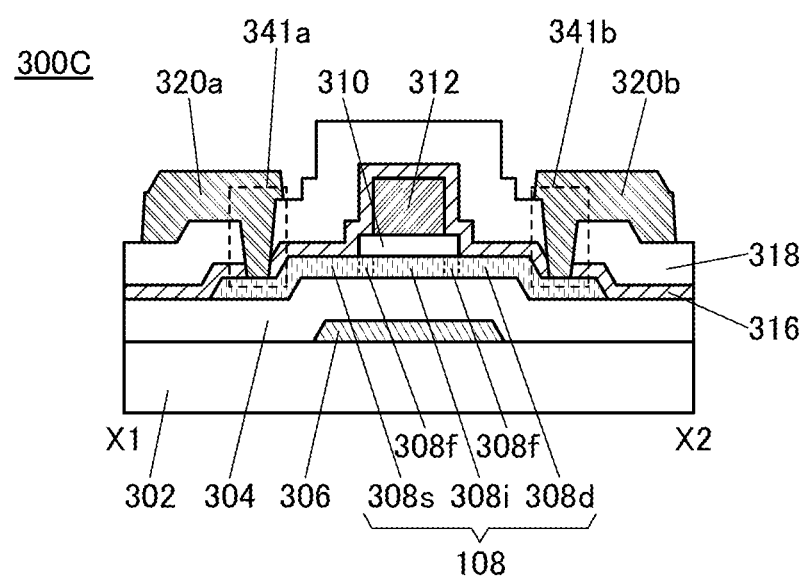
FIGS. 37A and 37B are cross-sectional views illustrating an example of a semiconductor device.
Figure 37B:
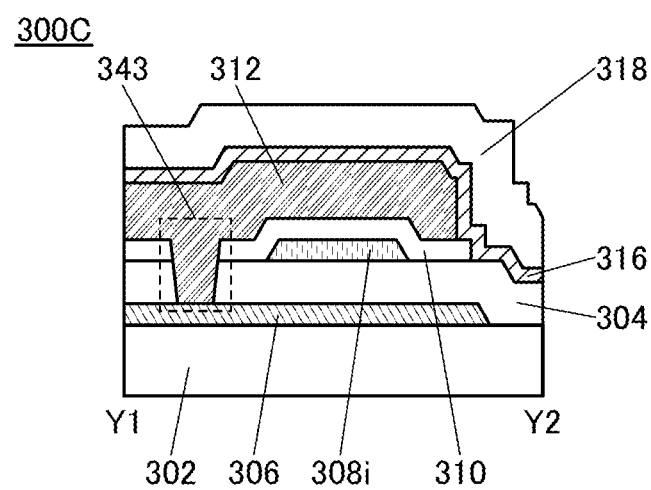

FIGS. 36A and 36B are cross-sectional views of a transistor 300B, and FIGS. 37A and 37B are cross-sectional views of a transistor 300C. Note that the top views of the transistors 300B and 300C are not drawn here, as they are similar to the top view of the transistor 300A shown in FIG. 35A.

The transistor 300B illustrated in FIGS. 36A and 36B are different from the transistor 300A described above in terms of the shapes of the insulating layer 310 and the conductive layer 312. Specifically, in the cross section of the transistor in the channel length (L) direction, the shape of the insulating layer 310 and the conductive layer 312 is a rectangle in the transistor 300A, but is a tapered shape in the transistor 300B. More specifically, in the cross section of the transistor 300A in the channel length (L) direction, the top edge of the conductive layer 312 and the bottom edge of the insulating layer 310 are formed substantially in the same location. In contrast, in the cross section of the transistor 300B in the channel length (L) direction, a top edge of the conductive layer 312 is formed in a location more inward from the bottom edge of the insulating layer 310. In other words, the side edges of the insulating layer 310 are positioned more outward compared with the side edges of the conductive layer 312.

The transistor 300A can be formed by processing the conductive layer 312 and the insulating layer 310 in one step, using the same mask and a dry etching method. The transistor 300B can be formed by processing the conductive layer 312 and the insulating layer 310 using the same mask, and a combination of a wet etching method and a dry etching method.

A structure like that of the transistor 300A is preferable because edges of the source region 308s and the drain region 308d can be substantially aligned with edges of the conductive layer 312. In contrast, a structure like that of the transistor 300B is preferable because the coverage with the insulating layer 316 improves.

The transistor 300C illustrated in FIGS. 37A and 37B is different from the transistor 300A described above in the shape of the conductive layer 312 and the insulating layer 310. Specifically, in the cross section of the transistor 300C in the channel length (L) direction, a bottom edge of the conductive layer 312 is not aligned with the top edge of the insulating layer 310. The bottom edge of the conductive layer 312 is formed more inward from the top edge of the insulating layer 310.

For example, the structure of the transistor 300C can be obtained in the following manner: the conductive layer 312 and the insulating layer 310 are processed with a wet etching method and a dry etching method, respectively, using the same mask.

With the structure of the transistor 300C, regions 308f are formed in the oxide semiconductor layer 308 in some cases. The regions 308f are formed between the channel region 308i and the source region 308s and between the channel region 308i and the drain region 308d.

The regions 308f function as high-resistance regions or low-resistance regions. The high-resistance regions have the same level of resistance as the channel region 308i and do not overlap with the conductive layer 312 functioning as a gate electrode. In the case where the regions 308f are high-resistance regions, the regions 308f function as offset regions. To suppress a decrease in the on-state current of the transistor 300C, the regions 308f functioning as offset regions may each have a length of 1 µm or less in a cross section in the channel length (L) direction.

When the regions 308f are low-resistance regions, the regions 308f have a resistance that is lower than that of the channel region 308i and higher than that of the source region 308s and the drain region 308d. When the regions 308f are low-resistance regions, the regions 308f function as lightly doped drain (LDD) regions. The regions 308f functioning as LDD regions can alleviate an electric field in the drain region, thereby reducing a change in the threshold voltage of the transistor due to the electric field in the drain region.

Note that in the case where the regions 308f serve as LDD regions, for example, the regions 308f are formed by supplying nitrogen or hydrogen from the insulating layer 316 to the regions 308f or by adding an impurity element from above the conductive layer 312 and the insulating layer 310 using the conductive layer 312 and the insulating layer 310 as a mask so that the impurity element is added to the oxide semiconductor layer 308 through the insulating layer 310.

2-4. Fabrication Method Example 1 of Transistor

Next, an example of a fabrication method of the transistor 300 illustrated in FIGS. 34A to 34C is described in reference to FIGS. 38A to 38D, FIGS. 39A to 39C, and FIGS. 40A and 40B. Note that FIGS. 38A to 38D, FIGS. 39A to 39C, and FIGS. 40A and 40B are cross-sectional views in the channel length (L) direction and the channel width (W) direction that illustrate a method for fabricating the transistor 300.

Figure 38A:
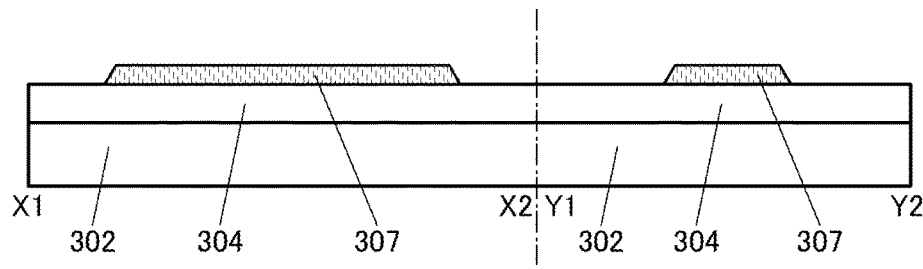
FIGS. 38A to 38D are cross-sectional views illustrating an example of a fabrication method of a semiconductor device.

First, the insulating layer 304 is formed over the substrate 302. Then, an oxide semiconductor layer is formed over the insulating layer 304. Subsequently, an oxide semiconductor layer 307 is formed by processing the oxide semiconductor layer into a shape of an island (FIG. 38A).

The insulating layer 304 can be formed by a sputtering method, a CVD method, a vapor deposition method, a PLD method, a printing method, a coating method, or the like as appropriate. In this embodiment, as the insulating layer 304, a 400-nm-thick silicon nitride film and a 50-nm-thick silicon oxynitride film are formed with a plasma CVD apparatus. Note that the oxide semiconductor layer 308 may be formed over the substrate 302 without forming the insulating layer 304.

After the insulating layer 304 is formed, oxygen may be added to the insulating layer 304. Examples of oxygen that can be added to the insulating film include an oxygen radical, an oxygen atom, an oxygen atomic ion, and an oxygen molecular ion. Examples of a method for adding the oxygen include an ion doping method, an ion implantation method, and plasma treatment method. Alternatively, a film that suppresses oxygen release may be formed over the insulating layer 304, and then, oxygen may be added to the insulating layer 304 through the film.

The film that suppresses oxygen release can be formed using a conductive film or a semiconductor film containing one or more of indium, zinc, gallium, tin, aluminum, chromium, tantalum, titanium, molybdenum, nickel, iron, cobalt, and tungsten.

In the case where oxygen is added by plasma treatment in which oxygen is excited by a microwave to generate high-density oxygen plasma, the amount of oxygen added to the insulating layer 304 can be increased.

The oxide semiconductor layer 307 can be formed by a sputtering method, a coating method, a pulsed laser deposition method, a laser ablation method, a thermal CVD method, or the like. Note that the oxide semiconductor film can be processed into the oxide semiconductor layer 307 in the following manner: a mask is formed over the oxide semiconductor film by a lithography process, and then, the oxide semiconductor film is partly etched using the mask. Alternatively, the isolated oxide semiconductor layer 307 may be directly formed by a printing method.

As a power supply device for generating plasma when the oxide semiconductor layer is formed by a sputtering method, an RF power supply device, an AC power supply device, a DC power supply device, or the like can be used as appropriate. As a sputtering gas for forming the oxide semiconductor layer, a rare gas (typically argon), oxygen, or a mixed gas of a rare gas and oxygen is used as appropriate. In the case of the mixed gas of a rare gas and oxygen, the proportion of oxygen to a rare gas is preferably increased.

To increase the crystallinity of the oxide semiconductor layer formed by a sputtering method, for example, the oxide semiconductor is preferably deposited at a substrate temperature higher than or equal to 150° C. and lower than or equal to 750° C., higher than or equal to 150° C. and lower than or equal to 450° C., or higher than or equal to 200° C. and lower than or equal to 350° C.

In this embodiment, as the oxide semiconductor layer 307, a 35-nm-thick oxide semiconductor layer is deposited with a sputtering apparatus using an In—Ga—Zn metal oxide (In:Ga:Zn=4:2:4.1 [atomic ratio]) as a sputtering target.

After the oxide semiconductor layer 307 is formed, the oxide semiconductor layer 307 may be dehydrated or dehydrogenated by heat treatment. The temperature of the heat treatment is typically higher than or equal to 150° C. and lower than the strain point of the substrate, higher than or equal to 250° C. and lower than or equal to 450° C., or higher than or equal to 300° C. and lower than or equal to 450° C.

The heat treatment can be performed in an inert gas atmosphere containing nitrogen or a rare gas such as helium, neon, argon, xenon, or krypton. Furthermore, the heat treatment may be performed in an inert gas atmosphere first, and then in an oxygen atmosphere. It is preferable that the above inert gas atmosphere and the above oxygen atmosphere do not contain hydrogen, water, and the like. The treatment time can be longer than or equal to 3 minutes and shorter than or equal to 24 hours.

An electric furnace, an RTA apparatus, or the like can be used for the heat treatment. The use of an RTA apparatus allows the heat treatment to be performed at a temperature higher than or equal to the strain point of the substrate if the heating time is short. Therefore, the heat treatment time can be shortened.

By depositing the oxide semiconductor film while it is heated or by performing heat treatment after the formation of the oxide semiconductor film, the hydrogen concentration in the oxide semiconductor layer, which is measured by SIMS, can be lower than or equal to $5\times10^{19}$ atoms/cm$^3$, lower than or equal to $1\times10^{19}$ atoms/cm$^3$, lower than or equal to $5\times10^{18}$ atoms/cm$^3$, lower than or equal to $1\times10^{18}$ atoms/cm$^3$, lower than or equal to $5\times10^{17}$ atoms/cm$^3$, or lower than or equal to $1\times10^{16}$ atoms/cm$^3$.

Figure 38B:
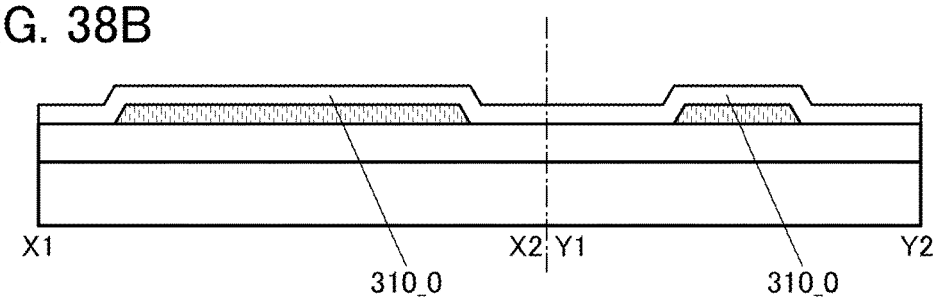

Next, an insulating layer 310_0 is formed over the insulating layer 304 and the oxide semiconductor layer 307 (FIG. 38B).

For the insulating layer 310_0, a silicon oxide film or a silicon oxynitride film can be formed with a plasma-enhanced chemical vapor deposition apparatus (a PECVD apparatus or simply referred to as a plasma CVD apparatus). In this case, a deposition gas including silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

A silicon oxynitride film having few defects can be formed as the insulating layer 310_0 with the plasma CVD apparatus under the conditions that the flow rate of the oxidizing gas is more than 20 times and less than 100 times or preferably more than or equal to 40 times and less than or equal to 80 times the flow rate of the deposition gas and that the pressure in a treatment chamber is lower than 100 Pa or lower than or equal to 50 Pa.

A silicon oxide film or a silicon oxynitride film that is dense can be formed as the insulating layer 310_0 under the following conditions: the substrate placed in a treatment chamber of a plasma CVD apparatus that is vacuum-evacuated is held at a temperature higher than or equal to 280° C. and lower than or equal to 400° C., the pressure in the treatment chamber is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

The insulating layer 310_0 may be formed by a plasma CVD method using a microwave. A microwave refers to a wave in the frequency range of 300 MHz to 300 GHz. In a microwave, electron temperature and electron energy are low. Furthermore, in supplied power, the proportion of power used for acceleration of electrons is low, and therefore, power can be used for dissociation and ionization of more molecules. Thus, plasma with high density (high-density plasma) can be excited. Therefore, a deposition surface and a deposit are less damaged by plasma, and the insulating layer 310_0 with few defects can be formed.

Alternatively, the insulating layer 310_0 can also be formed by a CVD method using an organosilane gas. As the organosilane gas, any of the following silicon-containing compound can be used: tetraethyl orthosilicate (TEOS) (chemical formula: Si(OC$_2$H$_5$)$_4$); tetramethylsilane (TMS) (chemical formula: Si(CH$_3$)$_4$); tetramethylcyclotetrasiloxane (TMCTS); octamethylcyclotetrasiloxane (OMCTS); hexamethyldisilazane (HMDS); triethoxysilane (SiH(OC$_2$H$_5$)$_3$); trisdimethylaminosilane (SiH(N(CH$_3$)$_2$)$_3$); or the like. By a CVD method using the organosilane gas, the insulating layer 310_0 having high coverage can be formed.

In this embodiment, as the insulating layer 310_0, a 100-nm-thick silicon oxynitride film is formed with the plasma CVD apparatus.

Figure 38C:
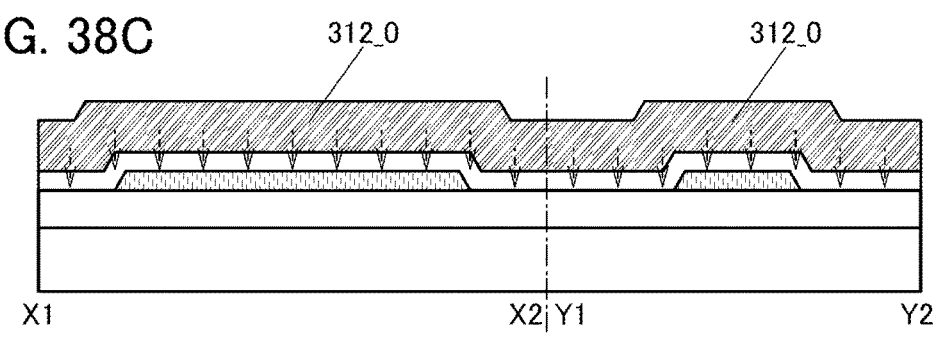

Next, a conductive layer 312_0 is formed over the insulating layer 310_0 (FIG. 38C).

In the case where a metal oxide film is used as the conductive layer 312_0, for example, oxygen can potentially be added from the conductive layer 312_0 to the insulating layer 310_0 during the formation of the conductive layer 312_0. In FIG. 38C, oxygen added to the insulating layer 310_0 is schematically shown by arrows.

In the case where a metal oxide film is used as the conductive layer 312_0, the conductive layer 312_0 is preferably formed by a sputtering method in an atmosphere containing an oxygen gas. Formation of the conductive layer 312_0 in an atmosphere containing an oxygen gas allows suitable addition of oxygen to the insulating layer 310_0. Note that a method for forming the conductive layer 312_0 is not limited to a sputtering method, and other methods such as an ALD method may be used.

In this embodiment, a 100-nm-thick IGZO film containing an In—Ga—Zn oxide (In:Ga:Zn=4:2:4.1 [atomic ratio]) is formed as the conductive layer 312_0 by a sputtering method. Note that oxygen addition treatment may be performed on the insulating layer 310_0 before or after the formation of the conductive layer 312_0. The oxygen addition treatment can be performed with a method similar to the oxygen addition that can be performed after the formation of the insulating layer 304.

Figure 38D:
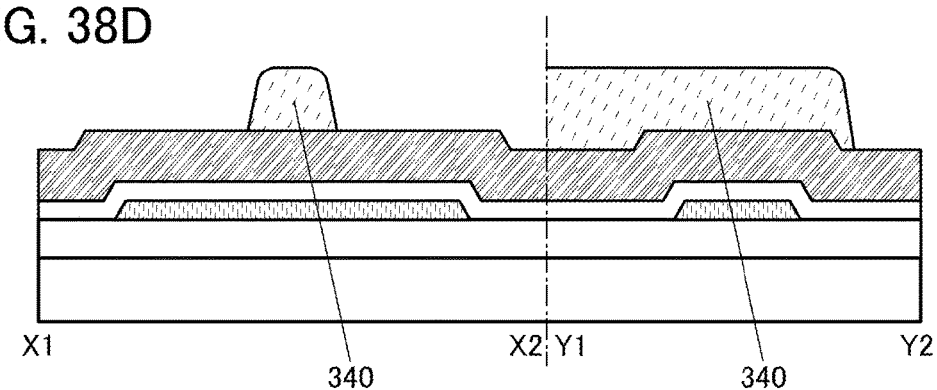

Next, a mask 340 is formed by a lithography process in a desired position over the conductive layer 312_0 (FIG. 38D).

Figure 39A:
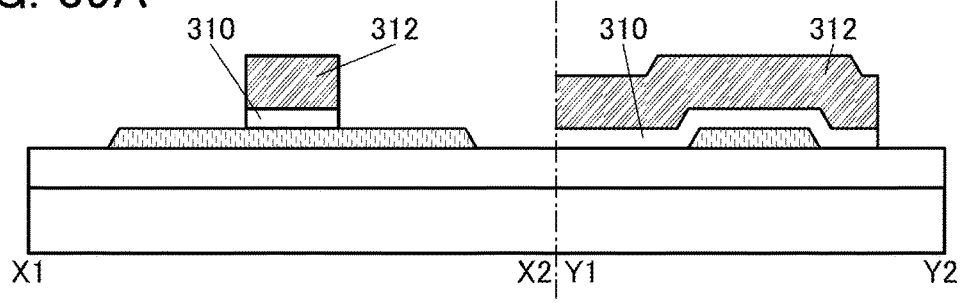
FIGS. 39A to 39C are cross-sectional views each illustrating an example of a fabrication method of a semiconductor device.

Next, etching is performed from above the mask 340 to process the conductive layer 312_0 and the insulating layer 310_0. Then, the mask 340 is removed, so that the island-shaped conductive layer 312 and the island-shaped insulating layer 310 are formed (FIG. 39A).

In this embodiment, the conductive film 312_0 and the insulating film 310_0 are processed by a dry etching method.

In the processing of the conductive layer 312_0 and the insulating layer 310_0, the thickness of the oxide semiconductor layer 307 in a region not overlapping with the conductive layer 312 is decreased in some cases. In the processing of the conductive layer 312_0 and the insulating layer 310_0, the thickness of the insulating layer 304 in a region not overlapping with the oxide semiconductor layer 307 is decreased in some cases. In the processing of the conductive layer 312_0 and the insulating layer 310_0, an etchant or an etching gas (e.g., chlorine) can be added to the oxide semiconductor layer 307, or the constituent element of the conductive layer 312_0 or the insulating layer 310_0 can be added to the oxide semiconductor layer 307 in some cases.

Figure 39B:
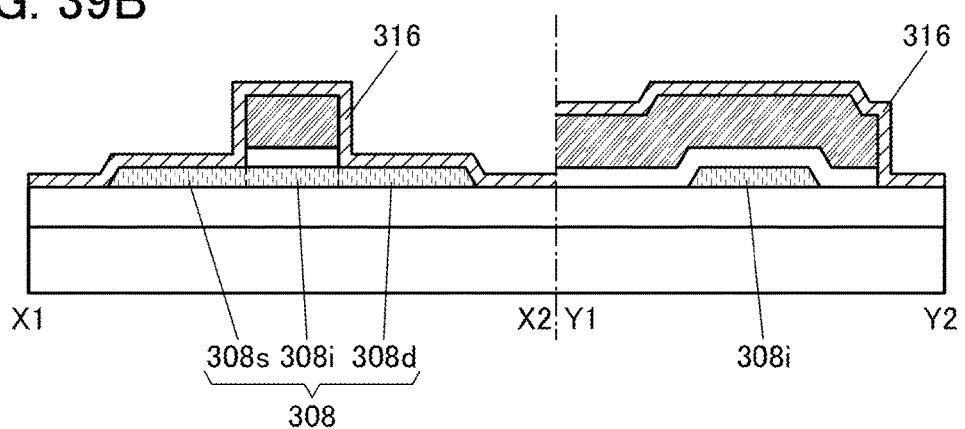

Next, the insulating layer 316 is formed over the insulating layer 304, the oxide semiconductor layer 307, and the conductive layer 312. Note that the oxide semiconductor layer 307 is in contact with the insulating layer 316 by formation of the insulating layer 316 and serves as the source region 308s and the drain region 308d. The oxide semiconductor layer 307 in a region in contact with the insulating layer 310 becomes the channel region 308i. Accordingly, the oxide semiconductor layer 308 including the channel region 308i, the source region 308s, and the drain region 308d is formed (FIG. 39B).

When a silicon nitride oxide film is used for the insulating layer 316, nitrogen or hydrogen in the silicon nitride oxide film can be supplied to the source region 308s and the drain region 308d in contact with the insulating layer 316.

Note that an impurity element may be added to the oxide semiconductor layer 307 before the insulating layer 316 is formed. Alternatively, an impurity element may be added to the oxide semiconductor layer 307 through the insulating layer 316 after the insulating layer 316 is formed.

The impurity element can be added by an ion doping method, an ion implantation method, a plasma treatment method, or the like. In a plasma treatment method, an impurity element can be added using plasma generated in a gas atmosphere containing the impurity element. A dry etching apparatus, an ashing apparatus, a plasma CVD apparatus, a high-density plasma CVD apparatus, or the like can be used to generate the plasma.

As a source gas of the impurity element, at least one of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, at least one of $B_2H_6$, $PH_3$, $N_2$, $NH_3$, $AlH_3$, $AlCl_3$, $F_2$, HF, and $H_2$ which are diluted with a rare gas can be used. Typical examples of the rare gas element include helium, neon, argon, krypton, and xenon.

Alternatively, after a rare gas is added to the oxide semiconductor layer 307, at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ may be added thereto. Alternatively, after at least one of $B_2H_6$, $PH_3$, $CH_4$, $N_2$, $NH_3$, $AlH_3$, $AlCl_3$, $SiH_4$, $Si_2H_6$, $F_2$, HF, and $H_2$ is added to the oxide semiconductor layer 307, a rare gas may be added thereto.

Figure 39C:
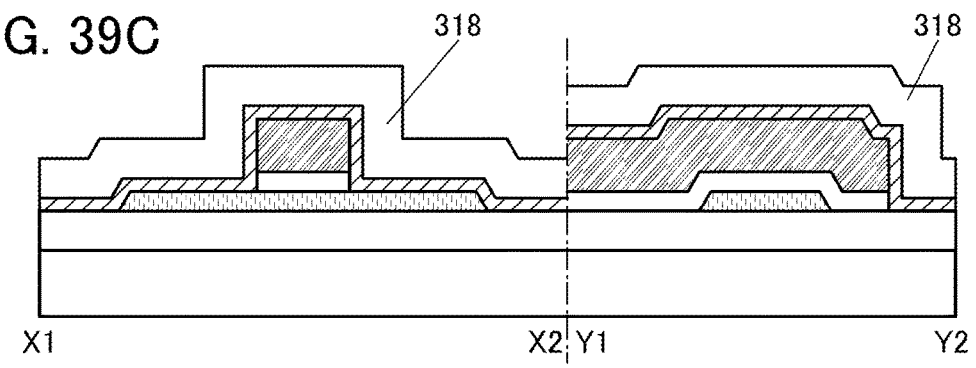

Next, the insulating layer 318 is formed over the insulating layer 316 (FIG. 39C).

Note that the insulating layer 318 can be formed using a material selected from the materials described above. In this embodiment, as the insulating layer 318, a 300-nm-thick silicon oxynitride film is formed with a plasma CVD apparatus.

Figure 40A:
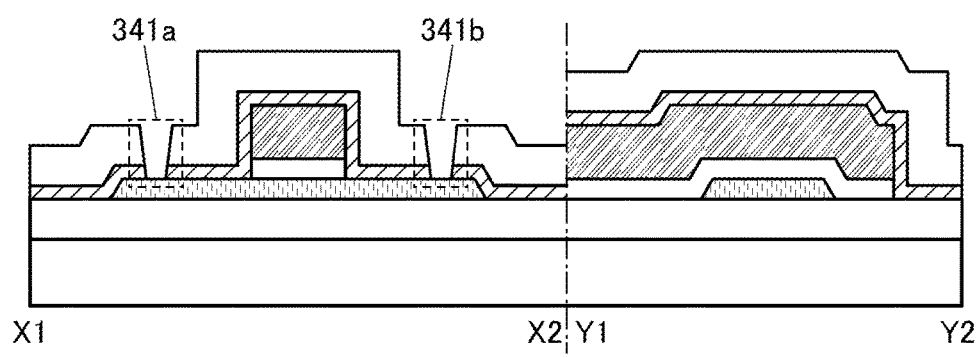
FIGS. 40A and 40B are cross-sectional views illustrating an example of a fabrication method of a semiconductor device.

Subsequently, a mask is formed by lithography in a desired position over the insulating layer 318, and then, the insulating layer 318 and the insulating layer 316 are partly etched, so that the opening portion 341a that reaches the source region 308s and the opening portion 341b that reaches the drain region 308d are formed (FIG. 40A).

For the etching of the insulating layers 318 and 316, at least one of a wet etching method and a dry etching method can be used. In this embodiment, a dry etching method is used to process the insulating layers 318 and 316.

Figure 40B:
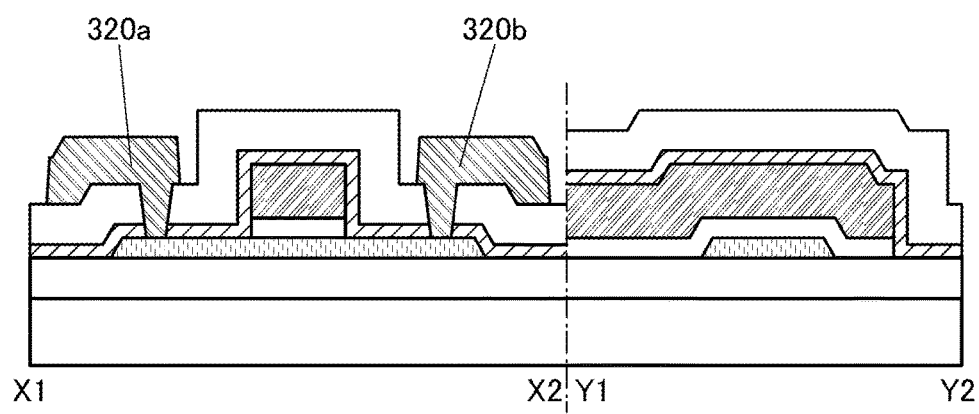

Next, a conductive layer is formed over the source region 308s, the drain region 308d, and the insulating layer 318 so as to cover the opening portions 341a and 341b and the conductive layer is processed into a desired shape, whereby the conductive layers 320a and 320b are formed (FIG. 40B).

The conductive layers 320a and 320b can be formed using a material selected from the materials described above. In this embodiment, a sputtering apparatus is used to form a stack including a 50-nm-thick tungsten film and a 400-nm-thick copper film, as the conductive layers 320a and 320b.

For the processing of the conductive layer that serves as the conductive layers 320a and 320b, at least one of a wet etching method and a dry etching method can be used. In this embodiment, in the processing of the conductive layer into the conductive layers 320a and 320b, the copper film is etched by a wet etching method and then the tungsten film is etched by a dry etching method.

Through the process described above, the transistor 300 illustrated in FIGS. 34A to 34C can be fabricated.

2-5. Fabrication Method Example 2 of Transistor

Next, an example of a fabrication method of the transistor 300A illustrated in FIGS. 35A to 35C is described in reference to FIGS. 41A to 41D, FIGS. 42A to 42C, and FIGS. 43A to 43C. Note that FIGS. 41A to 41D, FIGS. 42A to 42C, and FIGS. 43A to 43C are cross-sectional views in the channel length (L) direction and the channel width (W) direction that illustrate a method for fabricating the transistor 300A.

Figure 41A:
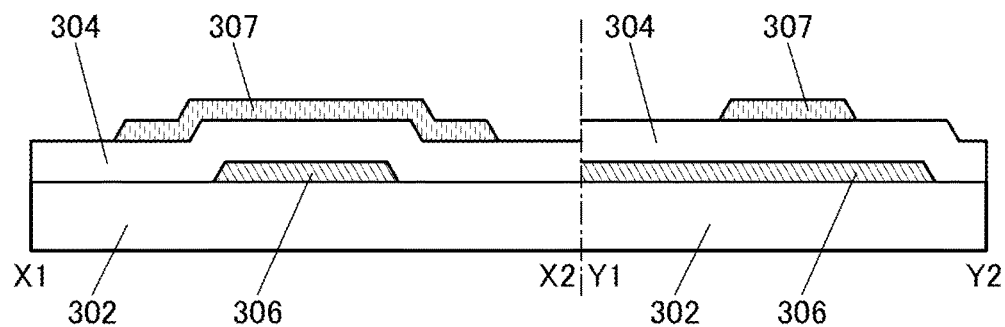
FIGS. 41A to 41D are cross-sectional views illustrating an example of a fabrication method of a semiconductor device.

First, the conductive layer 306 is formed over the substrate 302. Next, the insulating layer 304 is formed over the substrate 302 and the conductive layer 306, and an oxide semiconductor layer is formed over the insulating layer 304. Subsequently, the oxide semiconductor layer is processed into an island shape to form the oxide semiconductor layer 307 (FIG. 41A).

The conductive layer 306 can be formed with similar materials and methods as the conductive layers 320a and 320b. In this embodiment, as the conductive layer 306, a stack including a 50-nm-thick tantalum nitride film and a 100-nm-thick copper film is formed by a sputtering method.

Figure 41B:
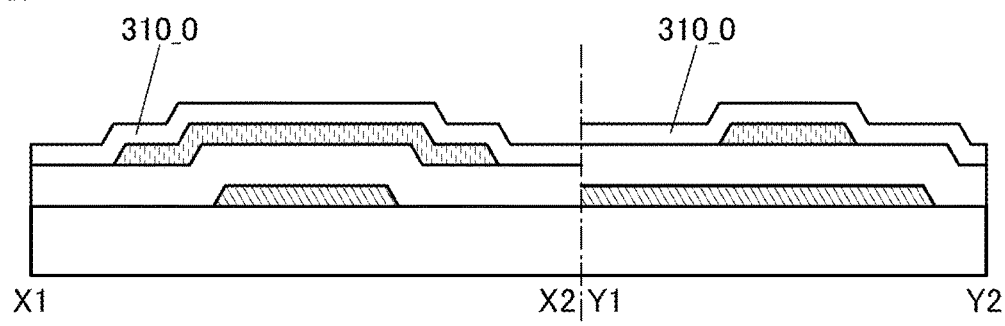

Next, the insulating layer 310_0 is formed over the insulating layer 304 and the oxide semiconductor layer 307 (FIG. 41B).

Figure 41C:
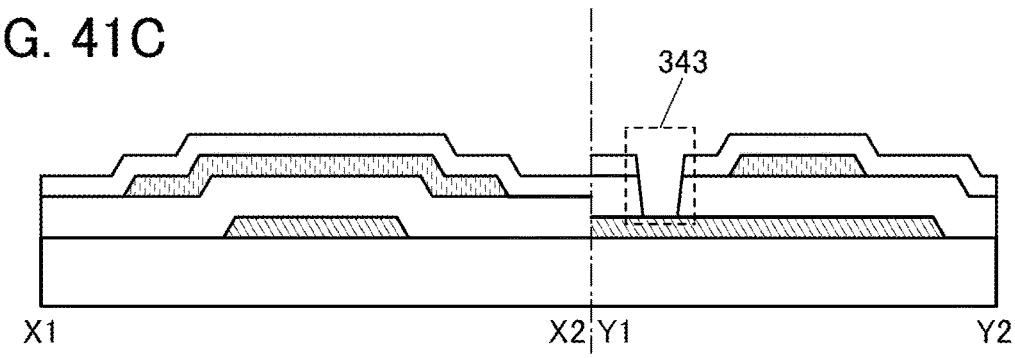

Next, a mask is formed by lithography in a desired position over the insulating layer 310_0, and then, the insulating layers 310_0 and 304 are partly etched, so that the opening portion 343 that reaches the conductive layer 306 is formed (FIG. 41C).

As the method for forming the opening portion 343, at least one of a wet etching method and a dry etching method can be used. In this embodiment, the opening portion 343 is formed by a dry etching method.

Figure 41D:
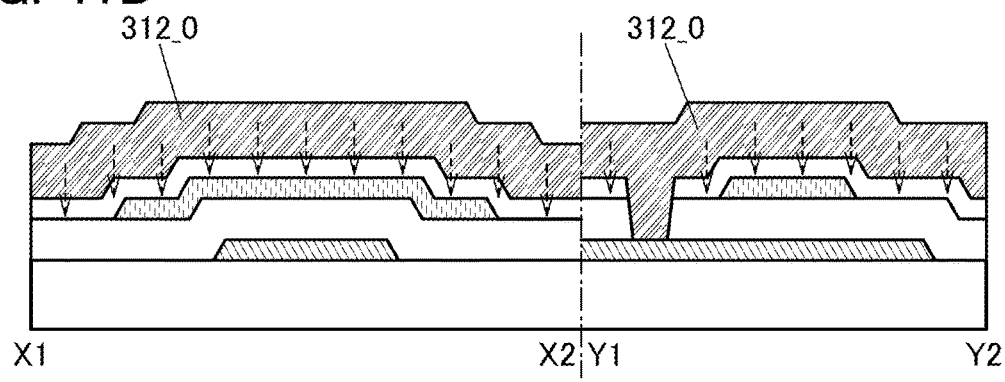

Next, the conductive layer 312_0 is formed over the conductive layer 306 and the insulating layer 310_0 to cover the opening portion 343 (FIG. 41D).

In the case where a metal oxide film is used as the conductive layer 312_0, for example, oxygen can potentially be added from the conductive layer 312_0 to the insulating layer 310_0 during the formation of the conductive layer 312_0. In FIG. 41D, oxygen added to the insulating layer 310_0 is schematically shown by arrows.

When the conductive layer 312_0 is formed to cover the opening portion 343, the conductive layers 306 and 312_0 are electrically connected.

Figure 42A:
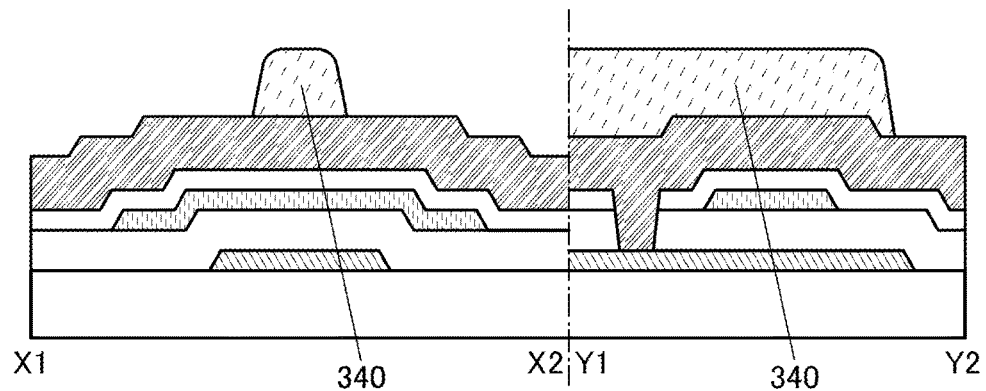
FIGS. 42A to 42C are cross-sectional views illustrating an example of a fabrication method of a semiconductor device.

Subsequently, the mask 340 is formed by a lithography process in a desired position over the conductive layer 312_0 (FIG. 42A).

Figure 42B:
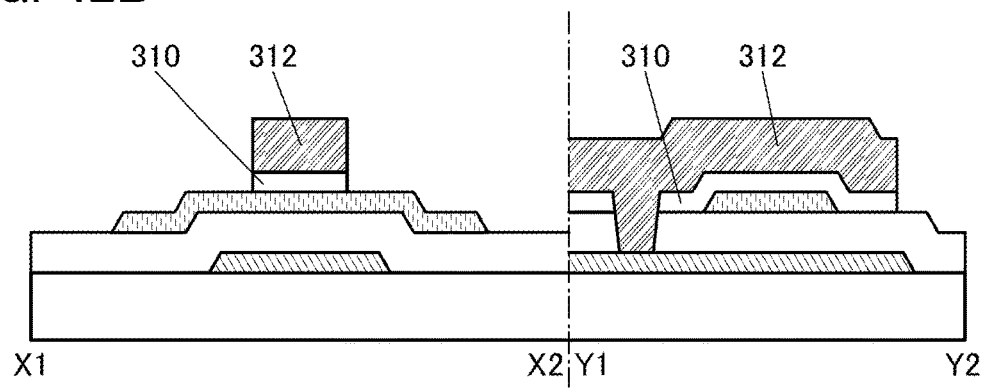

Next, etching is performed from above the mask 340 to process the conductive film 312_0 and the insulating film 310_0. Furthermore, the conductive layer 312_0 and the insulating layer 310_0 are processed, and then the mask 340 is removed. By processing the conductive layer 312_0 and the insulating layer 310_0, the island-shaped conductive layer 312 and the island-shaped insulating layer 310 are formed (FIG. 42B).

In this embodiment, a dry etching method is used to process the conductive layer 312_0 and the insulating layer 310_0.

Figure 42C:
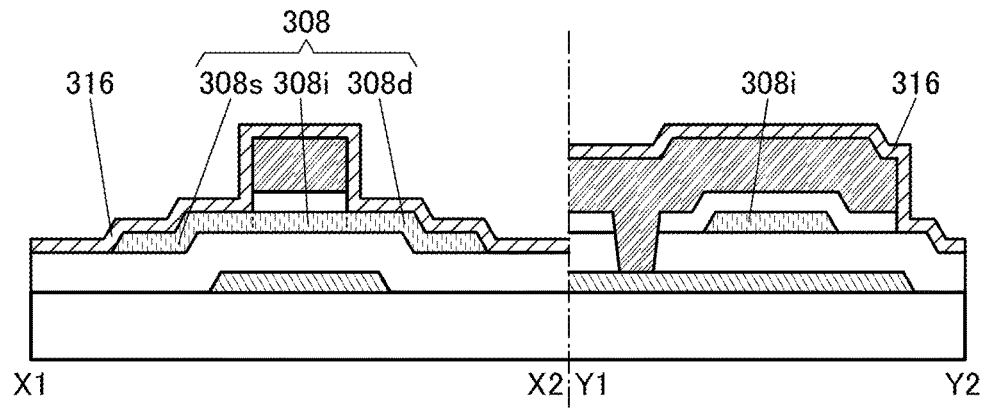

Next, the insulating layer 316 is formed over the insulating layer 304, the oxide semiconductor layer 307, and the conductive layer 312. Note that the oxide semiconductor layer 307 is in contact with the insulating layer 316 by formation of the insulating layer 316 and serves as the source region 308s and the drain region 308d. The oxide semiconductor layer 307 in a region in contact with the insulating layer 310 becomes the channel region 308i. Accordingly, the oxide semiconductor layer 308 including the channel region 308i, the source region 308s, and the drain region 308d is formed (FIG. 42C).

Note that the insulating layer 316 can be formed using a material selected from the materials described above. In this embodiment, as the insulating layer 316, a 100-nm-thick silicon nitride oxide film is formed with a plasma CVD apparatus. In the formation of the silicon nitride oxide film, plasma treatment and film formation treatment are performed at 220° C. Note that the plasma treatment and the deposition treatment can be performed in the same manner described above.

Figure 43A:
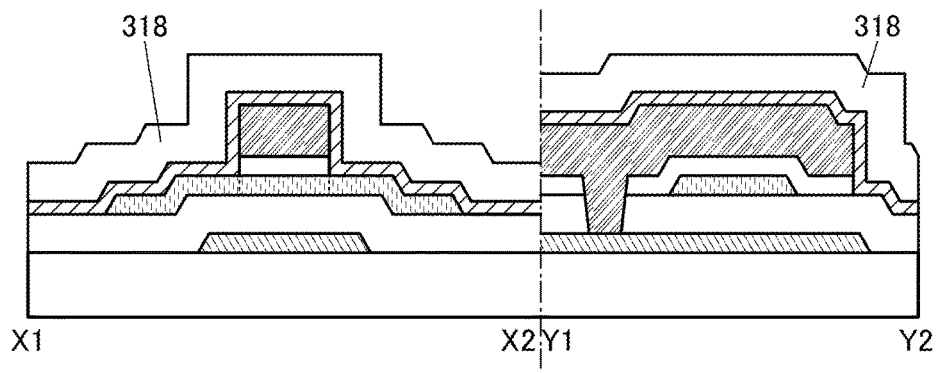
FIGS. 43A to 43C are cross-sectional views illustrating an example of a fabrication method of a semiconductor device.

Next, the insulating layer 318 is formed over the insulating layer 316 (FIG. 43A).

Figure 43B:
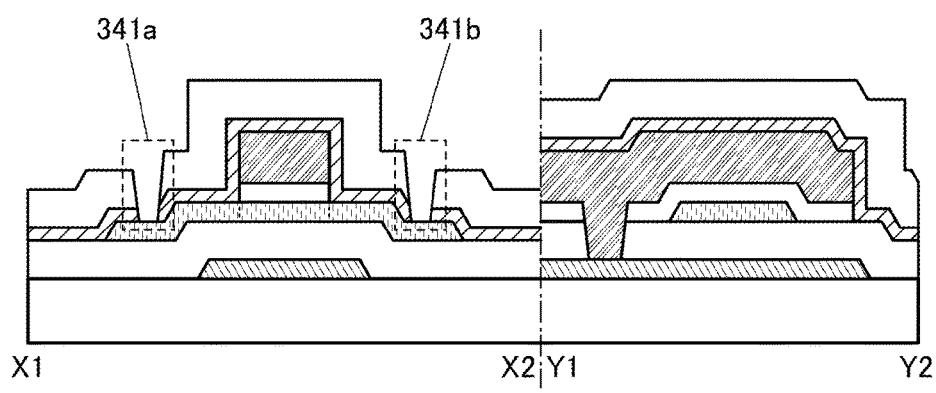

Subsequently, a mask is formed by lithography in a desired position over the insulating layer 318, and then, the insulating layers 318 and 316 are partly etched, so that the opening portion 341a reaching the source region 308s and the opening portion 341b reaching the drain region 308d are formed (FIG. 43B).

Figure 43C:
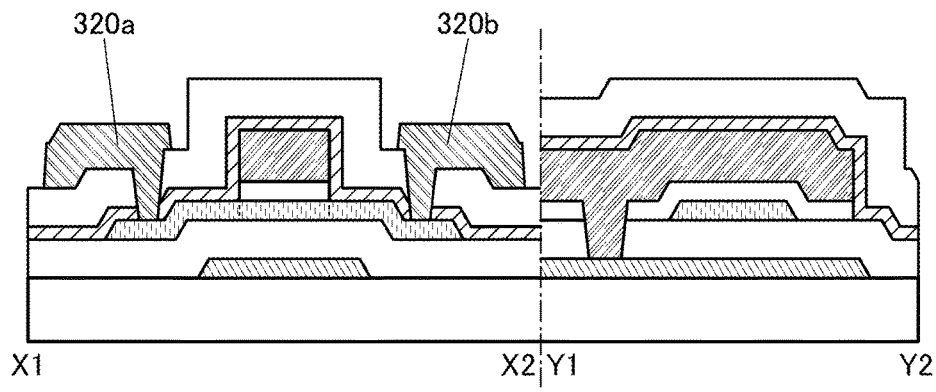

Next, a conductive layer is formed over the source region 308s, the drain region 308d, and the insulating layer 318 so as to cover the opening portions 341a and 341b, and the conductive layer is processed into a desired shape, whereby the conductive layers 320a and 320b are formed (FIG. 43C).

Through the steps described above, the transistor 300A illustrated in FIGS. 35A to 35C can be fabricated.

This embodiment can be combined with any of other embodiments as appropriate.

Embodiment 3

In this embodiment, a touch panel module and electronic devices that include the input/output device of one embodiment of the present invention are described with reference to FIG. 44, FIGS. 45A to 45H, and FIGS. 46A and 46B.

Figure 44:
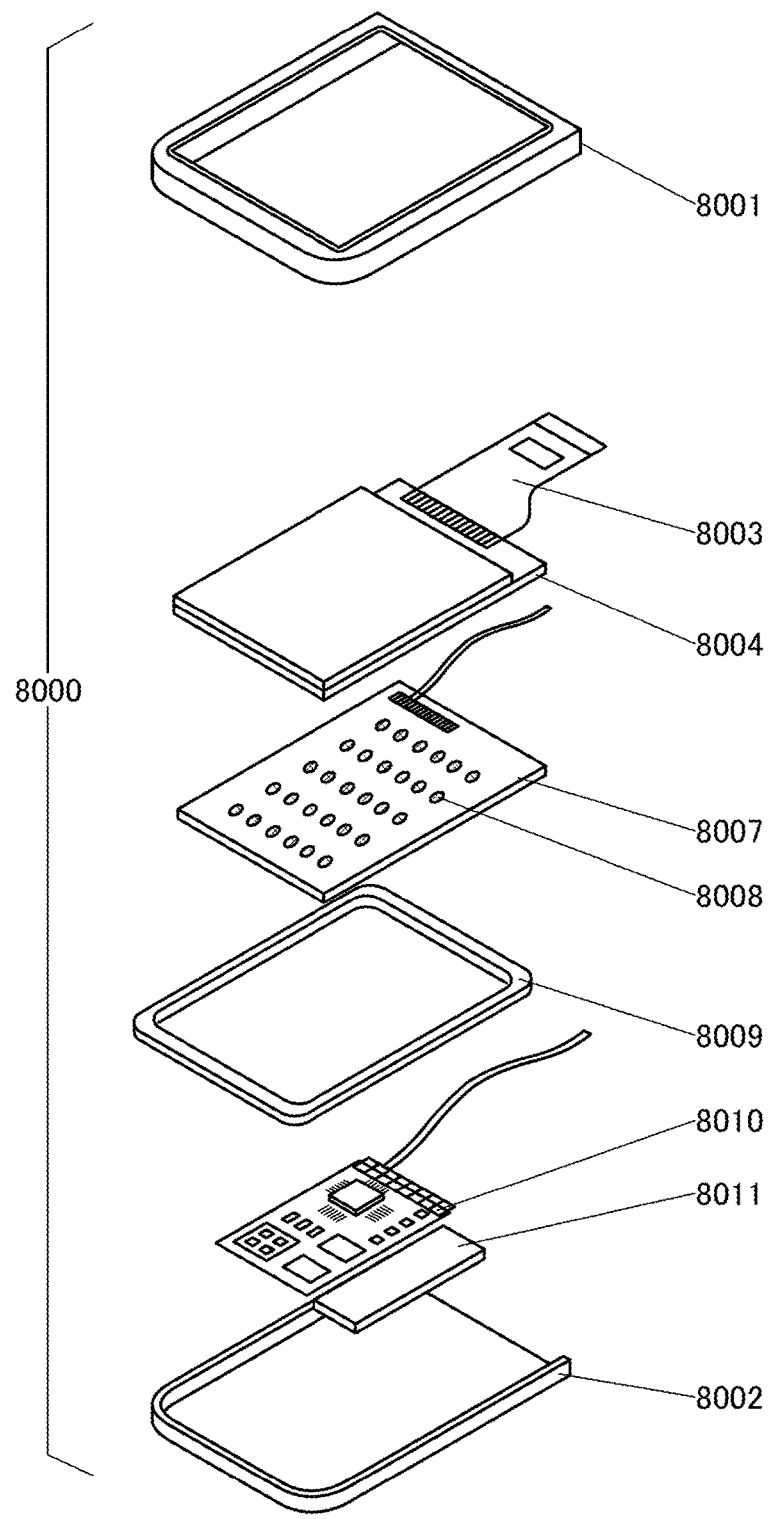
FIG. 44 illustrates an example of a touch panel module.

In a touch panel module 8000 illustrated in FIG. 44, a touch panel 8004 connected to an FPC 8003, a frame 8009, a printed circuit board 8010, and a battery 8011 are provided between a top cover 8001 and a bottom cover 8002.

The display device of one embodiment of the present invention can be used for the touch panel 8004, for example.

The shapes and sizes of the top cover 8001 and the bottom cover 8002 can be changed as appropriate in accordance with the size of the touch panel 8004.

The display device of one embodiment of the present invention can function as a touch panel. The touch panel 8004 can be a resistive touch panel or a capacitive touch panel and can be formed to overlap with the display device of one embodiment of the present invention. A counter substrate (sealing substrate) of the touch panel 8004 can have a touch panel function. A photo sensor may be provided in each pixel of the touch panel 8004 so that an optical touch panel can be obtained.

When a transmissive liquid crystal element is used, a backlight 8007 may be provided as illustrated in FIG. 44. The backlight 8007 includes a light source 8008. Although the light sources 8008 are provided over the backlight 8007 in FIG. 44, one embodiment of the present invention is not limited to this structure. For example, a structure in which the light source 8008 is provided at an end portion of the backlight 8007 and a light diffusion plate is further provided may be employed. In the case where a self-luminous light-emitting element such as an organic EL element is used or the case where a reflective panel or the like is used, the backlight 8007 is not necessarily provided.

The frame 8009 protects the touch panel 8004 and functions as an electromagnetic shield for blocking electromagnetic waves generated by the operation of the printed circuit board 8010. The frame 8009 can also function as a radiator plate.

The printed circuit board 8010 has a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The touch panel 8004 can be additionally provided with a component such as a polarizer, a retardation film, or a prism sheet.

FIGS. 45A to 45H and FIGS. 46A and 46B illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (sensor having a function of measuring force, disarrangement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, smell, or infrared ray), a microphone 5008, and the like.

Figure 45A:
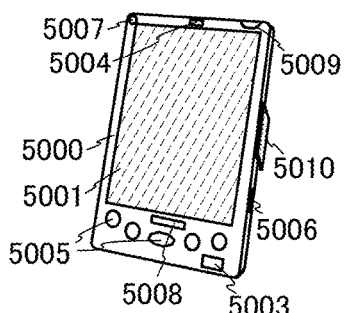
FIGS. 45A to 45H each illustrate an example of an electronic device.
Figure 45B:
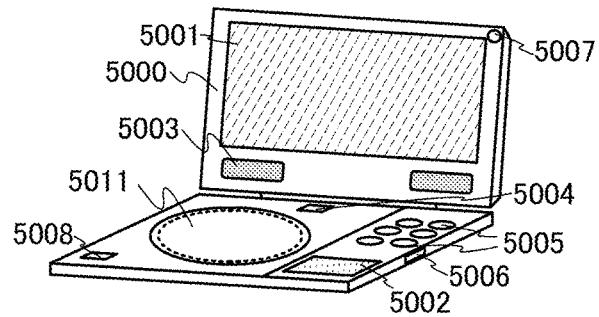
Figure 45C:
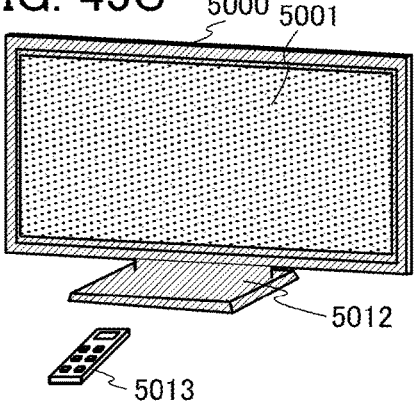
Figure 45D:
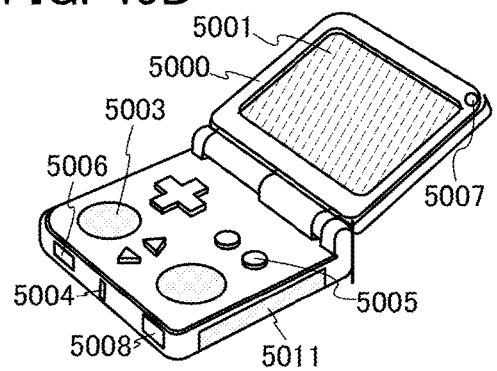
Figure 45E:
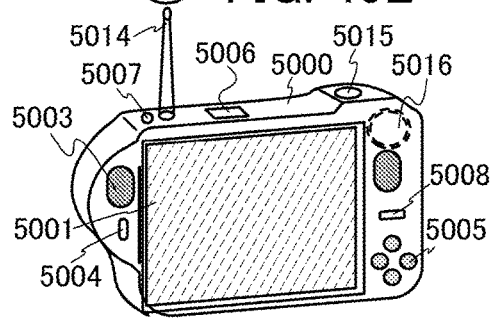
Figure 45F:
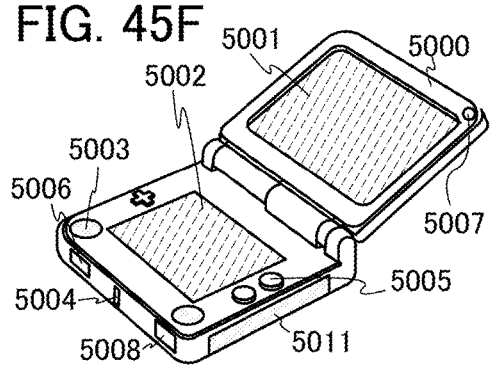
Figure 45G:
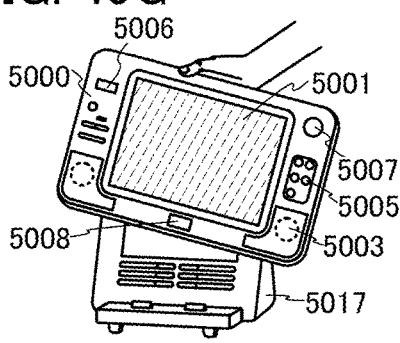
Figure 45H:
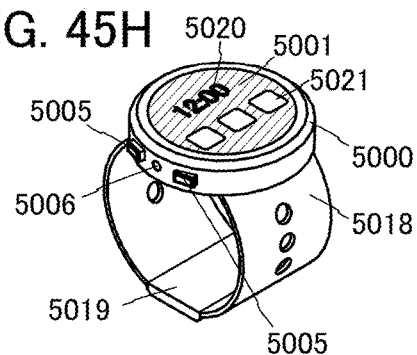
Figure 46A:
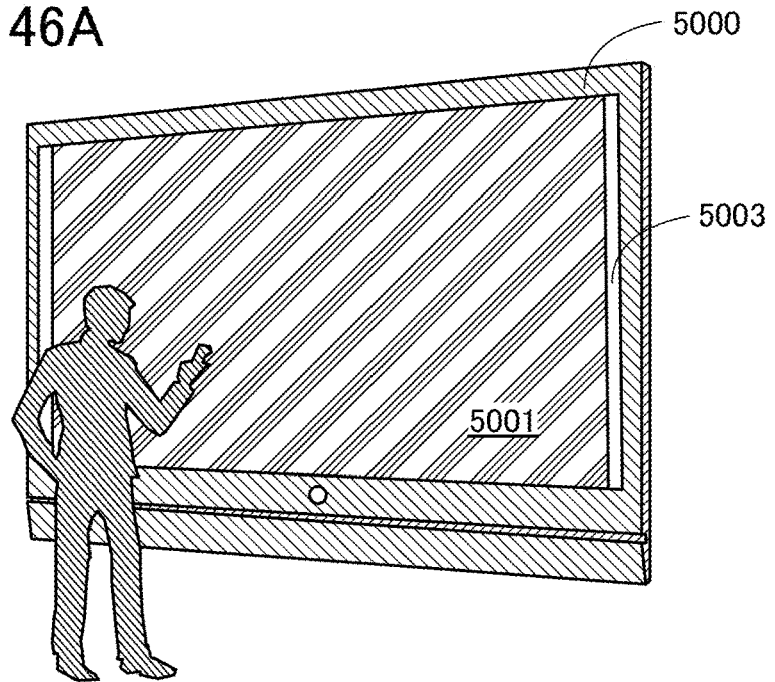
FIGS. 46A and 46B each illustrate an example of an electronic device.
Figure 46B:
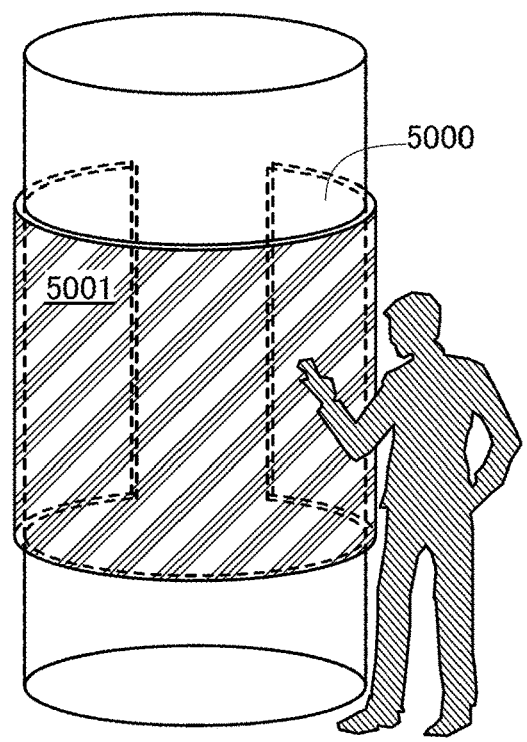

FIG. 45A illustrates a mobile computer, which includes a switch 5009, an infrared port 5010, and the like in addition to the above components. FIG. 45B illustrates a portable image reproducing device provided with a memory medium (e.g., a DVD reproducing device), which can include a second display portion 5002, a memory medium reading portion 5011, and the like in addition to the above objects. FIG. 45C illustrates a television device, which can include a stand 5012 and the like in addition to the above components. The television device can be operated by an operation switch of the housing 5000 or a separate remote control 5013. With operation keys of the remote control 5013, channels and volume can be controlled, and images displayed on the display portion 5001 can be controlled. The remote control 5013 may be provided with a display portion for displaying data output from the remote control 5013. FIG. 45D illustrates a portable game machine which can include the memory medium reading portion 5011 and the like in addition to the above components. FIG. 45E shows a digital camera having a television reception function, which can include an antenna 5014, a shutter button 5015, an image receiving portion 5016, and the like in addition to the above components. FIG. 45F shows a portable game machine which can include the second display portion 5002, the memory medium reading portion 5011, and the like in addition to the above objects. FIG. 45G illustrates a portable television receiver which can include a charger 5017 capable of transmitting and receiving signals, and the like in addition to the above components. FIG. 45H illustrates a wristwatch-type information terminal, which can include a band 5018, a clasp 5019, and the like in addition to the above components. The display portion 5001 mounted in the housing 5000 also serving as a bezel includes a non-rectangular display region. The display portion 5001 can display an icon 5020 indicating time, another icon 5021, and the like. FIG. 46A illustrates a digital signage. FIG. 46B illustrates a digital signage mounted on a cylindrical pillar.

The electronic devices shown in FIGS. 45A to 45H and FIGS. 46A and 46B can have a variety of functions. For example, the electronic devices illustrated in FIGS. 45A to 45H and FIGS. 46A and 46B can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of connecting to a variety of computer networks with a wireless communication function, a function of transmitting and receiving a variety of data with a wireless communication function, a function of reading a program or data stored in a storage medium and displaying the program or data on the display portion, and the like. Furthermore, the electronic device including a plurality of display portions can have a function of displaying image information mainly on one display portion while displaying text information on another display portion, a function of displaying a three-dimensional image by displaying images where parallax is considered on a plurality of display portions, or the like. Furthermore, the electronic device including an image receiver can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that the functions of the electronic devices illustrated in FIGS. 45A to 45H and FIGS. 46A and 46B are not limited thereto, and the electronic devices can have a variety of functions.

The electronic devices in this embodiment each include a display portion for displaying some kind of information. The display device of one embodiment of the present invention can be used for the display portion.

The display portion including the display device of one embodiment of the present invention can perform display with high visibility irrespective of surrounding brightness or the amount of external light entering the display portion.

The electronic device of one embodiment of the present invention preferably includes a sensor (e.g., an illuminance sensor) that senses the brightness of an environment in which the electronic device is used. For example, a photodiode or an image sensor is preferably included. In the electronic device, it is preferable that the switching of on/off of the backlight included in the display device and the adjustment of the intensity of light to be emitted from the backlight be automatically performed in accordance with the brightness sensed by the sensor. Thus, the power consumption of the electronic device can be lowered while the high visibility of the display is maintained.

It is preferable that a user of the electronic device of one embodiment of the present invention can manually perform the switching of on/off of the backlight and the adjustment of the intensity of light to be emitted from the backlight.

This embodiment can be combined with any of other embodiments as appropriate.

This application is based on Japanese Patent Application serial no. 2015-247448 filed with Japan Patent Office on Dec. 18, 2015, the entire contents of which are hereby incorporated by reference.

What is claimed is:

1. A display device including a transmissive region and a reflective region, comprising:
    a liquid crystal element;
    a transistor;
    a scan line;
    a signal line;
    a layer that reflects visible light;
    a first insulating layer; and
    a coloring layer,
    wherein:
    the liquid crystal element includes a pixel electrode, a common electrode, and a liquid crystal layer,
    the transistor includes a semiconductor layer, a gate, and a gate insulating layer,
    the first insulating layer is provided between the pixel electrode and the transistor,
    the first insulating layer includes an opening portion,
    the pixel electrode is provided between the liquid crystal layer and the first insulating layer,
    the common electrode is configured to transmit visible light,
    the semiconductor layer includes a first region and a second region,
    the first region overlaps the gate with the gate insulating layer therebetween,
    the second region includes a first portion in contact with the pixel electrode and a second portion in contact with a side surface of the opening portion in the first insulating layer,
    the second region has resistivity lower than resistivity of the first region, the first portion is provided in at least one of the transmissive region and the reflective region,
the reflective region includes the layer that reflects visible light,
the layer that reflects visible light includes a portion between the liquid crystal layer and at least one of the scan line and the signal line,
the coloring layer overlaps the pixel electrode with the liquid crystal layer therebetween, and
a thickness of the coloring layer in the reflective region is greater than or equal to 40% and less than or equal to 60% of a thickness of the coloring layer in the transmissive region.

2. The display device according to claim 1, further comprising a light-blocking layer,
wherein the light-blocking layer is provided at a boundary between the transmissive region and the reflective region.

3. The display device according to claim 1,
wherein a surface of the pixel electrode on the liquid crystal layer side and a surface of the first insulating layer on the liquid crystal layer side form a same surface.

4. The display device according to claim 1,
wherein the common electrode is provided between the transistor and the liquid crystal layer.

5. The display device according to claim 4, further comprising a second insulating layer,
wherein:
the second insulating layer is provided between the pixel electrode and the common electrode, and
a surface of the common electrode on the liquid crystal layer side and a surface of the second insulating layer on the liquid crystal layer side form a same surface.

6. The display device according to claim 1,
wherein:
a direction in which the scan line extends intersects with a direction in which the signal line extends, and
a direction in which a plurality of pixels exhibiting a same color are arranged intersects with a direction in which the signal line extends.

7. A module comprising:
the display device according to claim 1; and
at least one of a flexible printed circuit board and an integrated circuit.

8. An electronic device comprising:
the module according to claim 7; and
at least one of an antenna, a battery, a housing, a camera, a speaker, a microphone, and an operation button.

9. The display device according to claim 1,
wherein:
the semiconductor layer includes an oxide semiconductor layer,
the pixel electrode is configured to transmit visible light, and
the first portion is provided in the transmissive region.

10. The display device according to claim 9,
wherein the pixel electrode and the oxide semiconductor layer include indium, zinc, and at least one of aluminum, gallium, yttrium, and tin.

11. The display device according to claim 9,
wherein the common electrode includes indium, zinc, and at least one of aluminum, gallium, yttrium, and tin.

12. The display device according to claim 9,
wherein the pixel electrode and the oxide semiconductor layer include a crystal part.

13. The display device according to claim 12,
wherein the crystal part included in the pixel electrode and the oxide semiconductor layer has c-axis alignment.

14. The display device according to claim 9,
wherein the common electrode includes a crystal part.

15. The display device according to claim 14,
wherein the crystal part included in the common electrode has c-axis alignment.

16. The display device according to claim 9,
wherein:
the transistor includes a back gate,
the back gate includes a portion overlapping the gate with the oxide semiconductor layer therebetween,
the gate and the back gate are electrically connected to each other, and
the gate includes indium, zinc, and at least one of aluminum, gallium, yttrium, and tin.

17. The display device according to claim 9,
wherein the layer that reflects visible light includes a fourth portion overlapping with the first region.

18. The display device according to claim 1,
wherein:
the semiconductor layer is a silicon semiconductor layer, and
the first portion of the silicon semiconductor layer is provided in the reflective region.

19. A display device including a transmissive region and a reflective region, comprising:
a liquid crystal element;
a transistor;
a scan line;
a signal line;
a layer that reflects visible light; and
a first insulating layer,
wherein:
the liquid crystal element includes a pixel electrode, a common electrode, and a liquid crystal layer,
the transistor includes a semiconductor layer, a gate, and a gate insulating layer,
the first insulating layer is provided between the pixel electrode and the transistor,
the first insulating layer includes an opening portion,
the pixel electrode is provided between the liquid crystal layer and the first insulating layer,
the common electrode is configured to transmit visible light,
the semiconductor layer includes a first region and a second region,
the first region overlaps the gate with the gate insulating layer therebetween,
the second region includes a first portion in contact with the pixel electrode and a second portion in contact with a side surface of the opening portion in the first insulating layer,
the second region has resistivity lower than resistivity of the first region,
the first portion is provided in at least one of the transmissive region and the reflective region,
the reflective region includes the layer that reflects visible light,
the layer that reflects visible light includes a portion between the liquid crystal layer and at least one of the scan line and the signal line, and
a thickness of the liquid crystal layer in the reflective region is greater than or equal to 40% and less than or equal to 60% of a thickness of the liquid crystal layer in the transmissive region.

20. The display device according to claim 19, further comprising a light-blocking layer,
wherein the light-blocking layer is provided at a boundary between the transmissive region and the reflective region.

21. The display device according to claim 19,
wherein a surface of the pixel electrode on the liquid crystal layer side and a surface of the first insulating layer on the liquid crystal layer side form a same surface.

22. The display device according to claim 19,
wherein the common electrode is provided between the transistor and the liquid crystal layer.

23. The display device according to claim 22, further comprising a second insulating layer,
wherein:
the second insulating layer is provided between the pixel electrode and the common electrode, and
a surface of the common electrode on the liquid crystal layer side and a surface of the second insulating layer on the liquid crystal layer side form a same surface.

24. The display device according to claim 19,
wherein:
a direction in which the scan line extends intersects with a direction in which the signal line extends, and
a direction in which a plurality of pixels exhibiting a same color are arranged intersects with a direction in which the signal line extends.

25. A module comprising:
the display device according to claim 19; and
at least one of a flexible printed circuit board and an integrated circuit.

26. An electronic device comprising:
the module according to claim 25; and
at least one of an antenna, a battery, a housing, a camera, a speaker, a microphone, and an operation button.

27. The display device according to claim 19,
wherein:
the semiconductor layer includes an oxide semiconductor layer,
the pixel electrode is configured to transmit visible light, and
the first portion is provided in the transmissive region.

28. The display device according to claim 27,
wherein the pixel electrode and the oxide semiconductor layer include indium, zinc, and at least one of aluminum, gallium, yttrium, and tin.

29. The display device according to claim 27,
wherein the common electrode includes indium, zinc, and at least one of aluminum, gallium, yttrium, and tin.

30. The display device according to claim 27,
wherein the pixel electrode and the oxide semiconductor layer include a crystal part.

31. The display device according to claim 30,
wherein the crystal part included in the pixel electrode and the oxide semiconductor layer has c-axis alignment.

32. The display device according to claim 27,
wherein the common electrode includes a crystal part.

33. The display device according to claim 32,
wherein the crystal part included in the common electrode has c-axis alignment.

34. The display device according to claim 27,
wherein:
the transistor includes a back gate,
the back gate includes a portion overlapping the gate with the oxide semiconductor layer therebetween,
the gate and the back gate are electrically connected to each other, and
the gate includes indium, zinc, and at least one of aluminum, gallium, yttrium, and tin.

35. The display device according to claim 27,
wherein the layer that reflects visible light includes a fourth portion overlapping with the first region.

36. The display device according to claim 19,
wherein:
the semiconductor layer is a silicon semiconductor layer, and
the first portion of the silicon semiconductor layer is provided in the reflective region.

* * * * *